US012426378B2

(12) United States Patent
Onuki et al.

(10) Patent No.: US 12,426,378 B2
(45) Date of Patent: Sep. 23, 2025

(54) SEMICONDUCTOR DEVICE AND ELECTRONIC DEVICE HAVING STACKED ELEMENT LAYERS ON DRIVER-CIRCUIT SUBSTRATE

(71) Applicant: Semiconductor Energy Laboratory Co., Ltd., Atsugi (JP)

(72) Inventors: Tatsuya Onuki, Atsugi (JP); Yuto Yakubo, Atsugi (JP); Yuki Okamoto, Isehara (JP); Seiya Saito, Atsugi (JP); Kiyoshi Kato, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 638 days.

(21) Appl. No.: 17/422,312

(22) PCT Filed: Nov. 19, 2019

(86) PCT No.: PCT/IB2019/059906
§ 371 (c)(1),
(2) Date: Jul. 12, 2021

(87) PCT Pub. No.: WO2020/152522
PCT Pub. Date: Jul. 30, 2020

(65) Prior Publication Data
US 2022/0085073 A1 Mar. 17, 2022

(30) Foreign Application Priority Data

Jan. 25, 2019 (JP) .................... 2019-011688
Jan. 25, 2019 (JP) .................... 2019-011690
(Continued)

(51) Int. Cl.
*H10D 87/00* (2025.01)
*G11C 11/4091* (2006.01)
(Continued)

(52) U.S. Cl.
CPC ......... *H10D 87/00* (2025.01); *G11C 11/4091* (2013.01); *G11C 11/4096* (2013.01); *H10D 86/80* (2025.01)

(58) Field of Classification Search
CPC . H01L 27/1207; H01L 27/13; G11C 11/4091; G11C 11/4096; H10D 87/00; H10D 86/80
See application file for complete search history.

(56) References Cited

U.S. PATENT DOCUMENTS 5,561,623 A 10/1996 Ema
6,569,717 B1 5/2003 Murade
(Continued)

FOREIGN PATENT DOCUMENTS

EP 1387360 A 2/2004
JP 2000-312005 A 11/2000
(Continued)

OTHER PUBLICATIONS

International Search Report (Application No. PCT/IB2019/059906) Dated Feb. 10, 2020.
(Continued)

*Primary Examiner* — Lex H Malsawma
(74) *Attorney, Agent, or Firm* — Eric J. Robinson, Robinson Intellectual Property Law Office, P.C.

(57) ABSTRACT

A semiconductor device having a novel structure is provided. The semiconductor device includes a first element layer including a first memory cell, a second element layer including a second memory cell, and a silicon substrate including a driver circuit. The first element layer is provided between the silicon substrate and the second element layer. The first memory cell includes a first transistor and a first capacitor. The second memory cell includes a second transistor and a second capacitor. One of a source and a drain of the first transistor and one of a source and a drain of the (Continued)

second transistor are each electrically connected to a wiring for electrical connection to the driver circuit. The wiring is in contact with a first semiconductor layer included in the first transistor and a second semiconductor layer included in the second transistor and is provided in a direction perpendicular or substantially perpendicular to a surface of the silicon substrate.

13 Claims, 46 Drawing Sheets

(30) Foreign Application Priority Data

| Jan. 25, 2019 | (JP) | 2019-011691 |
|---|---|---|
| Jan. 25, 2019 | (JP) | 2019-011692 |
| Jan. 29, 2019 | (JP) | 2019-013505 |

(51) Int. Cl.
*G11C 11/4096* (2006.01)
*H10D 86/80* (2025.01)

(56) References Cited

U.S. PATENT DOCUMENTS

| 6,643,159 | B2 | 11/2003 | Fricke et al. |
|---|---|---|---|
| 6,687,147 | B2 | 2/2004 | Fricke et al. |
| 6,781,858 | B2 | 8/2004 | Fricke et al. |
| 8,508,967 | B2 | 8/2013 | Yamazaki et al. |
| 8,513,773 | B2 | 8/2013 | Takemura |
| 8,797,785 | B2 | 8/2014 | Saito |
| 8,837,202 | B2 | 9/2014 | Takemura |
| 8,934,299 | B2 | 1/2015 | Ikeda |
| 9,007,812 | B2 | 4/2015 | Koyama et al. |
| 9,384,816 | B2 | 7/2016 | Takemura |
| 9,460,772 | B2 | 10/2016 | Saito |
| 9,514,792 | B2 | 12/2016 | Kajigaya |
| 9,653,611 | B2 | 5/2017 | Atsumi et al. |
| 9,728,243 | B2 | 8/2017 | Kato |
| 9,825,042 | B2 | 11/2017 | Takemura |
| 9,859,439 | B2 | 1/2018 | Miyairi |
| 9,922,692 | B2 | 3/2018 | Koyama |
| 9,985,636 | B2 | 5/2018 | Ikeda |
| 10,217,752 | B2 | 2/2019 | Atsumi et al. |
| 10,304,523 | B2 | 5/2019 | Kato et al. |
| 10,593,683 | B2 | 3/2020 | Atsumi et al. |
| 11,114,449 | B2 | 9/2021 | Atsumi et al. |
| 11,751,409 | B2 | 9/2023 | Atsumi et al. |
| 2012/0063208 | A1 | 3/2012 | Koyama et al. |
| 2012/0120715 | A1 | 5/2012 | Saito |
| 2013/0070506 | A1* | 3/2013 | Kajigaya .............. H10B 63/845 365/51 |
| 2014/0334218 | A1 | 11/2014 | Saito |
| 2015/0076495 | A1 | 3/2015 | Miyairi |
| 2015/0255139 | A1 | 9/2015 | Atsumi et al. |
| 2015/0262642 | A1 | 9/2015 | Koyama |
| 2015/0294710 | A1 | 10/2015 | Onuki |
| 2015/0325282 | A1 | 11/2015 | Kato et al. |
| 2016/0172021 | A1 | 6/2016 | Ishizu |
| 2016/0293232 | A1 | 10/2016 | Ishizu et al. |
| 2016/0336055 | A1* | 11/2016 | Kato .................. H10B 12/315 |
| 2016/0336059 | A1 | 11/2016 | Matsuzaki |

FOREIGN PATENT DOCUMENTS

| JP | 2000-312006 A | 11/2000 |
|---|---|---|
| JP | 2004-056140 A | 2/2004 |
| JP | 2012-119048 A | 6/2012 |
| JP | 2012-178553 A | 9/2012 |
| JP | 2012-256402 A | 12/2012 |
| JP | 2013-065638 A | 4/2013 |
| JP | 2015-181159 A | 10/2015 |
| JP | 2015-201251 A | 11/2015 |
| JP | 2016-192578 A | 11/2016 |
| JP | 2018-029198 A | 2/2018 |
| JP | 2019-135773 A | 8/2019 |
| KR | 2012-0051593 A | 5/2012 |
| KR | 2018-0119149 A | 11/2018 |
| KR | 2019-0095221 A | 8/2019 |
| TW | 201810538 | 3/2018 |

OTHER PUBLICATIONS

Written Opinion (Application No. PCT/IB2019/059906) Dated Feb. 10, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Kunitake.H et al., "High thermal tolerance of 25-nm c-axis aligned crystalline In—Ga—Zn oxide Fet", IEDM 18: Technical Digest of International Electron Devices Meeting, Dec. 1, 2018, pp. 312-315.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Taiwanese Office Action (Application No. 108141513) Dated Dec. 5, 2023.

* cited by examiner

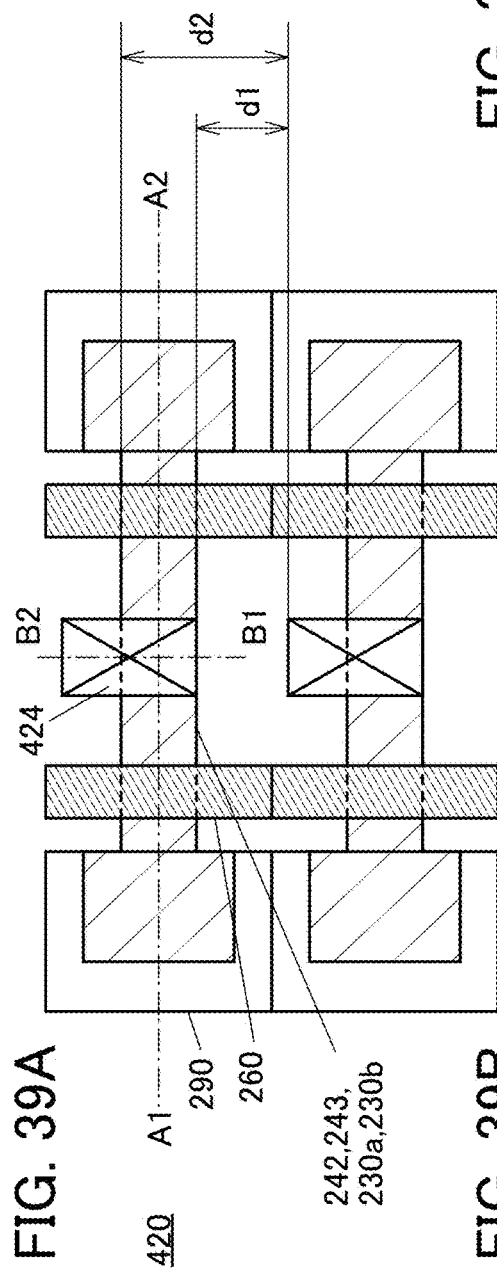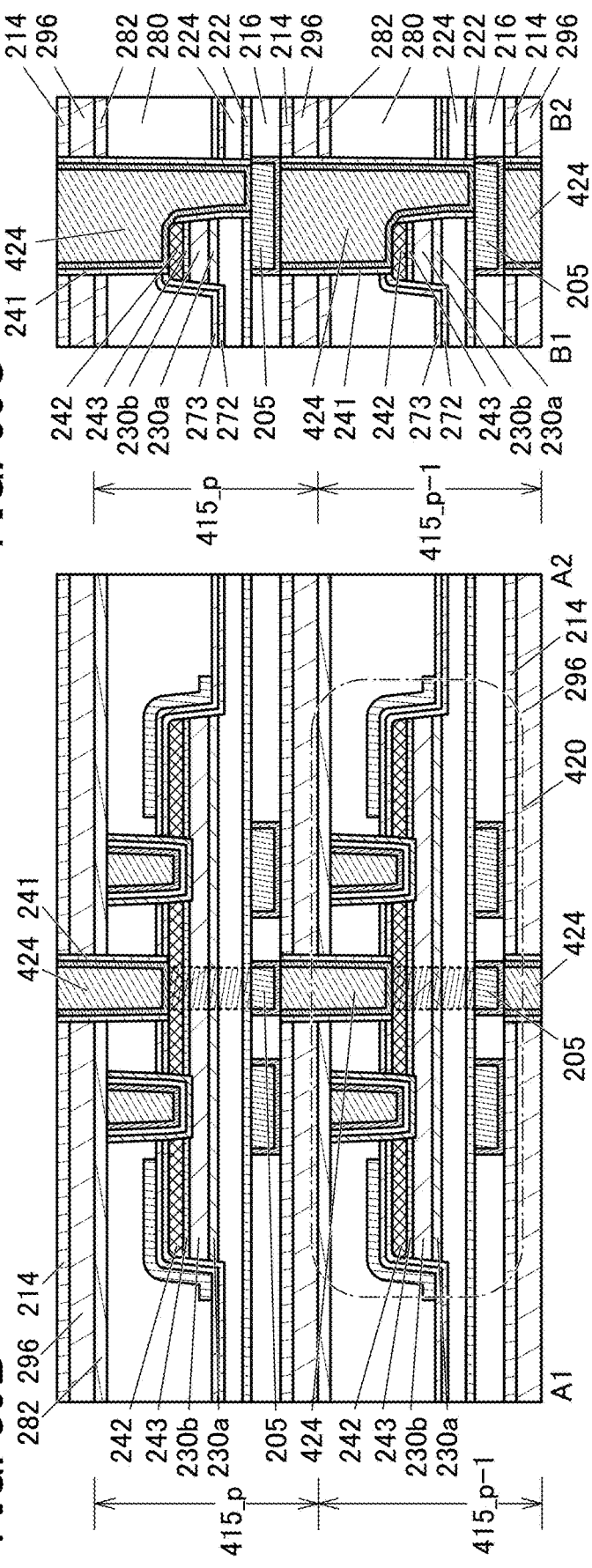
FIG. 39A
FIG. 39B
FIG. 39C

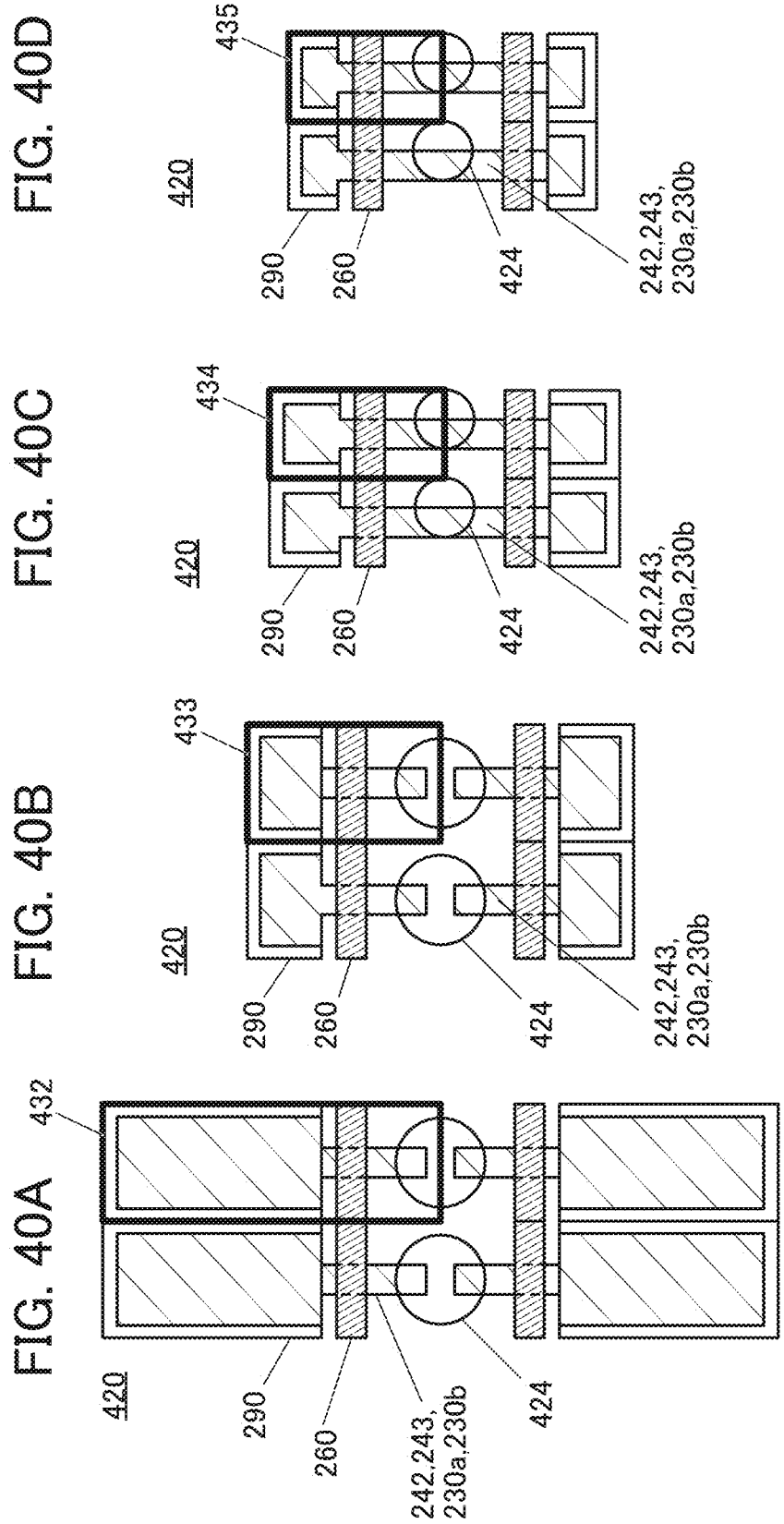

FIG. 41A
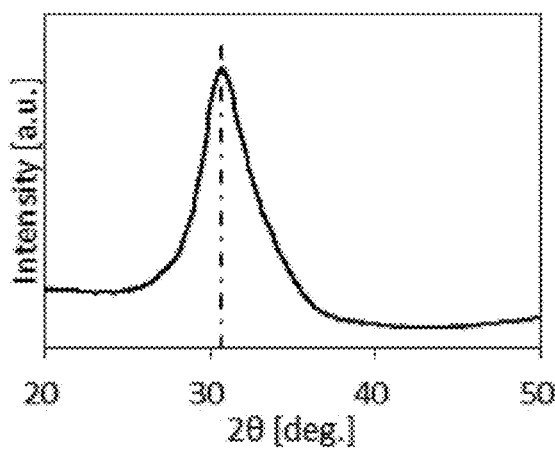
FIG. 41B
FIG. 41C
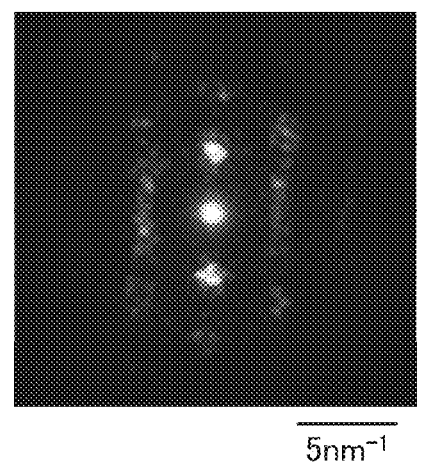

SEMICONDUCTOR DEVICE AND ELECTRONIC DEVICE HAVING STACKED ELEMENT LAYERS ON DRIVER-CIRCUIT SUBSTRATE

TECHNICAL FIELD

In this specification, a semiconductor device and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate on which Si transistors are provided.

REFERENCES

Patent Document

[Patent Document 1] United States Patent Application Publication No. 2012/0063208

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).
[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).
[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

An object of one embodiment of the present invention is to provide a semiconductor device or the like having a novel structure. Another object of one embodiment of the present invention is to provide a semiconductor device or the like functioning as a memory device that utilizes an extremely low off-state current and having a novel structure that allows a reduction of manufacturing costs. Another object of one embodiment of the present invention is to provide a semiconductor device or the like functioning as a memory device that utilizes an extremely low off-state current and having a novel structure that excels in low power consumption. Another object of one embodiment of the present invention is to provide a semiconductor device or the like functioning as a memory device that utilizes an extremely low off-state current and having a novel structure that allows a reduction in the size of the device. Another object of one embodiment of the present invention is to provide a semiconductor device or the like functioning as a memory device that utilizes an extremely low off-state current and having a novel structure that allows excellent reliability with a small variation in electrical characteristics of transistors.

The description of a plurality of objects does not disturb the existence of each object. One embodiment of the present invention does not necessarily achieve all the objects described as examples. Furthermore, objects other than those listed are apparent from the description of this specification, and such objects can be objects of one embodiment of the present invention.

Means for Solving the Problems

One embodiment of the present invention is a semiconductor device which includes a first element layer including a first memory cell, a second element layer including a second memory cell, a third element layer including a switching circuit, and a silicon substrate including a driver circuit. The first element layer is provided between the silicon substrate and the second element layer. The third element layer is provided between the silicon substrate and the first element layer. The first memory cell includes a first transistor and a first capacitor. The second memory cell includes a second transistor and a second capacitor. The switching circuit includes a third transistor having a function of controlling the conduction state between the first memory cell or the second memory cell and the driver circuit. One of a source and a drain of the first transistor and one of a source and a drain of the second transistor are each electrically connected to a wiring for electrical connection to one of a source and a drain of the third transistor. The other of the source and the drain of the third transistor is electrically connected to the driver circuit. The wiring is in contact with a first semiconductor layer included in the first transistor and a second semiconductor layer included in the second transistor and is provided in a direction perpendicular or substantially perpendicular to a surface of the silicon substrate.

In the semiconductor device of one embodiment of the present invention, the first semiconductor layer and the second semiconductor layer each preferably include a metal oxide in a channel formation region.

In the semiconductor device of one embodiment of the present invention, the first capacitor is preferably provided in a layer below the first semiconductor layer, and the second capacitor is preferably provided in a layer below the second semiconductor layer.

In the semiconductor device of one embodiment of the present invention, the first capacitor is preferably provided in a layer above the first semiconductor layer, and the second capacitor is preferably provided in a layer above the second semiconductor layer.

In the semiconductor device of one embodiment of the present invention, one electrode of the first capacitor is preferably provided in the same layer as the first semiconductor layer, and one electrode of the second capacitor is preferably provided in the same layer as the second semiconductor layer.

One embodiment of the present invention is a semiconductor device which includes a first element layer including a first memory cell, a second element layer including a second memory cell a third element layer including a first control circuit, and a silicon substrate including a driver circuit. The first element layer is provided between the silicon substrate and the second element layer. The third element layer is provided between the silicon substrate and the first element layer. The first memory cell includes a first transistor and a first capacitor. The second memory cell includes a second transistor and a second capacitor. The first control circuit includes a third transistor for amplifying a signal read from the first memory cell. One of a source and a drain of the first transistor and one of a source and a drain of the second transistor are each electrically connected to a first wiring for electrical connection to a gate of the third transistor. One of a source and a drain of the third transistor is electrically connected to a second wiring for electrical connection to the driver circuit. The first wiring is in contact with a first semiconductor layer included in the first transistor and a second semiconductor layer included in the second transistor and is provided in a direction perpendicular or substantially perpendicular to a surface of the silicon substrate. The second wiring is provided in a direction parallel or substantially parallel to the first wiring.

In the semiconductor device of one embodiment of the present invention, the first control circuit preferably includes a fourth transistor, one of a source and a drain of the fourth transistor is preferably electrically connected to the one of the source and the drain of the third transistor, and the other of the source and the drain of the fourth transistor is preferably electrically connected to the second wiring.

In the semiconductor device of one embodiment of the present invention, the first control circuit preferably includes a fifth transistor and a sixth transistor, one of a source and a drain of the fifth transistor is preferably electrically connected to the gate of the third transistor, the other of the source and the drain of the fifth transistor is preferably electrically connected to the second wiring, one of a source and a drain of the sixth transistor is preferably electrically connected to the other of the source and the drain of the third transistor, and the other of the source and the drain of the sixth transistor is preferably electrically connected to a ground line.

In the semiconductor device of one embodiment of the present invention, the first semiconductor layer and the second semiconductor layer each preferably include a metal oxide in a channel formation region.

In the semiconductor device of one embodiment of the present invention, the metal oxide preferably includes In, Ga, and Zn.

In the semiconductor device of one embodiment of the present invention, the first capacitor is preferably provided in a layer below the first semiconductor layer, and the second capacitor is preferably provided in a layer below the second semiconductor layer.

In the semiconductor device of one embodiment of the present invention, the first capacitor is preferably provided in a layer above the first semiconductor layer, and the second capacitor is preferably provided in a layer above the second semiconductor layer.

In the semiconductor device of one embodiment of the present invention, one electrode of the first capacitor is preferably provided in the same layer as the first semiconductor layer, and one electrode of the second capacitor is preferably provided in the same layer as the second semiconductor layer.

One embodiment of the present invention is a semiconductor device which includes a first element layer including a first memory cell, and a second element layer including a second memory cell. The first element layer and the second element layer are provided so as to be stacked. The first memory cell includes a first transistor and a first capacitor. The second memory cell includes a second transistor, a third transistor, and a second capacitor. One of a source and a drain of the first transistor is electrically connected to one electrode of the first capacitor. One of a source and a drain of the second transistor is electrically connected to a gate of the third transistor and one electrode of the second capacitor.

The semiconductor device of one embodiment of the present invention preferably includes a substrate, and the second element layer is preferably provided between the substrate and the first element layer.

In the semiconductor device of one embodiment of the present invention, the first transistor preferably includes a first semiconductor layer, the second transistor preferably includes a second semiconductor layer, and the first semiconductor layer and the second semiconductor layer each preferably include a metal oxide in a channel formation region.

In the semiconductor device of one embodiment of the present invention, the metal oxide preferably includes In, Ga, and Zn.

Note that other embodiments of the present invention are shown in the description of the following embodiments and the drawings.

Effect of the Invention

With one embodiment of the present invention, a semiconductor device or the like having a novel structure can be provided. With another embodiment of the present invention, a semiconductor device or the like functioning as a memory device that utilizes an extremely low off-state current and having a novel structure that allows a reduction of manufacturing costs can be provided. With another embodiment of the present invention, a semiconductor device or the like functioning as a memory device that utilizes an extremely low off-state current and having a novel structure that excels in low power consumption can be provided. With another embodiment of the present invention, a semiconductor device or the like functioning as a memory device that utilizes an extremely low off-state current and having a novel structure that allows a reduction in the size of the device can be provided. With another embodiment of the present invention, a semiconductor device or the like functioning as a memory device that utilizes an extremely low off-state current and having a novel structure that allows excellent reliability with a small variation in electrical characteristics of transistors can be provided.

The description of a plurality of effects does not disturb the existence of other effects. One embodiment of the present invention does not necessarily have all the effects described as examples. In one embodiment of the present invention, other objects, effects, and novel features are apparent from the description of this specification and the drawings.

BRIEF DESCRIPTION OF THE DRAWINGS

FIG. 39 are (A) a top view, (B) a cross-sectional schematic diagram, and (C) a cross-sectional schematic diagram illustrating a structure example of a semiconductor device.

FIG. 40 are (A) to (D) top views illustrating structure examples of a semiconductor device.

FIG. 41 are (A) a diagram showing classification of crystal structures of IGZO, (B) a diagram showing an XRD spectrum of a CAAC-IGZO film, and (C) a diagram showing a nanobeam electron diffraction pattern of the CAAC-IGZO film.

MODE FOR CARRYING OUT THE INVENTION

Figure 1A:
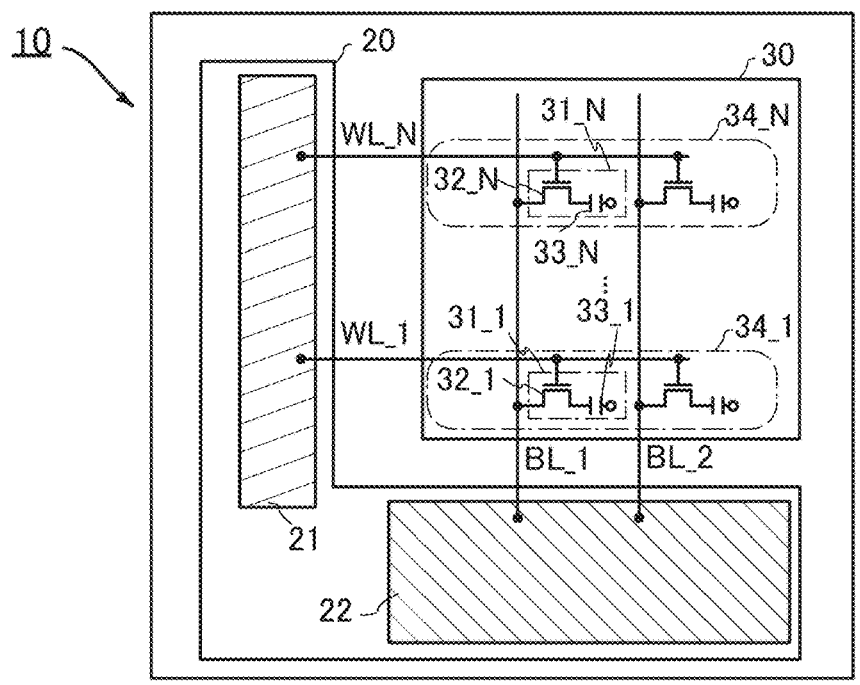
FIG. 1 are (A) a block diagram and (B) a schematic diagram illustrating a structure example of a semiconductor device.

Embodiments of the present invention are described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Furthermore, for example, in this specification and the like, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numeral and, in particular, need to be distinguished from each other, an identification sign such as "_1", "_2", "[n]", or "[m,n]" is sometimes added to the reference numeral. For example, the second wiring GL is referred to as a wiring GL[2].

Embodiment 1

Structure examples of a semiconductor device of one embodiment of the present invention and an operation method of the semiconductor device are described with reference to FIG. 1 to FIG. 5.

A semiconductor device refers to a device that utilizes semiconductor characteristics, and means a circuit including a semiconductor element (a transistor, a diode, a photodiode, and the like), a device including the circuit, and the like. The semiconductor device described in this embodiment can function as a semiconductor device that functions as a memory device utilizing a transistor with an extremely low off-state current.

FIG. 1(A) is a block diagram of the semiconductor device described in this embodiment. A semiconductor device 10 illustrated in FIG. 1(A) includes a peripheral circuit 20 and a memory cell array 30.

The peripheral circuit 20 includes a row driver 21 and a column driver 22. The row driver 21 and the column driver 22 are simply referred to as driver circuits or drivers in some cases.

The row driver 21 is a circuit having a function of outputting signals for driving the memory cell array 30 to word lines WL. Specifically, the row driver 21 has a function of transmitting word signals to the word lines WL (WL_1 to WL_N in FIG. 1(A). N is a natural number greater than or equal to 2). The row driver 21 is sometimes referred to as a word line driver circuit. Note that the row driver 21 includes a decoder circuit for selecting a word line WL in accordance with the designated address, a buffer circuit, and the like. Note that the word lines WL are simply referred to as wirings in some cases.

The column driver 22 is a circuit having a function of outputting signals for driving the memory cell array 30 to bit lines BL. Specifically, the column driver 22 has a function of transmitting data signals to the bit lines BL (BL_1 and BL_2 in FIG. 1(A)). The column driver 22 is sometimes referred to as a bit line driver circuit. Note that the column driver 22 includes a sense amplifier, a precharge circuit, a decoder circuit for selecting a bit line in accordance with the designated address, and the like. Note that the bit lines BL are simply referred to as wirings in some cases. In some drawings, the bit lines BL are denoted by thick lines, thick dotted lines, or the like for enhanced visibility.

The data signal supplied to the bit line BL corresponds to a signal written to a memory cell or a signal read from a memory cell. In the following description, the data signal is a binary signal having a high-level or low-level potential corresponding to data 1 or data 0. Note that the data signal may be a multi-level signal having three or more levels. The high-level potential is VDD, and the low-level potential is VSS or a ground potential (GND). The signal supplied to the bit line BL can be, other than the data signal, a precharge potential for reading data, for example. The precharge potential can be VDD/2.

The memory cell array 30 includes a plurality of, that is for example, N (N is a natural number greater than or equal to 2) element layers 34_1 to 34_N. The element layer 34_1 includes one or more memory cells 31_1. The memory cell 31_1 includes a transistor 32_1 and a capacitor 33_1. The element layer 34_N includes one or more memory cells 31_N. The memory cell 31_N includes a transistor 32_N and a capacitor 33_N. Note that a capacitor is sometimes referred to as a capacitive element. Note that an element layer is a layer provided with elements such as a capacitor and a transistor and is formed using members such as a conductor, a semiconductor, and an insulator.

The transistors 32_1 to 32_N function as switches whose on/off is controlled in accordance with the word signals supplied to the word lines WL_1 to WL_N. One of a source and a drain of each of the transistors 32_1 to 32_N is connected to any one of the bit lines BL (BL_1 in the drawing).

As the transistors 32_1 to 32_N, transistors including an oxide semiconductor in their channel formation regions (hereinafter referred to as OS transistors) are preferably used. In the structure of one embodiment of the present invention, a structure that uses memory cells including OS transistors is employed; therefore, utilizing a feature of an extremely low leakage current (hereinafter, off-state current) between sources and drains in an off state allows electric charge corresponding to a desired voltage to be retained in the capacitors 33_1 to 33_N, which are located at the other of the sources and the drains. In other words, data that is once written to the memory cells 31_1 to 31_N can be retained for a long time. Therefore, the frequency of data refresh can be reduced and power consumption can be reduced.

In addition, in the memory cells 31_1 to 31_N using OS transistors, rewriting and reading of data can be performed by charging or discharging of electric charge; thus, a substantially unlimited number of times of data writing and data reading are possible. Unlike a magnetic memory, a resistive random access memory, or the like, the memory cells 31_1 to 31_N using OS transistors have no change in the structure at the atomic level and thus exhibit high rewrite endurance. In addition, unstableness due to the increase of electron trap centers is not observed in the memory cells 31_1 to 31_N using OS transistors even when rewriting operation is repeated like in a flash memory.

Furthermore, the memory cells 31_1 to 31_N using OS transistors can be freely provided over a silicon substrate or the like having transistors including silicon in their channel formation regions (hereinafter, Si transistors); thus, integration is easily performed. An OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain in accordance with a voltage supplied to the gate electrode or the back gate electrode. Thus, circuit design with the same ideas as those of an LSI is possible. Furthermore, electrical characteristics of the OS transistor are better than those of a Si transistor in a high-temperature environment. Specifically, favorable switching operation can be performed even under high temperatures ranging from 125° C. to 150° C., since its on-state current/off-state current ratio is high.

Note that the memory cells illustrated in FIG. 1(A) can each be referred to as a DOSRAM (Dynamic Oxide Semiconductor Random Access Memory) that uses an OS transistor as a memory. Since a DOSRAM can be formed using one transistor and one capacitor, high-density memories can be achieved. With the use of an OS transistor, a data retention period can be lengthened. The capacitors 33_1 to 33_N have a structure where an insulator is sandwiched between conductors serving as electrodes. As the conductors forming the electrodes, a semiconductor layer or the like to which conductivity is imparted as well as metal can be used. Although the details are described later, the capacitors 33_1 to 33_N can be provided above or below the transistors 32_1 to 32_N in positions overlapping with the transistors 32_1 to 32_N. Furthermore, part of semiconductor layers or electrodes of the transistors 32_1 to 32_N can be used as one of electrodes of the capacitors 33_1 to 33_N.

Out of the components described with reference to FIG. 1(A), the element layers 34_1 to 34_N in one embodiment of the present invention are described with reference to a schematic diagram illustrated in FIG. 1(B). The schematic diagram illustrated in FIG. 1(B) corresponds to a perspective view providing the x-axis, the y-axis, and the z-axis for illustration of the layout of the components described with reference to FIG. 1(A). For easy understanding, the x-axis direction might be referred to as a depth direction, the y-axis direction might be referred to as a horizontal direction, and the z-axis direction might be referred to as a perpendicular direction in this specification.

Figure 1B:
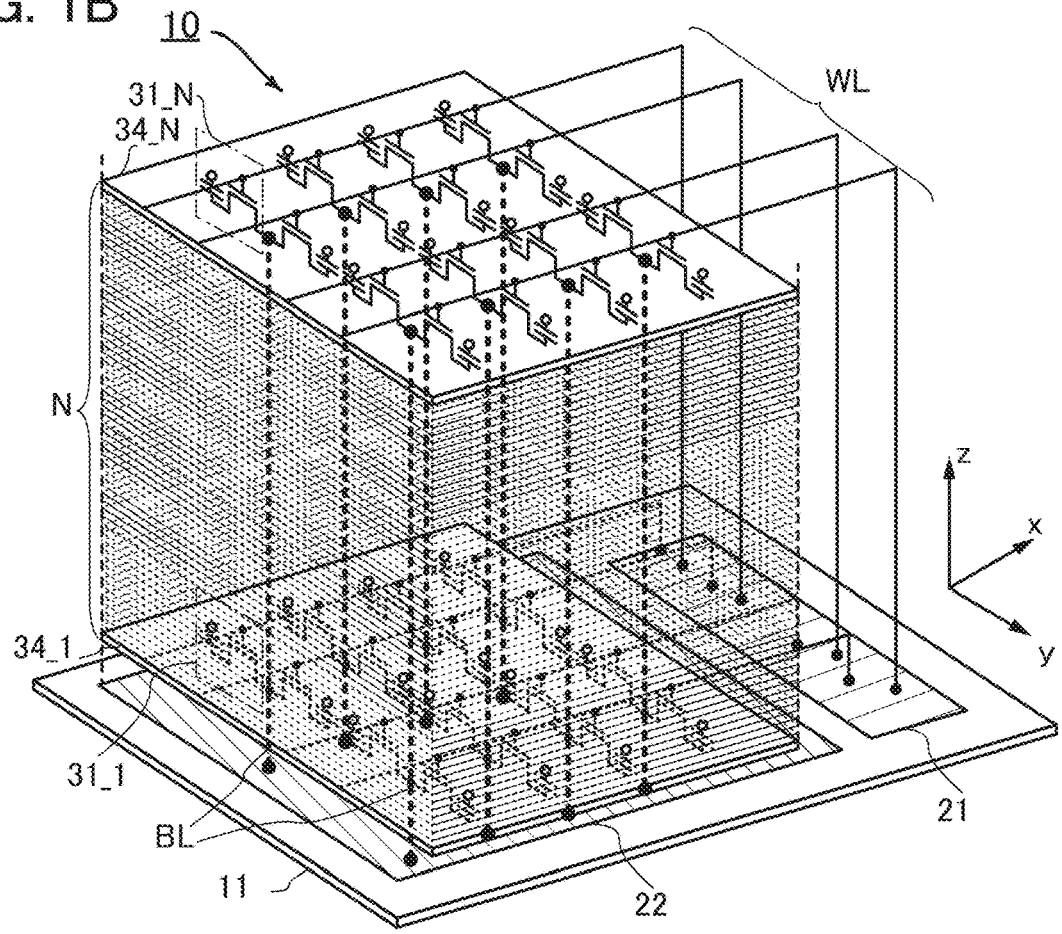

As illustrated in FIG. 1(B), the element layers 34_1 to 34_N are provided in N stacked layers. The element layers 34_1 to 34_N including the memory cells 31_1 to 31_N each include a region overlapping with the column driver 22 provided over a silicon substrate 11. It can also be said that the element layer 34_1 is provided between the silicon substrate 11 and the element layer 34_N as illustrated in FIG. 1(B).

The transistor of the memory cell 31_1 included in the element layer 34_1 and the transistor of the memory cell 31_N included in the element layer 34_N are connected to each other through the bit line BL provided in the perpendicular direction. The bit line BL is connected to the column driver 22 provided over the silicon substrate 11.

The bit line BL_1 is provided in contact with a semiconductor layer of the transistor included in the memory cell 31_1 and a semiconductor layer of the transistor included in the memory cell 31_N. Alternatively, the bit line BL_1 is provided in contact with a region functioning as a source or a drain of the semiconductor layer of the transistor included in the memory cell 31_1 and a region functioning as a source or a drain of the semiconductor layer of the transistor included in the memory cell 31_N. Alternatively, the bit line BL_1 is provided in contact with a conductor provided in contact with the region functioning as the source or the drain of the semiconductor layer of the transistor included in the memory cell 31_1 and a conductor provided in contact with the region functioning as the source or the drain of the semiconductor layer of the transistor included in the memory cell 31_N. In other words, the bit line BL is a wiring for electrically connecting one of the source and the drain of the transistor included in the memory cell 31_1, one of the source and the drain of the transistor included in the memory cell 31_N, and the column driver 22 in the perpendicular direction.

It can be said that the bit line BL is provided to extend in a direction perpendicular or substantially perpendicular to a plane of the silicon substrate 11 where the column driver 22 is provided. That is, as illustrated in FIG. 1(B), the bit line BL is connected to the transistor included in the memory cell 31_1 and the transistor included in the memory cell 31_N and provided in a direction (z direction) perpendicular or substantially perpendicular' to a surface of the silicon substrate (xy plane). Note that "substantially perpendicular" means a state where the subject is provided at an angle greater than or equal to 85 degrees and less than or equal to 95 degrees.

Note that a structure in which the row driver 21 provided over the silicon substrate 11 and the word lines WL provided to extend in the depth direction of the element layer 34_1 to the element layer 34_N are connected to each other through an opening portion in a region where the memory cells 31_1 to 31_N are not provided in the element layer 34_1 to the element layer 34_N, e.g., a circumference portion of the element layer 34_1 to the element layer 34_N is preferably employed. The row driver 21 provided over the silicon substrate 11 and the word lines WL provided for the element layers may be connected to each other through a wiring provided in a layer above the element layer 34_1 to the element layer 34_N.

In one embodiment of the present invention, an OS transistor with an extremely low off-state current is used as the transistor provided in each element layer. Accordingly, the frequency of refresh of data retained in the memory cells can be reduced, so that a semiconductor device with reduced power consumption can be obtained. OS transistors can be provided to be stacked and manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized. Moreover, because an OS transistor has a small variation in electrical characteristics even under a high-temperature environment compared with a Si transistor, the semiconductor device can function as a highly reliable memory device that has a small variation in electrical characteristics of transistors at the time of stacking and integration. Furthermore, in one embodiment of the present invention, the length of the bit lines between the memory cell array and the column driver can be reduced by provision of the bit lines extending from the memory cell array in the perpendicular direction. Thus, parasitic capacitance of the bit lines can be significantly reduced and a potential can be read even when the data signals retained in the memory cells are multi-level signals.

Figure 2:
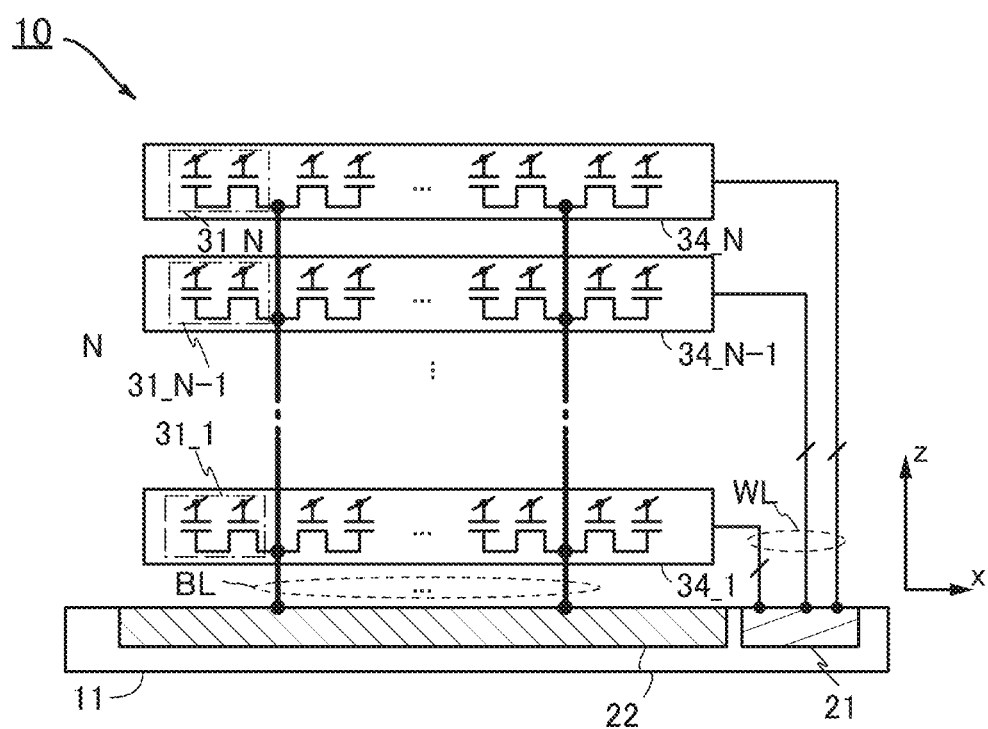
FIG. 2 is a schematic diagram illustrating a structure example of a semiconductor device.

FIG. 2 illustrates a schematic diagram of a cross section that is parallel to the perpendicular direction (z-axis direction) of the semiconductor device 10 described with reference to FIG. 1(A) and FIG. 1(B).

As illustrated in FIG. 2, the semiconductor device 10 can have a structure where the memory cells 31_1 to 31_N provided in the element layers and the column driver 22 provided over the silicon substrate 11 are connected to each other with the shortest distance therebetween through the bit line BL provided in the perpendicular direction. The number of bit lines BL is increased as compared with a structure where the bit lines BL are provided in a plane direction. However, the number of memory cells 31_1 to 31_N connected to a bit line can be reduced and accordingly parasitic capacitance of the bit line BL can be reduced. Therefore, even when the capacitance of the capacitors 33_1 to 33_N included in the memory cells 31_1 to 31_N is reduced, the potential of the bit line BL that accompanies movement of electric charge can be varied.

Since the capacitance of the capacitors 33_1 to 33_N included in the memory cells 31_1 to 31_N can be reduced, the capacitors 33_1 to 33_N can be provided in the same layer as the transistors 32_1 to 32_N. With the structure where the capacitors 33_1 to 33_N are provided in the same layer as the transistors 32_1 to 32_N, thinning of each of the element layers 34_1 to 34_N is possible. Therefore, the semiconductor device 10 can be downsized.

Figure 3A:
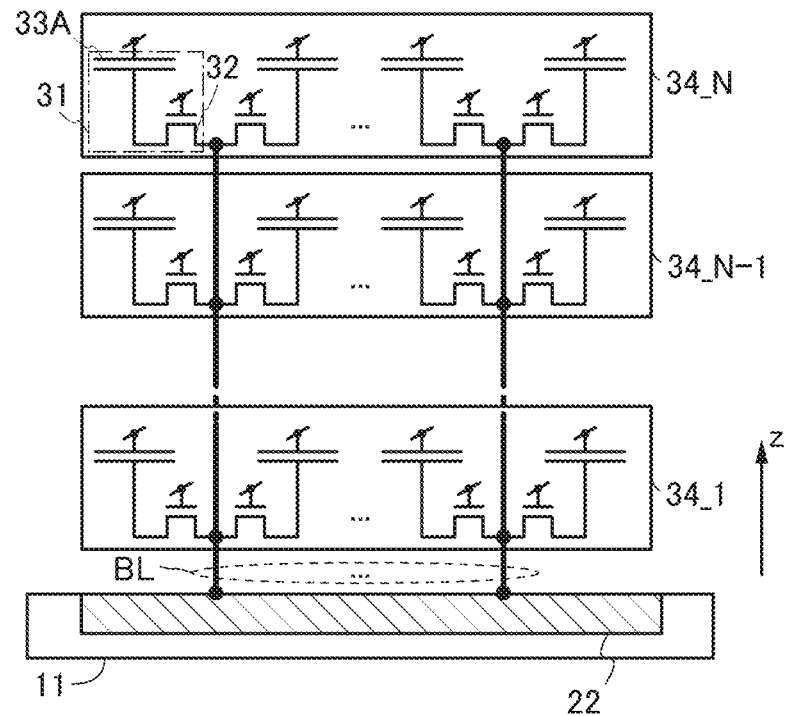
FIG. 3 are (A) a schematic diagram and (B) a schematic diagram illustrating structure examples of a semiconductor device.

Note that other than the structure where the capacitors 33_1 to 33_N included in the memory cells 31_1 to 31_N are provided in the same layer as the transistors 32_1 to 32_N, other structures may also be employed. For example, the schematic diagram illustrated in FIG. 3(A) represents a structure where capacitors 33A of the memory cells 31 included in the element layers 34_1 to 34_N are provided above the transistors 32 in the perpendicular direction. With this structure, capacitance can be increased; accordingly, the reliability of the read data and the data retention time can be improved. In addition, the electrodes of the capacitors 33A whose one electrode is connected to a fixed potential can be provided above the transistors 32 in the structure of FIG. 3(A), which can suppress the influence of noise from the outside.

Figure 3B:
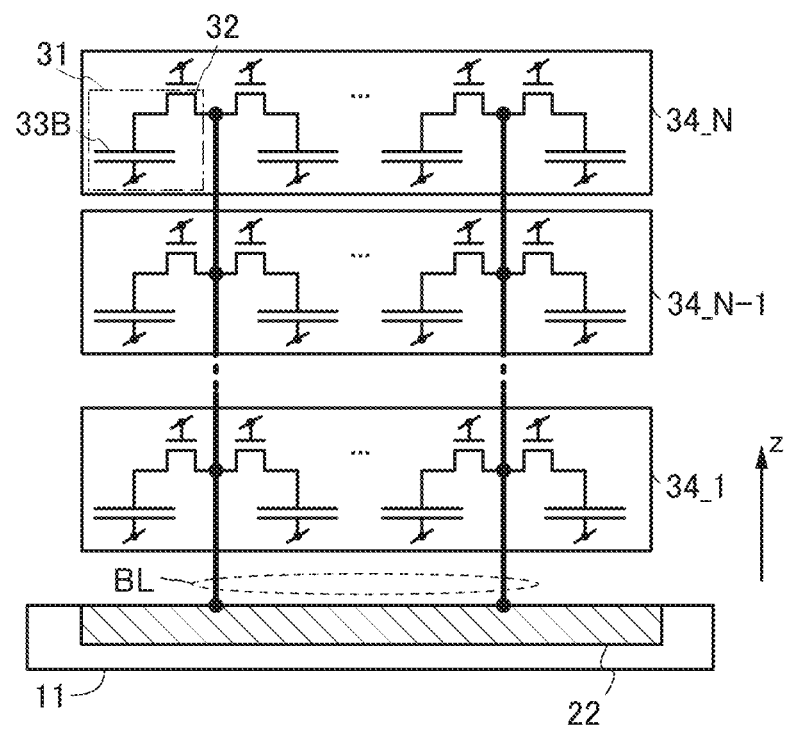

Furthermore, the schematic diagram illustrated in FIG. 3(B) represents a structure where capacitors 33B of the memory cells 31 included in the element layers 34_1 to 34_N are provided below the transistors 32 in the perpendicular direction. With this structure, capacitance can be increased; accordingly, the reliability of the read data and the data retention time can be improved. In addition, the electrodes of the capacitors 33B whose one electrode is connected to a fixed potential can be provided between the transistors 32 and the column driver 22 in the structure of FIG. 3(B), which can suppress the influence of noise of the column driver 22 on the memory cells 31.

Figure 4:
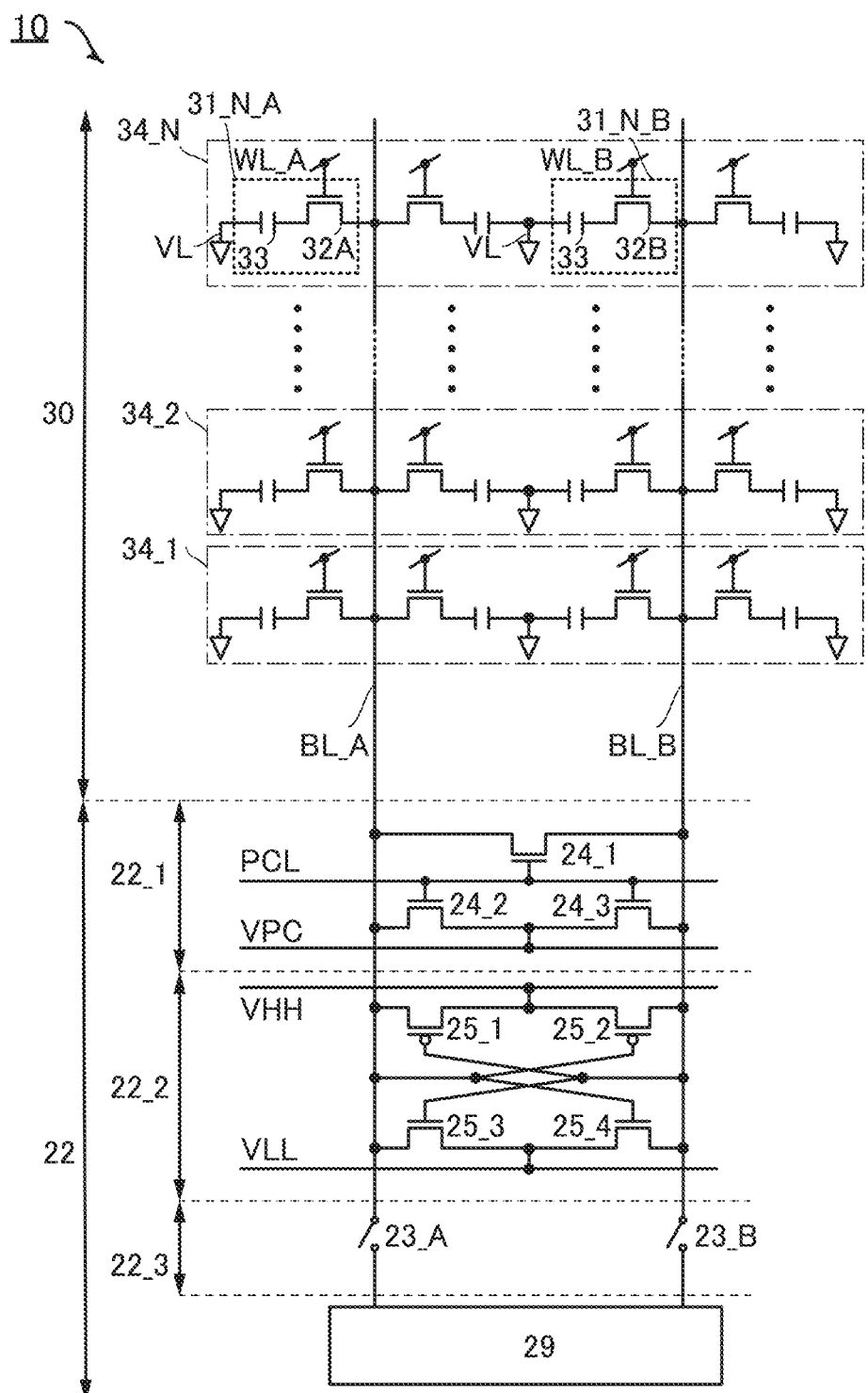
FIG. 4 is a circuit diagram illustrating a structure example of a semiconductor device.

FIG. 4 is a circuit diagram illustrating the circuit structure example of the memory cell array 30 including the element layers 34_1 to 34_N, which is described with reference to FIG. 1(A), and a specific circuit structure example of the column driver 22 connected to the memory cells, which is described with reference to FIG. 1(A).

FIG. 4 illustrates the element layers 34_1 to 34_N as the memory cell array 30. In FIG. 4, a memory cell 31_N_A is illustrated as a memory cell connected to a bit line BL_A. The memory cell 31_N_A includes a transistor 32A whose gate is connected to a word line WL_A and the capacitor 33. In addition, in FIG. 4, a memory cell 31_N_B is illustrated as a memory cell connected to a bit line BL_B. The memory cell 31_N_B includes a transistor 32B whose gate is connected to a word line WL_B and the capacitor 33. The capacitors 33 in each element layer are connected to a wiring VL to which a fixed potential, e.g., a ground potential, is supplied.

In addition, FIG. 4 illustrates a precharge circuit 22_1, a sense amplifier 22_2, a selection switch 22_3, and a write read circuit 29 on the silicon substrate side, as circuits included in the column driver 22. As transistors forming the precharge circuit 22_1 and the sense amplifier 22_2, Si transistors are used. Si transistors can also be used in the selection switch 22_3.

The precharge circuit 22_1 is formed using n-channel transistors 24_1 to 24_3. The precharge circuit 22_1 is a circuit for precharging the bit line BL_A and the bit line BL_B with an intermediate potential VPC corresponding to a potential VDD/2, which is between VDD and VSS, depending on a precharge signal supplied to a precharge line PCL.

The sense amplifier 222 is formed using p-channel transistors 25_1 and 25_2 and n-channel transistors 25_3 and 25_4, which are connected to a wiring VHH or a wiring VLL. The wiring VHH or the wiring VLL is a wiring having a function of supplying VDD or VSS. The transistors 25_1 to 25_4 are transistors that form an inverter loop. The sense amplifier 22_2 sets the potentials of the bit line BL_A and the bit line BL_B, which are changed by selection of the memory cells 31_N_A and 31_N_B under conditions where the word lines WL_A and WL_B are at high levels, to a high power supply potential VDD or a low power supply potential VSS. The potentials of the bit line BL_A and the bit line BL_B can be output to the outside through the write read circuit 29. The bit line BL_A and the bit line BL_B correspond to a bit line pair.

Figure 5:
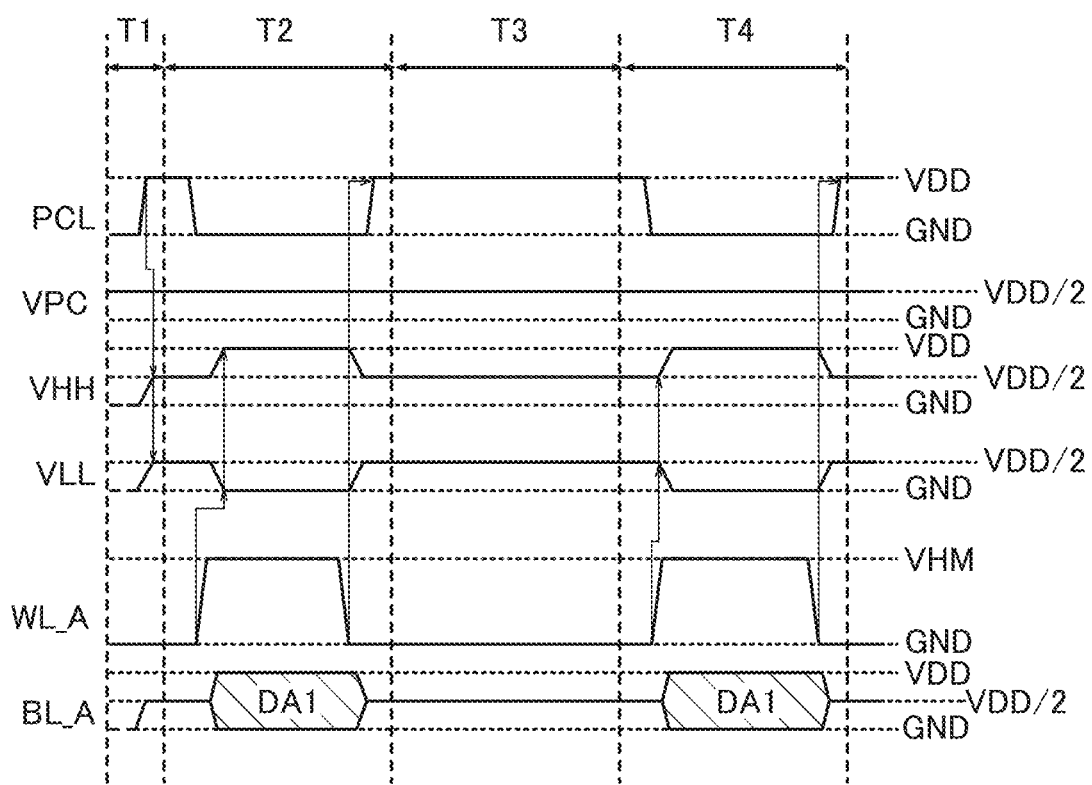
FIG. 5 is a timing chart illustrating a structure example of a semiconductor device.

Furthermore, FIG. 5 is a timing chart for describing an operation of the circuit diagram illustrated in FIG. 4. In the timing chart illustrated in FIG. 5, a period T1 corresponds to a period for describing an initialization operation, a period T2 corresponds to a period for describing a writing operation, a period T3 corresponds to a period for describing an operation in a non-access state, and a period T4 corresponds to a period for describing a reading operation. Although the description of switches 23_A and 23_B included in the selection switch 22_3 is omitted in FIG. 5, the switches 23_A and 23_B are selected as appropriate to be turned on in the writing operation and the reading operation.

Arrows between waveforms in FIG. 5 are for easy understanding of the operation. In the wiring PCL among signal lines, the high level (H level) is VDD. The high level in WL is VHM (>VDD) but may be VDD.

In the period T1, a wiring VPC, the wiring VHH, and the wiring VLL are set to VDD/2. The bit line BL_A is precharged to VDD/2. Precharging of the bit line BL_A is performed by the precharge circuit 22_1. By setting the wiring PCL to the high level (H level), smoothing of the potential with the precharged potential of the bit line BL_A (or the bit line BL_B) is performed.

In the period T2, when access for writing is made, the bit line BL_A (or the bit line BL_B) is brought from the precharge state to a floating state by changing the level of the wiring PCL from the H level to the L level. The word line WL_A is set to the H level. After WL_A is selected, VHH is set to VDD, and VLL is set to GND. The transistor 32A is turned on and data DA1 is written to the bit line BL_A. After the word line WL_A is brought to the L level, a precharge operation of the bit line BL_A (or the bit line BL_B) starts and these are precharged to VDD/2.

In the period T3, the wiring PCL has the H level and the word line WL_A has the L level. VPC, VHH, and VLL have VDD/2. The bit line pair and the local bit line pair are precharged to VDD/2. Setting VHH and VLL to VDD/2 can reduce a leakage current from the sense amplifier 22_2.

In the period T4, when access for reading is made, the bit line BL_A (or the bit line BL_B) is brought from the precharge state to a floating state. Next, the word line WL_A is brought to the H level to turn on the transistor 32A. The data DA1 is written to the bit line BL_A. After the word line WL_A is brought to the H level, VHH is set to VDD and VLL is set to GND so that the sense amplifier 222 functions as a differential amplifier circuit and amplifies the data DA1 in the bit line BL_A. The data DA1 in the bit line BL_A is read by the write read circuit 29.

In the semiconductor device of one embodiment of the present invention, an OS transistor with an extremely low off-state current is used as the transistor provided in each element layer. OS transistors can be provided to be stacked over a silicon substrate where Si transistors are provided. Therefore, OS transistors can be manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized.

Embodiment 2

Structure examples of a semiconductor device of one embodiment of the present invention are described with reference to FIG. 6 to FIG. 10. The description in Embodiment 1 is applied to the components denoted by the same reference numerals as the components in Embodiment 1, and the description of such components might be omitted.

Figure 6A:
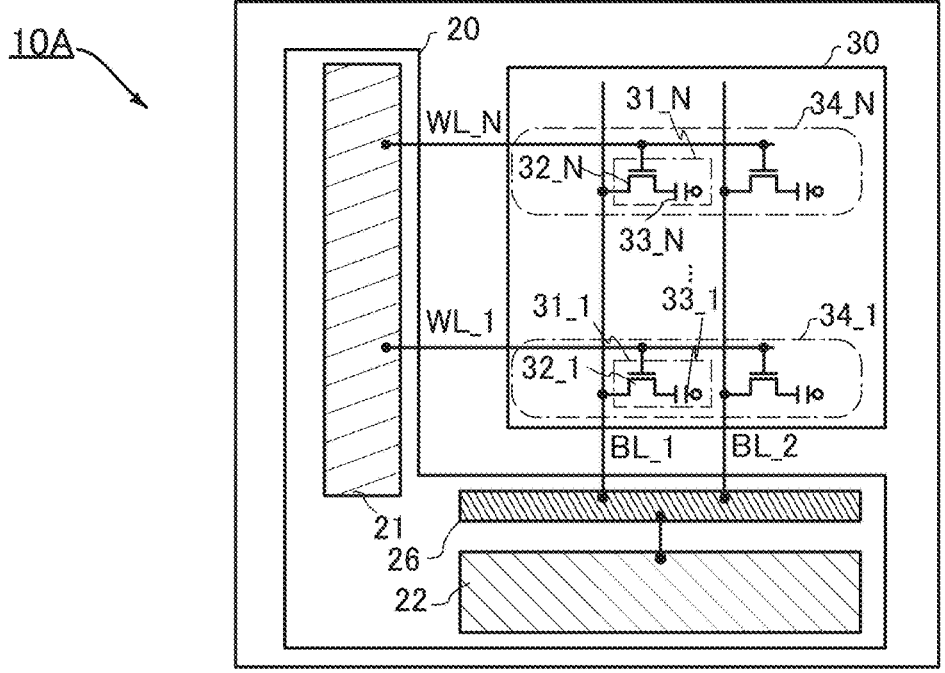
FIG. 6 are (A) a block diagram and (B) a schematic diagram illustrating a structure example of a semiconductor device.

FIG. 6(A) illustrates a block diagram of a semiconductor device 10A.

The peripheral circuit 20 includes the row driver 21, the column driver 22, and an element layer 26 where a switching circuit is provided. The switching circuit is simply referred to as a driver circuit in some cases. The switching circuit includes transistors having a function of controlling the conduction state between the memory cells and the column driver.

The element layer 26 provided with the switching circuit has a function of selectively connecting the column driver 22 to the bit lines BL. The switching circuit has a function of a multiplexer which connects a predetermined bit line and a driver circuit such as a sense amplifier of the column driver 22 in accordance with a selection signal output from the column driver 22. The switching circuit is a circuit having a function of outputting a signal for driving the memory cell array 30 to the bit line BL selected with the switching circuit.

In the semiconductor device of FIG. 6(A), the element layer 26 provided with the switching circuit enables the number of bit lines BL connected to the column driver 22 in the perpendicular direction to be reduced, which shortens data writing time and improves the reading accuracy.

Furthermore, the transistors forming the switching circuit are preferably OS transistors. The element layer 26 including the switching circuit where the OS transistors are used can be freely provided over a circuit or the like where Si transistors are used; thus, integration can be easily performed. An OS transistor can be manufactured with a manufacturing apparatus similar to that for a Si transistor and thus can be manufactured at low cost.

Out of the components described with reference to FIG. 6(A), the element layers 34_1 to 34_N and the element layer 26 including the switching circuit in one embodiment of the present invention are described with reference to a schematic diagram illustrated in FIG. 6(B). The schematic diagram illustrated in FIG. 6(B) corresponds to a perspective view providing the x-axis, the y-axis, and the z-axis for illustration of the layout of the components described with reference to FIG. 6(A).

Figure 6B:
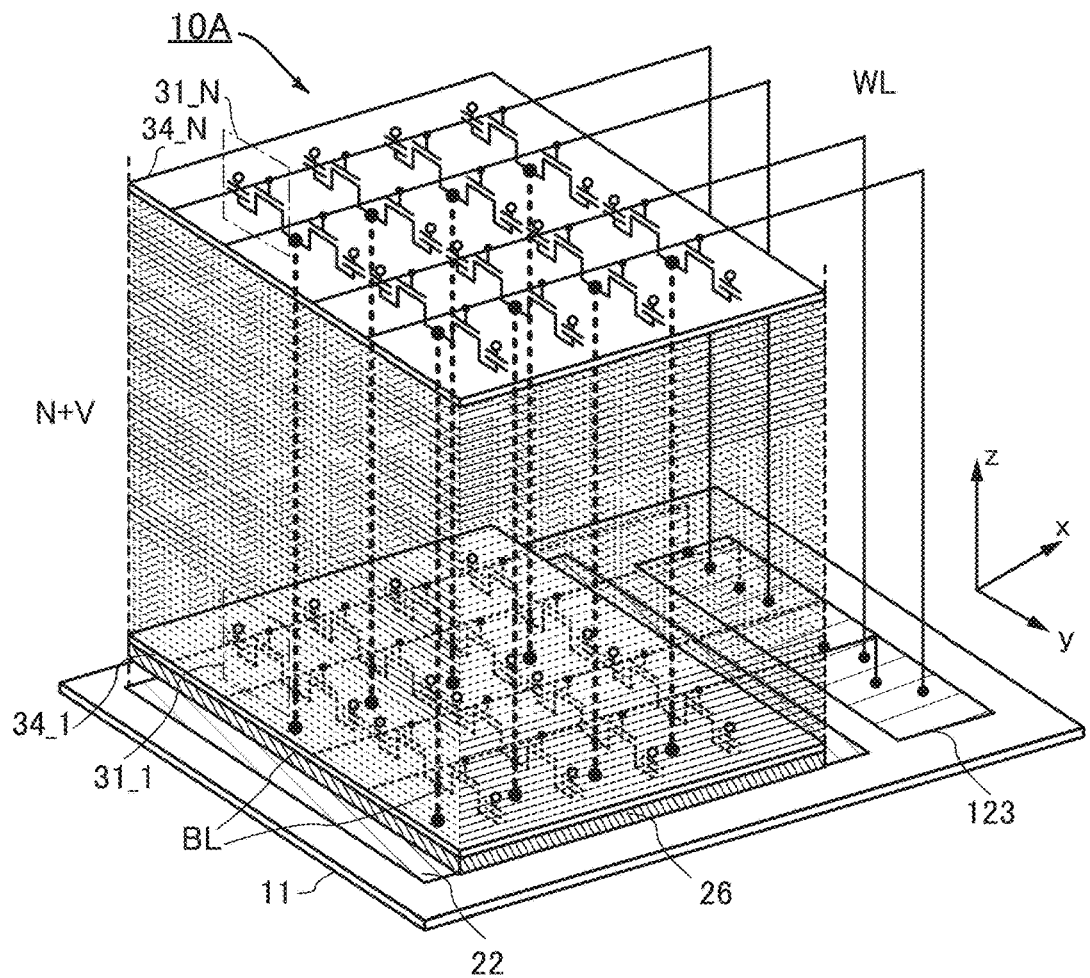

As illustrated in FIG. 6(B), the semiconductor device 10A includes V (V is a natural number greater than or equal to 1) element layers 26 provided with the transistors forming the switching circuit and N element layers 34_1 to 34_N. (N+V) layers in total, which each include OS transistors, are provided to be stacked over the silicon substrate 11. The memory cells 31_1 to 31_N included in the element layer 34_1 to the element layer 34_N and the element layer 26 provided with the transistors forming the switching circuit each include a region overlapping with the column driver 22 provided over the silicon substrate 11. It can also be said that the element layer 26 is provided between the silicon substrate 11 and the element layer 341 as illustrated in FIG. 6(B). In addition, it can also be said that the element layer 34_1 is provided between the silicon substrate 11 and the element layer 34_N as illustrated in FIG. 6(B).

The transistor of the memory cell 31_1 included in the element layer 34_1 and the transistor of the memory cell 31_N included in the element layer 34_N are connected to each other through the bit line BL provided in the perpendicular direction. The bit line BL is connected to the element layer 26 provided with the transistors forming the switching circuit. The element layer 26 is connected to the column driver 22 provided over the silicon substrate 11.

The bit line BL_1 is provided in contact with the semiconductor layer of the transistor included in the memory cell 31_1. Alternatively, the bit line BL_1 is provided in contact with the region functioning as the source or the drain of the semiconductor layer of the transistor included in the memory cell 31_1. Alternatively, the bit line BL_1 is provided in contact with the conductor provided in contact with the region functioning as the source or the drain of the semiconductor layer of the transistor included in the memory cell 31_1. In other words, the bit line BL is a wiring for electrically connecting one of the source and the drain of the transistor included in the memory cell 31_1, one of the source and the drain of the transistor included in the memory cell 31_N, and the element layer 26 in the perpendicular direction.

In one embodiment of the present invention, an OS transistor with an extremely low off-state current is used as the transistor provided in each element layer. Accordingly, the frequency of refresh of data retained in the memory cells can be reduced, so that a semiconductor device with reduced power consumption can be obtained. OS transistors can be provided to be stacked and manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized. Moreover, because an OS transistor has a small variation in electrical characteristics even under a high-temperature environment compared with a Si transistor, the semiconductor device can function as a highly reliable memory device that has a small variation in electrical characteristics of transistors at the time of stacking and integration.

In addition, one embodiment of the present invention includes the element layer including the switching circuit. The switching circuit can reduce the number of bit lines BL connected to the sense amplifier included in the column driver. Thus, the load on the bit lines BL can be reduced. The switching circuit enables the number of bit lines BL connected to the column driver in the perpendicular direction to be reduced, which shortens data writing time and improves the reading accuracy. Furthermore, unnecessary charging and discharging of bit lines can be avoided; thus, a semiconductor device with reduced power consumption can be obtained. Since the memory cells can be provided directly above the circuit such as the sense amplifier, the semiconductor device can be downsized. Moreover, even when the capacitance of the capacitors included in the memory cells are reduced, operation is possible. Furthermore, in one embodiment of the present invention, the length of the bit lines between the memory cell array and the column driver can be reduced by provision of the bit lines extending from the memory cell array in the perpendicular direction. Thus, parasitic capacitance of the bit lines can be significantly reduced and a potential can be read even when the data signals retained in the memory cells are multi-level signals.

Figure 7:
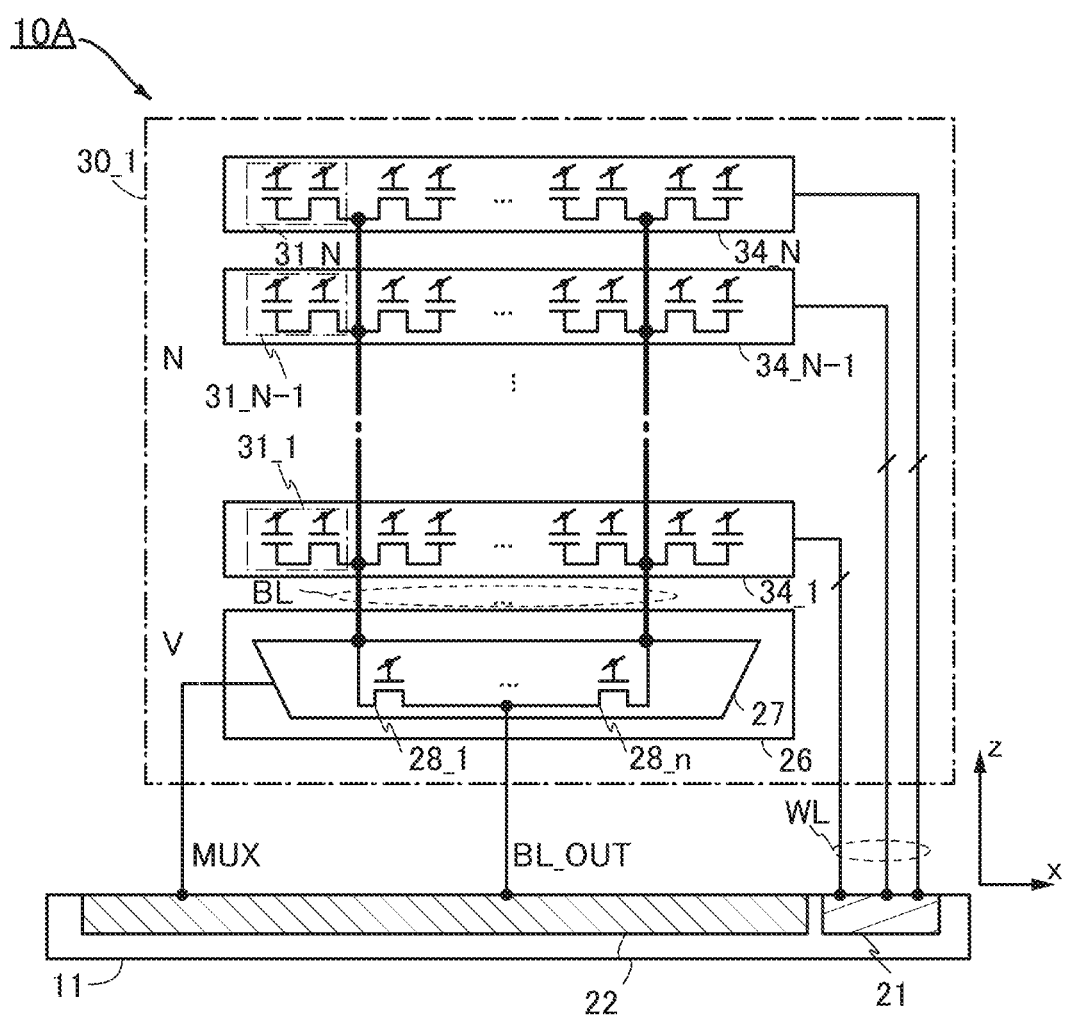
FIG. 7 is a schematic diagram illustrating a structure example of a semiconductor device.

FIG. 7 illustrates a schematic diagram of a cross section that is parallel to the perpendicular direction (z-axis direction) of the semiconductor device 10A described with reference to FIG. 6(A) and FIG. 6(B).

As illustrated in FIG. 7, the semiconductor device 10A can have a structure where the memory cells 31_1 to 31_N provided in the element layers, the element layer 26, and the column driver 22 provided over the silicon substrate 11 are connected to each other with the shortest distance therebetween through the bit line BL provided in the perpendicular direction. Although the number of element layers 26 including a switching circuit 27 is increased, the number of bit lines BL connected to the sense amplifier included in the column driver 22 can be reduced. Thus, the load on the bit lines BL can be reduced.

Furthermore, as illustrated in FIG. 7, transistors 28_1 to 28_n (n is a natural number greater than or equal to 2) included in the switching circuit 27 can output, to the column driver 22, the potential of the bit line BL selected in accordance with a selection signal MUX output from the column driver 22, as a signal BL_OUT. Note that the semiconductor device 10A illustrated in FIG. 7 can be expressed as a unit 30_1.

Figure 8:
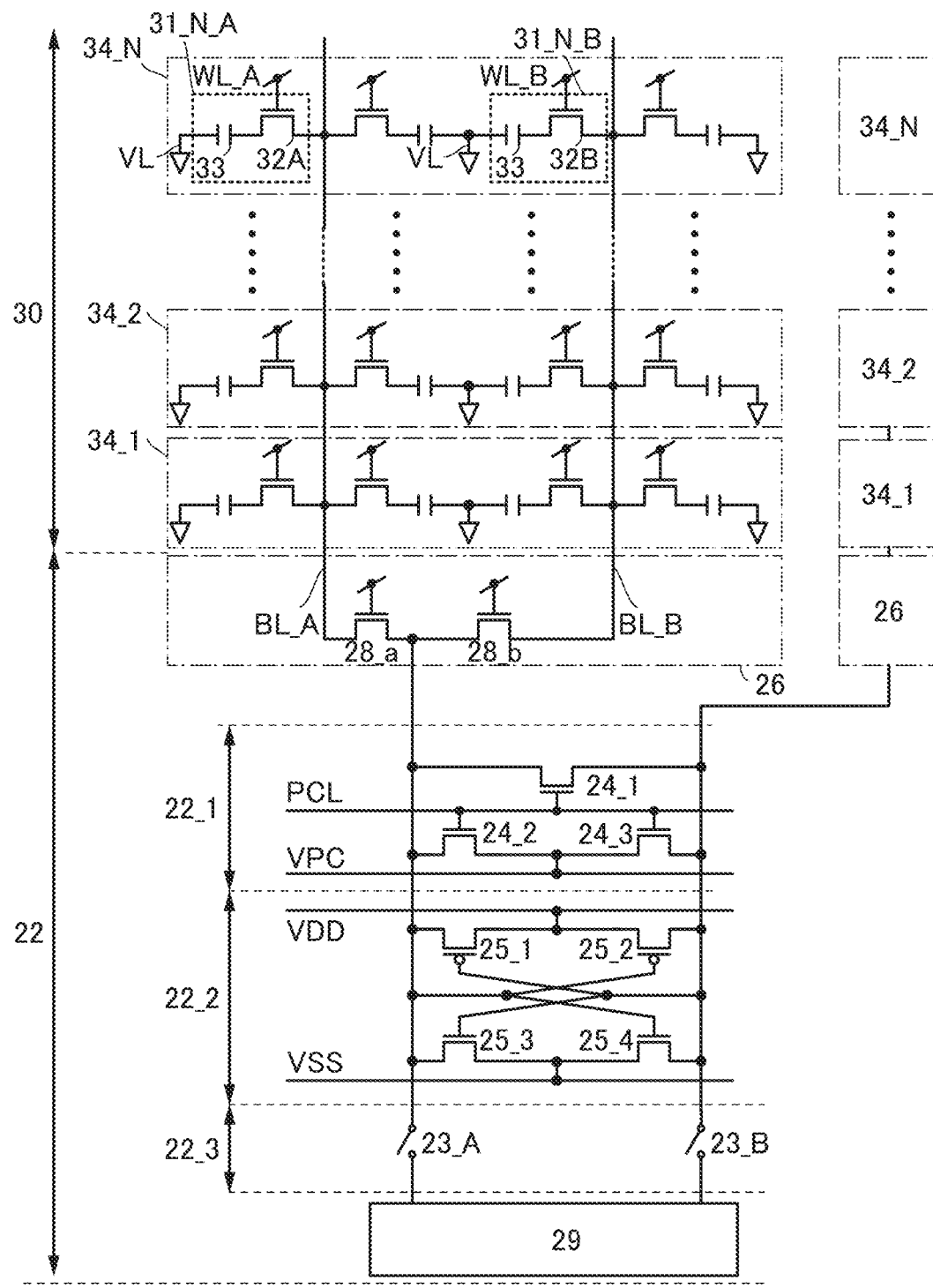
FIG. 8 is a circuit diagram illustrating a structure example of a semiconductor device.

FIG. 8 illustrates a circuit diagram of the element layer 26 including transistors 28_a and 28_b in addition to the element layers 341 to 34_N as the memory cell array 30. In FIG. 8, the element layers 34_1 to 34_N are provided over the element layer 26 including the transistors 28_a and 28_b, and the bit lines BL_A and BL_B are provided in the perpendicular direction. That is, the element layer including the switching circuit, which forms part of a peripheral circuit, can be provided to be stacked in a manner similar to that of the element layers 34_1 to 34_N. The bit lines BL_A and BL_B are connected to one of sources and drains of the transistors 28_a and 28_b.

In addition, FIG. 8 illustrates the precharge circuit 22_1, the sense amplifier 22_2, the switch circuit 22_3, and the write read circuit 29 on the silicon substrate side, as circuits included in the column driver 22. As transistors forming the precharge circuit 22_1 and the sense amplifier 222, Si transistors are used. Si transistors can also be used in the selection switch 22_3. The other of the sources and the drains of the transistors 28_a and 28_b is connected to the transistors forming the precharge circuit 22_1 and the sense amplifier 22_2. In addition, FIG. 8 illustrates blocks representing the element layers 34_1 to 34_N connected to the wiring connected to the switch circuit 23_A included in the switch circuit 22_3 and the element layer 26 and blocks representing the element layers 34_1 to 34_N connected to the wiring connected to the switch circuit 23_B included in the switch circuit 22_3 and the element layer 26.

The element layer 26 including the switching circuit selects the bit line BL_A or BL_B, and the bit line BL is connected to one of a pair of wirings connected to the precharge circuit 22_1 and the sense amplifier 22_2 and the switch 23_A. The other pair of the element layers 26 including the switching circuit selects the bit line BL, and the bit line BL is connected to the other of the pair of wirings connected to the precharge circuit 22_1 and the sense amplifier 22_2 and the switch 23_B. When the word line of the memory cell which is connected to the selected bit line is selected to the high level, the potential of the precharged bit line changes, and the potential of the pair of wirings connected to the precharge circuit 22_1 and the sense amplifier 22_2 becomes the high power supply potential VDD or the low power supply potential VSS in accordance with the change. The potential can be output to the outside through the switch circuit 22_3 and the write read circuit 29.

As illustrated in FIG. 8, in the semiconductor device 10A, although the number of element layers 26 including the switching circuit is increased, any one of the bit lines BL can be selected and connected to the column driver 22. Therefore, fewer bit lines BL are connected to the sense amplifier 222 in the structure, and the load on the bit lines BL can be reduced.

Figure 9:
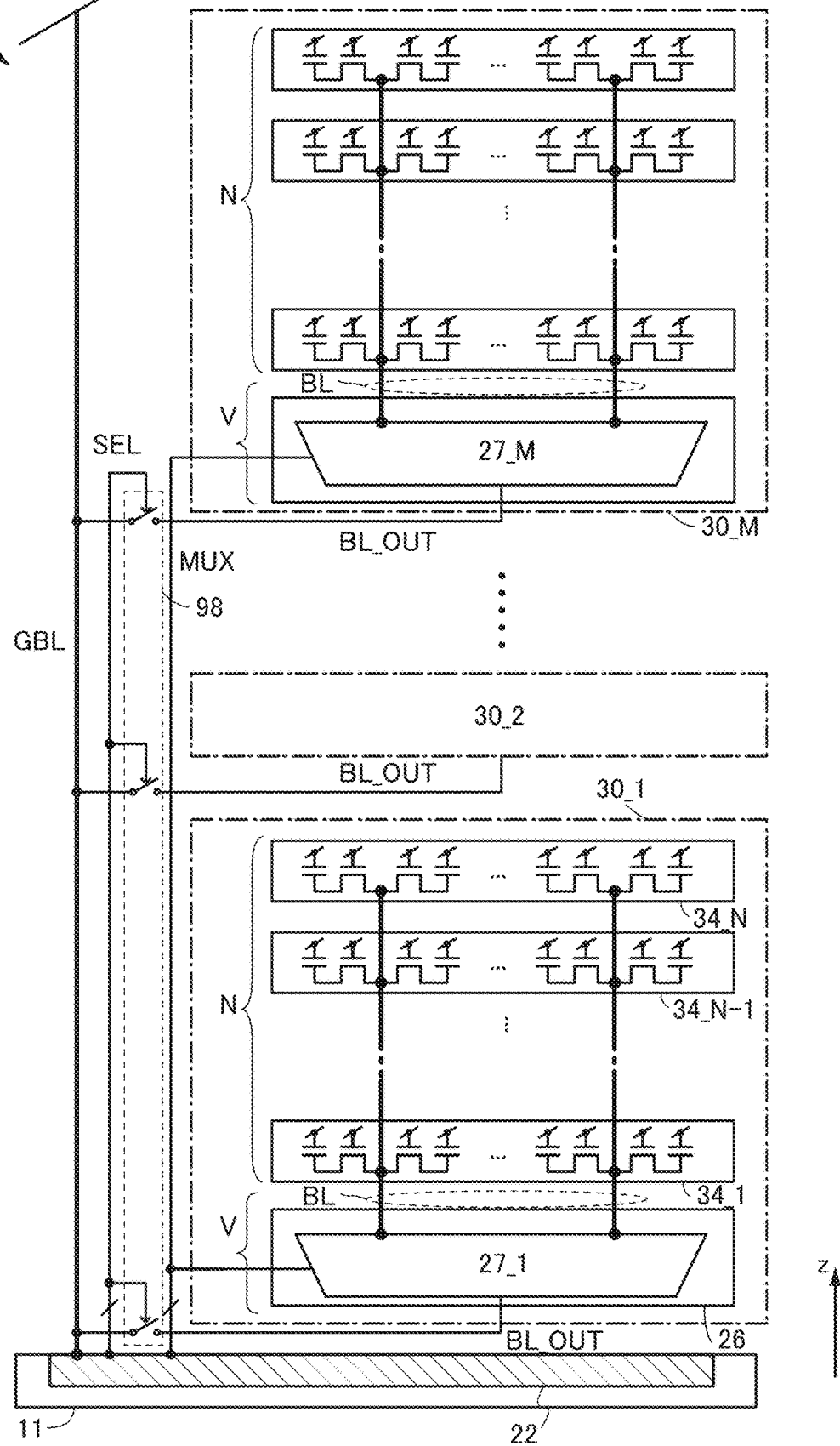
FIG. 9 is a schematic diagram illustrating a structure example of a semiconductor device.
Figure 10A:
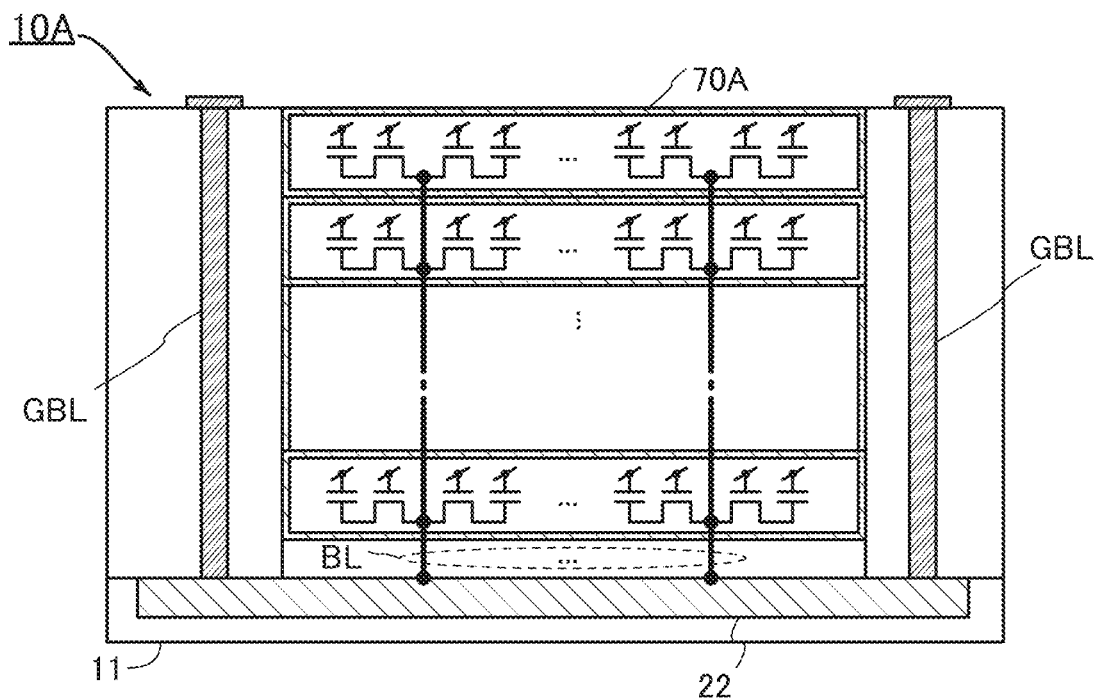
FIG. 10 are (A) a schematic diagram and (B) a schematic diagram illustrating structure examples of a semiconductor device.
Figure 10B:
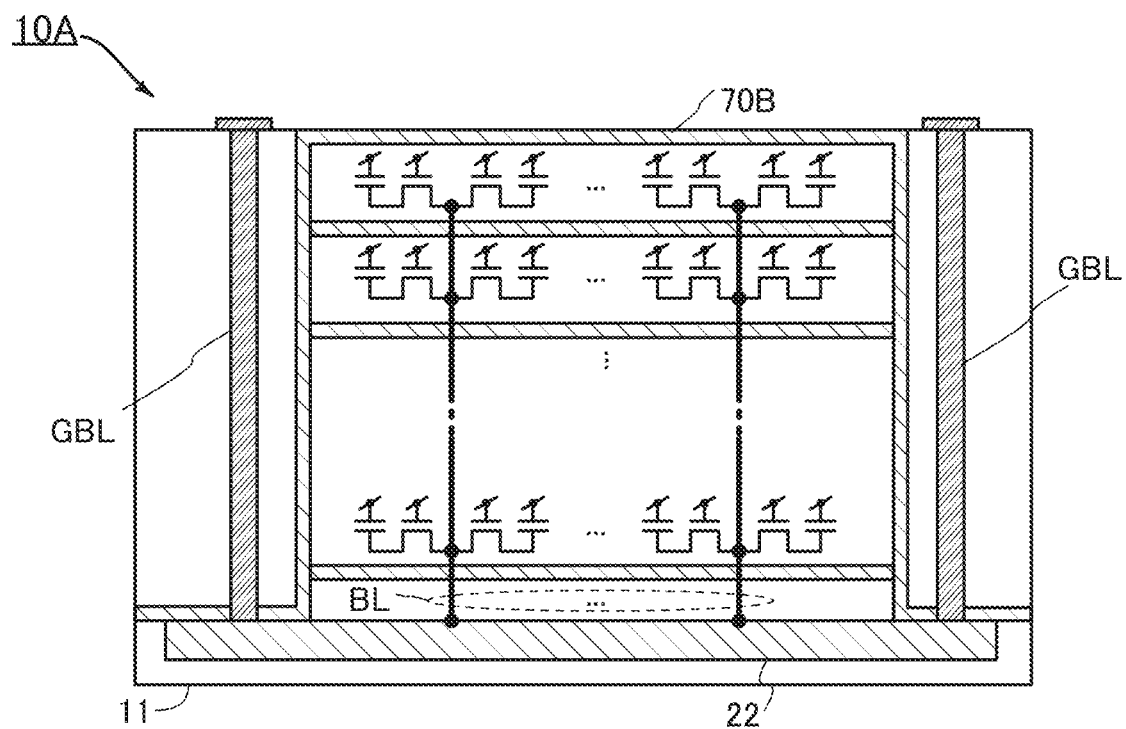

Note that a structure in which the units 30_1 in the semiconductor device 10A illustrated in FIG. 7 are provided to be stacked in the perpendicular direction can be employed. FIG. 9 illustrates the semiconductor device 10A having a structure in which M tiers of units 30_1 illustrated in FIG. 7 (the units 30_1 to 30_M, M is greater than or equal to 2) are stacked. FIG. 9 corresponds to a schematic diagram of a cross section that is parallel to the perpendicular direction (z-axis direction) of the semiconductor device. In other words, the structure of the semiconductor device 10A illustrated in FIG. 9 is a structure in which M×(N+V) layers in total of element layers illustrated in FIG. 7 are stacked.

As illustrated in FIG. 9, in the semiconductor device 10A, the units 30_1 to 30_M include the switching circuits 27_1 to 27_M, respectively. On the input of the selection signal MUX, the switching circuits 27_1 to 27_M output the signal BL_OUT. Any one of a plurality of wirings through which the signal BL_OUT is output is selected by a switch circuit 98 which is capable of switching with the use of a selection signal SEL and is connected to the column driver 22 through a wiring GBL, which is different from the bit lines BL. Note that the switch circuit 98 can use the OS transistors forming the switching circuits 27_1 to 27_M.

With the above-described structure, the number of stacked element layers 34_1 to 34_N in each of the units 30_1 to 30_M can be reduced. Therefore, the length of the bit lines BL in each of the units 30_1 to 30_M can be reduced, and the load on the bit lines BL can be reduced. In some drawings, the wiring GBL is denoted by a thick line, a thick dotted line, or the like for enhanced visibility. The wiring GBL is referred to as a global bit line in some cases.

Note that the wiring GBL illustrated in FIG. 9 can be provided after the element layers including OS transistors are formed. For example, as in a schematic cross-sectional view illustrated in FIG. 10(A), after the element layers including OS transistors are formed, openings can be provided in the circumference of a sealing layer 70A which surrounds each of the element layers and the wirings GBL can be provided in the openings. Alternatively, as in a schematic cross-sectional view illustrated in FIG. 10(A), after the element layers including OS transistors are formed, openings can be provided in the circumference of a sealing layer 70B which collectively surrounds each of the element layers and the wirings GBL can be provided in the openings. The details of each of the element layers provided with the wirings GBL will be described in Embodiment 3.

In the semiconductor device of one embodiment of the present invention, an OS transistor with an extremely low off-state current is used as the transistor provided in each element layer. OS transistors can be provided to be stacked over a silicon substrate where Si transistors are provided. Therefore, OS transistors can be manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized.

In addition, one embodiment of the present invention includes the element layer including the switching circuit. The switching circuit enables the number of bit lines BL connected to the column driver in the perpendicular direction to be reduced, which shortens data writing time and improves the reading accuracy.

Embodiment 3

Structure examples of a semiconductor device of one embodiment of the present invention are described with reference to FIG. 11 to FIG. 24. The description in Embodiment 1 is applied to the components denoted by the same reference numerals as the components in Embodiment 1, and the description of such components might be omitted.

Figure 11A:
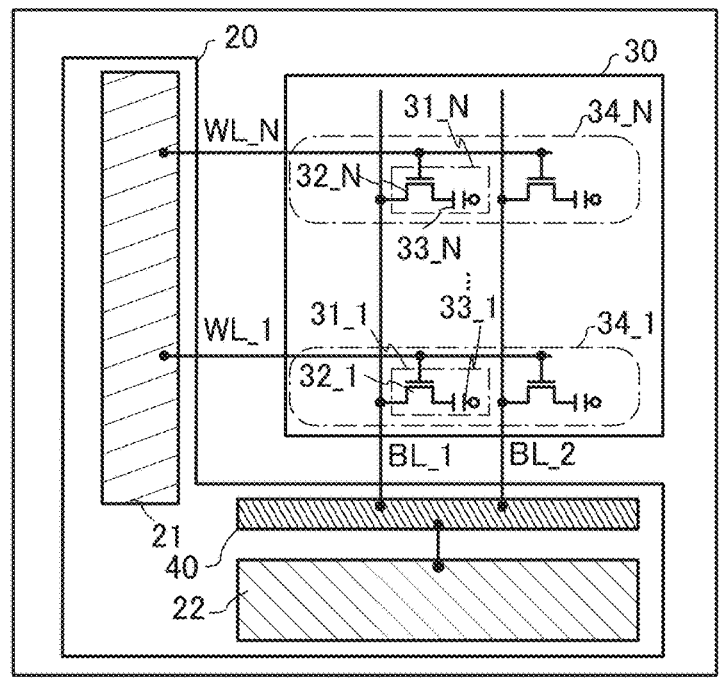
FIG. 11 are (A) a block diagram and (B) a schematic diagram illustrating a structure example of a semiconductor device.

FIG. 11(A) illustrates a block diagram of a semiconductor device 10B.

The peripheral circuit 20 includes the row driver 21, the column driver 22, and an element layer 40 where a control circuit is provided. The control circuit includes a circuit functioning as a sense amplifier formed using OS transistors.

The element layer 40 where the control circuit is provided includes the circuit functioning as a sense amplifier formed using OS transistors. The sense amplifier formed using OS transistors not only writes or reads a data signal to or from the memory cells but also functions as the switching circuit for selecting units 50_1 to 50_M including the memory cells 31_1 to 31_N. Control signals WE, RE, and MUX for driving the sense amplifier formed using OS transistors are supplied from the column driver 22 to the element layer 40. The circuit functioning as the sense amplifier includes the transistors for controlling reading or writing of a data signal from or to the memory cells and thus is referred to as a control circuit in some cases.

In the semiconductor device in FIG. 11(A), the control circuit can function as an amplifier. With this structure, a slight difference in the potential of the bit line BL is amplified at the time of reading, and the sense amplifier formed using Si transistors can be driven.

Furthermore, the transistors forming the control circuit are preferably OS transistors. The element layer 40 including the control circuit where the OS transistors are used can be freely provided over a circuit or the like where Si transistors are used; thus, integration can be easily performed. An OS transistor can be manufactured with a manufacturing apparatus similar to that for a Si transistor and thus can be manufactured at low cost.

Out of the components described with reference to FIG. 11(A), the element layers 34_1 to 34_N and the element layer 40 including the control circuit in one embodiment of the present invention are described with reference to a schematic diagram illustrated in FIG. 11(B). The schematic diagram illustrated in FIG. 11(B) corresponds to a perspective view providing the x-axis, the y-axis, and the z-axis for illustration of the layout of the components described with reference to FIG. 11(A).

Figure 11B:
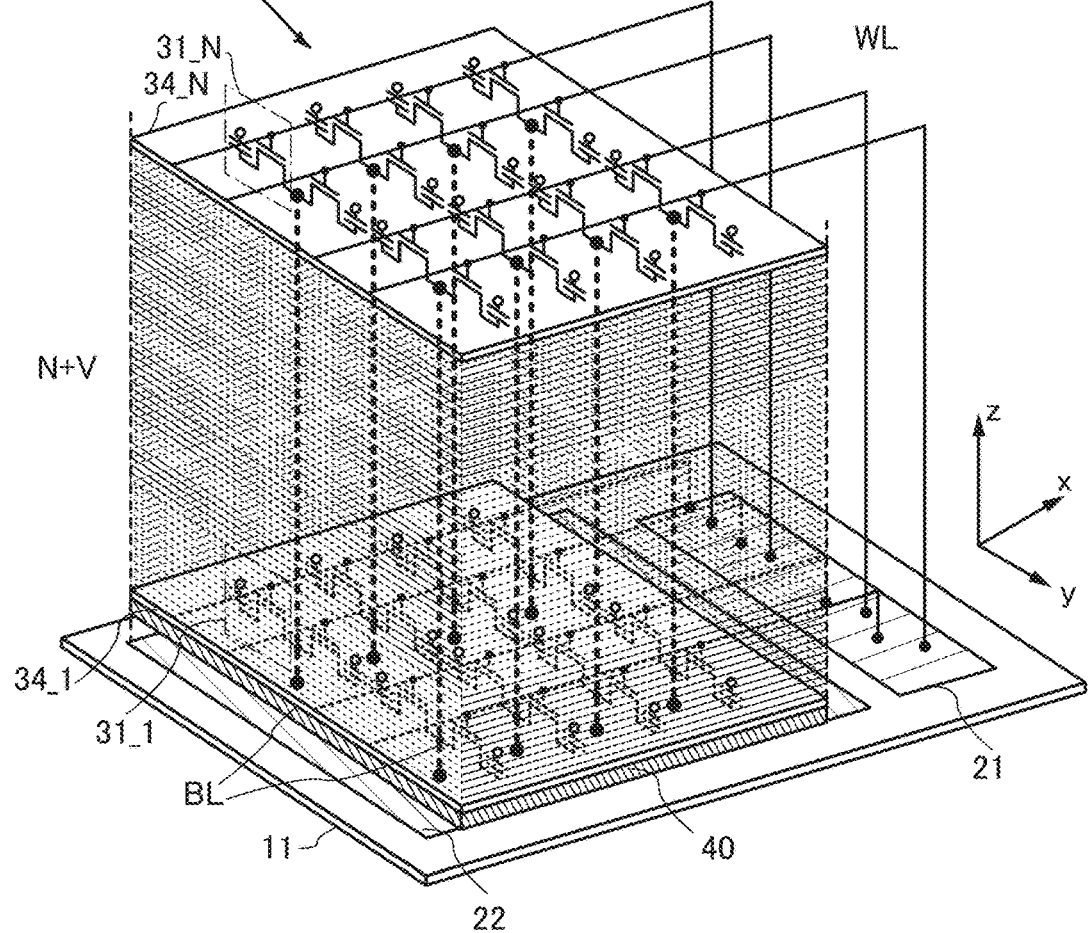

As illustrated in FIG. 11(B), the semiconductor device 10B includes V (V is a natural number greater than or equal to 1) element layers 40 provided with the transistors forming the control circuit and N element layers 34_1 to 34_N: (N+V) layers in total, which each include OS transistors, are provided to be stacked over the silicon substrate 11. The memory cells 31_1 to 31_N included in the element layer 34_1 to the element layer 34_N and the element layer 40 provided with the transistors forming the control circuit each include a region overlapping with the column driver 22 provided over the silicon substrate 11. It can also be said that the element layer 40 is provided between the silicon substrate 11 and the element layer 34_1 as illustrated in FIG. 11(B). In addition, it can also be said that the element layer 34_1 is provided between the silicon substrate 11 and the element layer 34_N as illustrated in FIG. 11(B).

The transistor of the memory cell 31_1 included in the element layer 34_1 and the transistor of the memory cell 31_N included in the element layer 34_N are connected to each other through the bit line BL provided in the perpendicular direction. The bit line BL is connected to the element layer 40 provided with the transistors forming the control circuit. The element layer 40 is connected to the column driver 22 provided over the silicon substrate 11 through the wiring GBL (not illustrated) provided separately from the bit lines BL. In some drawings, the wiring GBL is denoted by a thick line, a thick dotted line, or the like for enhanced visibility.

The bit line BL_1 is provided in contact with the semiconductor layer of the transistor included in the memory cell 31_1. Alternatively, the bit line BL_1 is provided in contact with the region functioning as the source or the drain of the semiconductor layer of the transistor included in the memory cell 31_1. Alternatively, the bit line BL_1 is provided in contact with the conductor provided in contact with the region functioning as the source or the drain of the semiconductor layer of the transistor included in the memory cell 31_1. In other words, the bit line BL is a wiring for electrically connecting one of the source and the drain of the transistor included in the memory cell 31_1, one of the source and the drain of the transistor included in the memory cell 31_N, and the element layer 40 in the perpendicular direction.

Figure 12A:
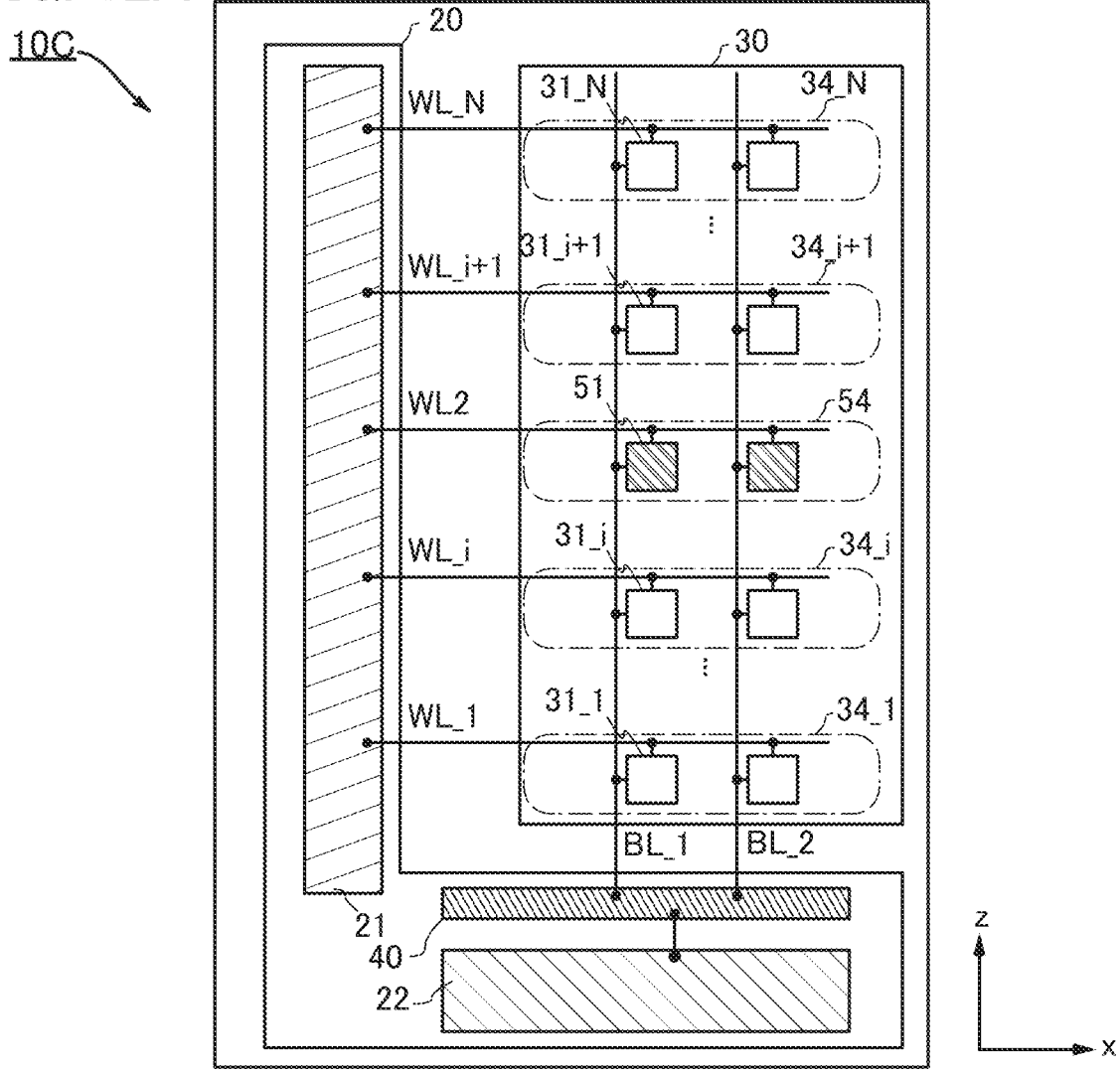
FIG. 12 are (A) a block diagram and (B) a circuit diagram illustrating a structure example of a semiconductor device.

The semiconductor device 10B includes one kind of memory cells but may include two or more kinds of memory cells. FIG. 12(A) is a block diagram illustrating a structure example of a semiconductor device 10C, which is a modification example of the semiconductor device 10B. The semiconductor device 10C is different from the semiconductor device 10B in that not only the memory cells 31 but also a memory cell 51 having a different structure from the memory cells 31 is provided in the memory cell array 30. The semiconductor device 10C includes an element layer 54 formed of one or more memory cells 51.

In the semiconductor device 10C, the element layer 54 can be provided between the element layer 34_i (i is an integer greater than or equal to 1 and less than or equal to N−1) and the element layer 34_i+1. Note that two or more element layers 54 may be provided. In the case where the semiconductor device 10C includes two or more element layers 54, the element layer 34 may or may not be provided between the first element layer 54 and the second element layer, for example.

In the semiconductor device 10C, the row driver 21 is electrically connected to the memory cell 51 through the word line WL2. The row driver 21 included in the semiconductor device 10C has a function of outputting a signal for driving the memory cell array 30 to the word line WL2 as well as the word line WL. Specifically, the row driver 21 has a function of transmitting a word signal to the word line WL2 as well as the word line WL. Note that a row driver having a function of transmitting a word signal to the word line WL2 may be provided separately from the row driver having a function of transmitting a word signal to the word line WL. Furthermore, the word line WL2 is simply referred to as a wiring in some cases.

Figure 12B:
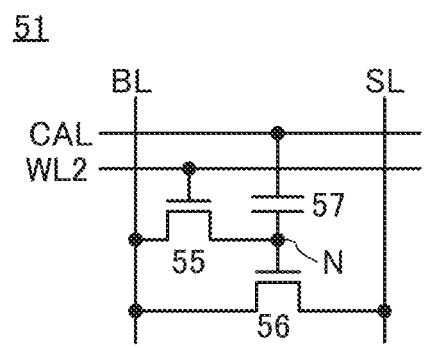

FIG. 12(B) is a circuit diagram illustrating a structure example of the memory cell 51. The memory cell 51 includes a transistor 55, a transistor 56, and a capacitive element 57.

One of a source and a drain of the transistor 55 is electrically connected to a gate of the transistor 56. The gate of the transistor 56 is electrically connected to one electrode of the capacitive element 57. The other of the source and the drain of the transistor 55 and one of a source and a drain of the transistor 56 are electrically connected to the wiring BL. The other of the source and the drain of the transistor 56 is electrically connected to a wiring SL. The other electrode of the capacitive element 57 is electrically connected to a wiring CAL. Here, a node at which the one of the source and the drain of the transistor 55, the gate of the transistor 56, and the one electrode of the capacitive element 57 are electrically connected is referred to as a node N.

The wiring CAL has a functions of a wiring for applying a predetermined potential to the other electrode of the capacitive element 57. The potential of the wiring CAL at the time of reading data from the memory cell 51 is made to differ from the potentials of the wiring CAL at the time of writing data to the memory cell 51 and during data retention in the memory cell 51. Accordingly, the apparent threshold voltage of the transistor 56 at the time of reading data from the memory cell 51 can differ from the apparent threshold voltages of the transistor 56 at the time of writing data to the memory cell 51 and during data retention in the memory cell 51.

In the case where the memory cell 51 has the structure illustrated in FIG. 12(B), a current does not flow between the wiring SL and the wiring BL at the time of writing data to the memory cell 51 and during data retention in the memory cell 51, regardless of the data written to the memory cell 51. On the other hand, at the time of reading data from the memory cell 51, a current corresponding to the retained data in the memory cell 51 flows between the wiring SL and the wiring BL.

The transistor 55 is preferably an OS transistor. As described above, an OS transistor has an extremely low off-state current. Therefore, electric charge corresponding to the data written to the memory cell 51 can be retained in the node N for a long time. In other words, data that is once written to the memory cell 51 can be retained for a long time. Therefore, the frequency of data refresh can be reduced and power consumption of the semiconductor device of one embodiment of the present invention can be reduced.

The memory cell 51 where OS transistors are used can be freely provided over a silicon substrate or the like; thus, integration can be easily performed. In terms of the integration of the memory cell 51, the transistor 56 is preferably an OS transistor.

The transistor 55 preferably includes a back gate electrode. Controlling the potential applied to the back gate electrode can control the threshold voltage of the transistor 55. Thus, for example, the on-state current of the transistor 55 can be increased and the off-state current can be reduced, for example. In the case where the transistor 56 is an OS transistor, the transistor 56 is preferably also provided with a back gate electrode.

The memory cell 51 having the structure illustrated in FIG. 12(B) can be referred to as a NOSRAM (Nonvolatile Oxide Semiconductor RAM) using an OS transistor as a memory. NOSRAM has a feature capable of nondestructive reading. In contrast, the DOSRAM that can be used in the memory cells 31 performs destructive reading when the retained data is read.

An operation of the semiconductor device 10C is described. The data written to the memory cell array 30 from the column driver 22 is retained in the memory cells 31. Data that is read with a high frequency among the data retained in the memory cells 31 is transcribed from the memory cells 31 to the memory cell 51. Since the memory cell 51, which is the NOSRAM, is capable of nondestructive reading as described above, the frequency of data refresh can be reduced. Thus, power consumption of the semiconductor device of one embodiment of the present invention can be reduced.

Furthermore, the potential of the node N varies in accordance with not only the data written to the memory cell 51 but also the potential of the wiring CAL. Thus, when the potential of the wiring CAL is adjusted after data is written to the memory cell 51, the data retained in the memory cell 51 can be corrected. For example, the potential of the wiring CAL at the time of reading data from the memory cell 51 in the case of correcting the retained data in memory cell 51 can differ from the potential of the wiring CAL at the time of reading data from the memory cell 51 in the case of not correcting the retained data in memory cell 51. For example, in the case where the data written to the memory cell is image data, the semiconductor device 10C can perform image processing. Accordingly, the semiconductor device 10C can serve as an image processing engine, for example.

Note that in the semiconductor device 10C, i is preferably N/2 or a value in the vicinity thereof. This can shorten the wiring distance from the memory cell 51 to the memory cell 31_1 or the wiring distance from the memory cell 51 to the memory cell 31_N, for example. Thus, a reduction in the data potential due to resistance of a wiring such as the wiring BL, which might be caused at the time of transcribing data from the memory cell 51 to, for example, the memory cell 31_1 or the memory cell 31_N, can be suppressed.

Figure 13:
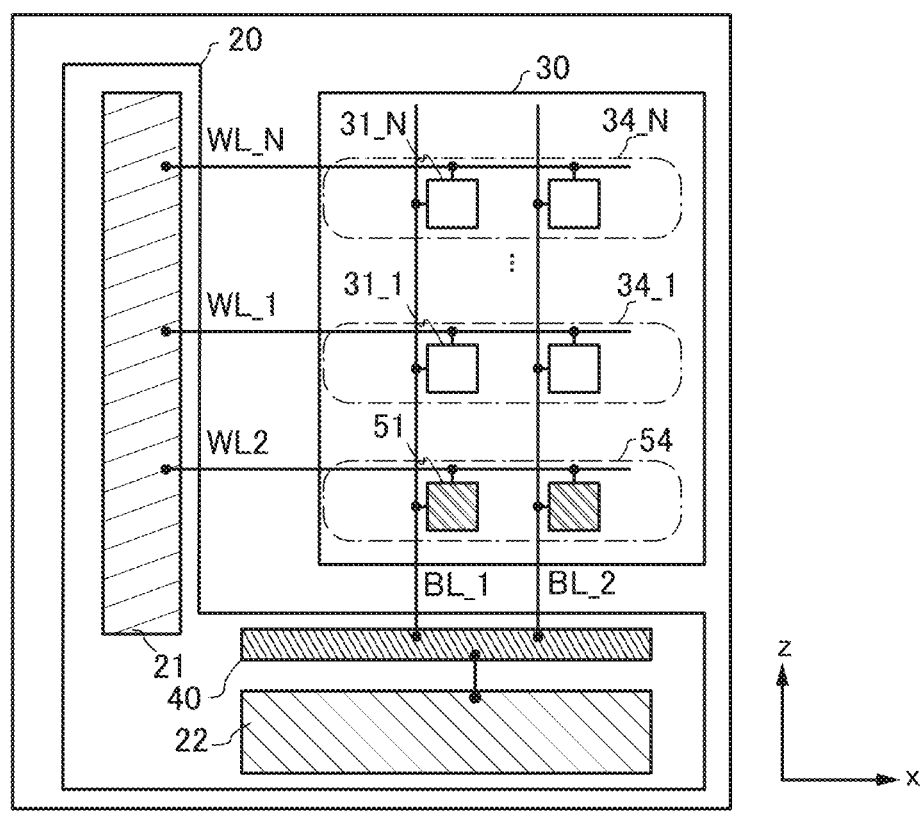
FIG. 13 is a block diagram illustrating a structure example of a semiconductor device.

FIG. 13 is a block diagram illustrating a structure example of a semiconductor device 10D, which is a modification example of the semiconductor device 10C. The structure of the semiconductor device 10D is different from the structure of the semiconductor device 10C in that the element layer 54 is provided before the element layer 341, that is, between the element layer 34_1 and the element layer 40.

The semiconductor device 10D has a feature of having a short wiring distance between the element layer 40 where the sense amplifier or the like is provided and the element layer 54. This can solve the difficulty in operation due to an increase of wiring resistance in the memory cell 51 and facilitates control of operation of the memory cell 51. Note that the element layer 54 may be provided after the element layer 34_N, that is, over the element layer 34_N, for example.

Figure 14:
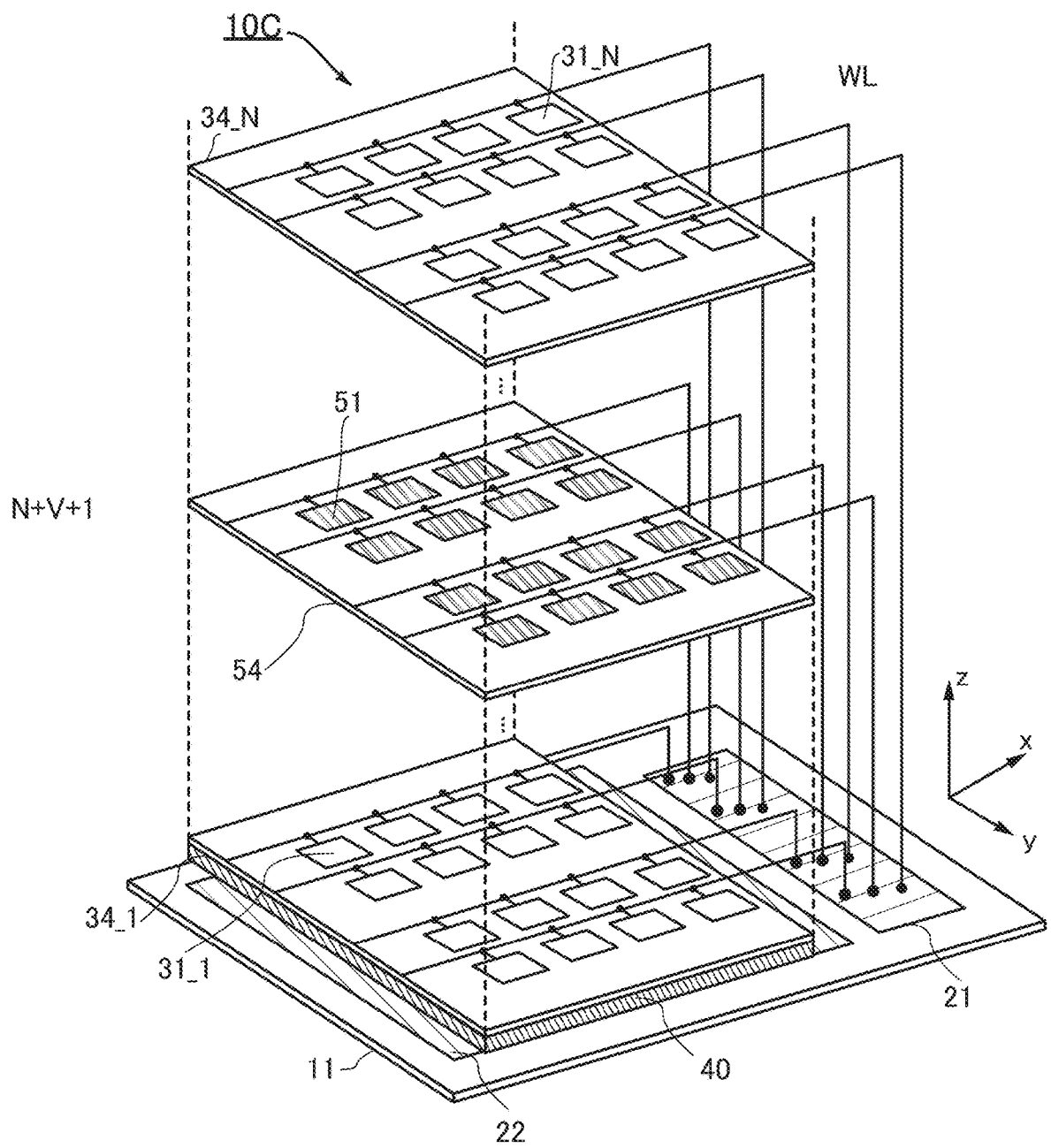
FIG. 14 is a schematic diagram illustrating a structure example of a semiconductor device.
Figure 15:
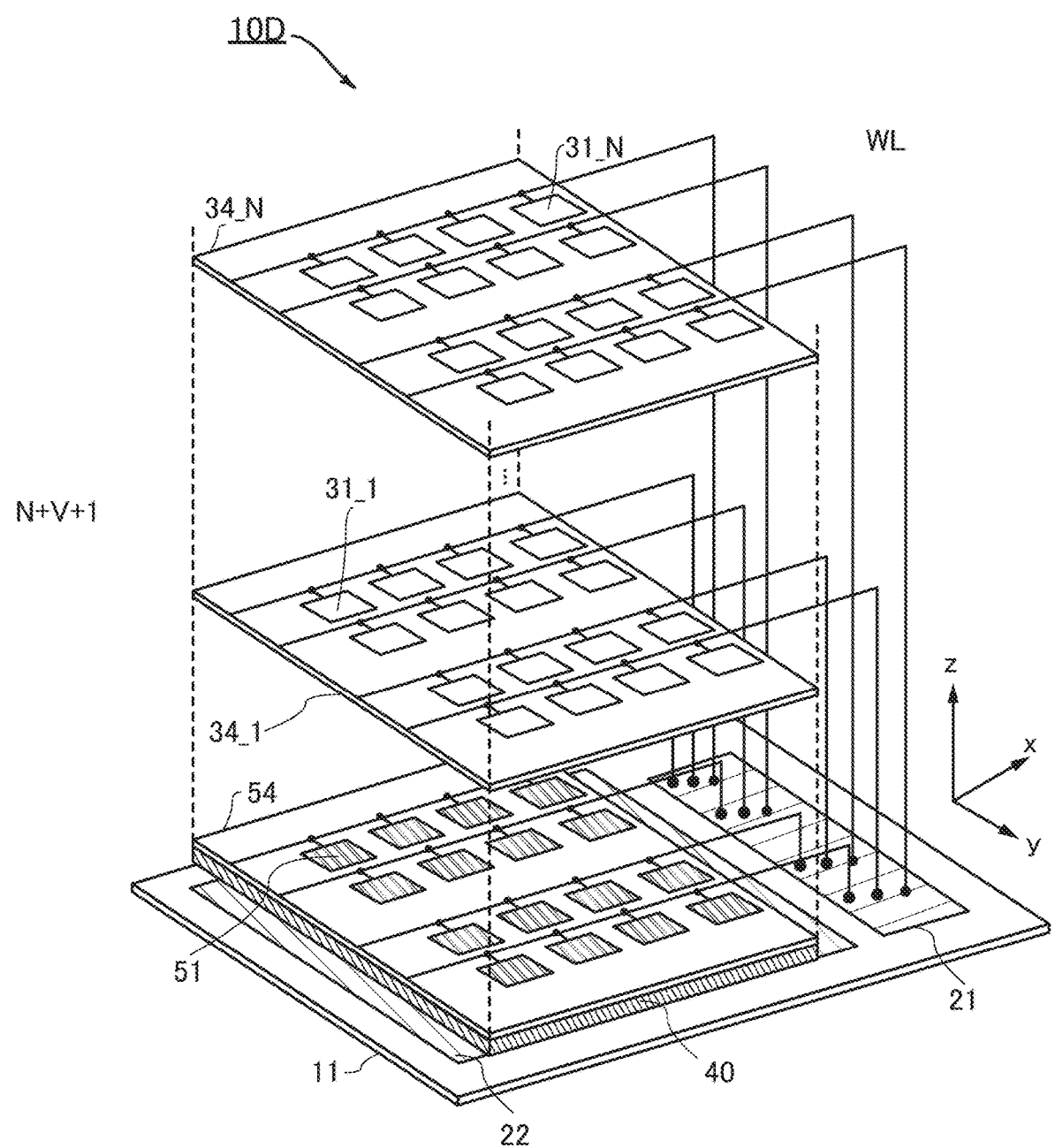
FIG. 15 is a schematic diagram illustrating a structure example of a semiconductor device.

FIG. 14 is a perspective view providing the x-axis, the y-axis, and the z-axis for illustration of the layout of the components of the semiconductor device 10C illustrated in FIG. 12(A). FIG. 15 is a perspective view providing the x-axis, the y-axis, and the z-axis for illustration of the layout of the components of the semiconductor device 10D illustrated in FIG. 13.

The semiconductor device 10C having the structure illustrated in FIG. 14 and the semiconductor device 10D having the structure illustrated in FIG. 15 include V element layers 40 provided with the transistors forming the control circuit, N element layers 34_1 to 34_N, and one element layer 54: (N+V+1) layers in total, which each include OS transistors, are provided to be stacked over the silicon substrate 11. The memory cell 51 included in the element layer 54 includes a region overlapping with the column driver 22 provided over the silicon substrate 11. Note that two or more element layers 54 may be provided. For example, H element layers 54 (H is an integer greater than or equal to 1) may be provided. In the case where the semiconductor device 10C is provided with H element layers 54, (N+V+H) layers in total, which each include OS transistors, are provided in the semiconductor device 10C.

Figure 16:
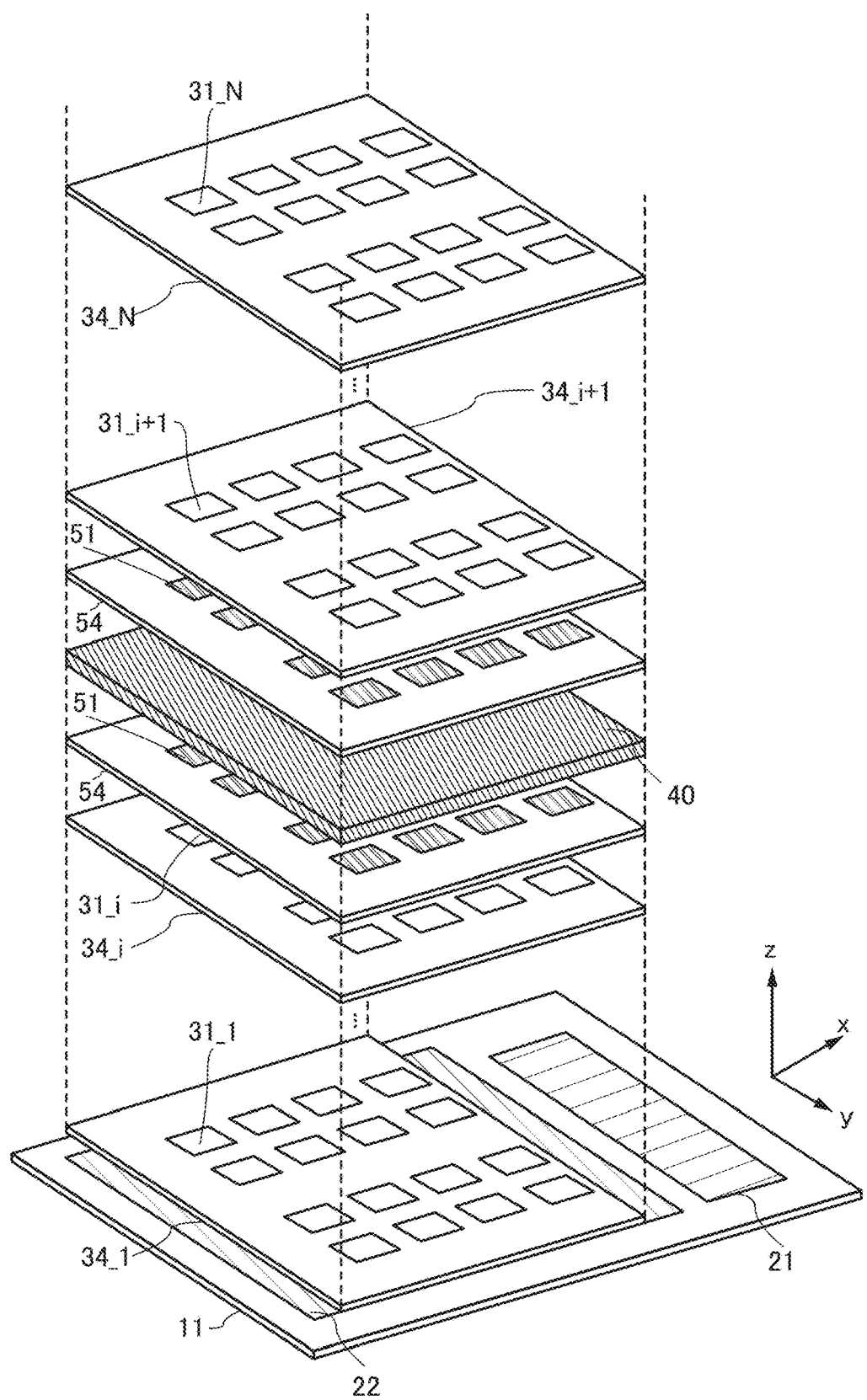
FIG. 16 is a schematic diagram illustrating a structure example of a semiconductor device.

FIG. 16 is a perspective view providing the x-axis, the y-axis, and the z-axis for illustration of a structure example of a semiconductor device 10E. In the semiconductor device TOE, the element layer 40 including the sense amplifier can be provided between the element layer 34_i and the element layer 34_i+1, which can include a DOSRAM. In addition, the element layers 541 which can each include a NOSRAM can be provided between the element layer 34_i and the element layer 40 and between the element layer 40 and the element layer 34_i+1. In other words, the element layer 40 and the element layers 54 can be provided between the two element layers 34. Note that the semiconductor device 10E may be provided with only one element layer 54 or three or more element layers 54.

In one embodiment of the present invention, an OS transistor with an extremely low off-state current is used as the transistor provided in each element layer. Accordingly, the frequency of refresh of data retained in the memory cells can be reduced, so that a semiconductor device with reduced power consumption can be obtained. OS transistors can be provided to be stacked and manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized. Moreover, because an OS transistor has a small variation in electrical characteristics even under a high-temperature environment compared with a Si transistor, the semiconductor device can function as a highly reliable memory device that has a small variation in electrical characteristics of transistors at the time of stacking and integration.

In addition, one embodiment of the present invention is provided with an element layer including the control circuit. The control circuit can function as an amplifier. With this structure, a slight difference in the potential of the bit lines BL is amplified at the time of reading, and the sense amplifier formed using Si transistors can be driven. Since the circuit such as the sense amplifier formed using Si transistors can be downsized, the semiconductor device can be downsized. Moreover, even when the capacitance of the capacitors included in the memory cells are reduced, operation is possible. Furthermore, in one embodiment of the present invention, the length of the bit lines between the memory cell array and the column driver can be reduced by provision of the bit lines extending from the memory cell array in the perpendicular direction. Thus, parasitic capacitance of the bit lines can be significantly reduced and a potential can be read even when the data signals retained in the memory cells are multi-level signals. In one embodiment of the present invention, the data retained in the memory cells can be read as a current; thus, data can be easily read even when the data is multilevel.

Figure 17:
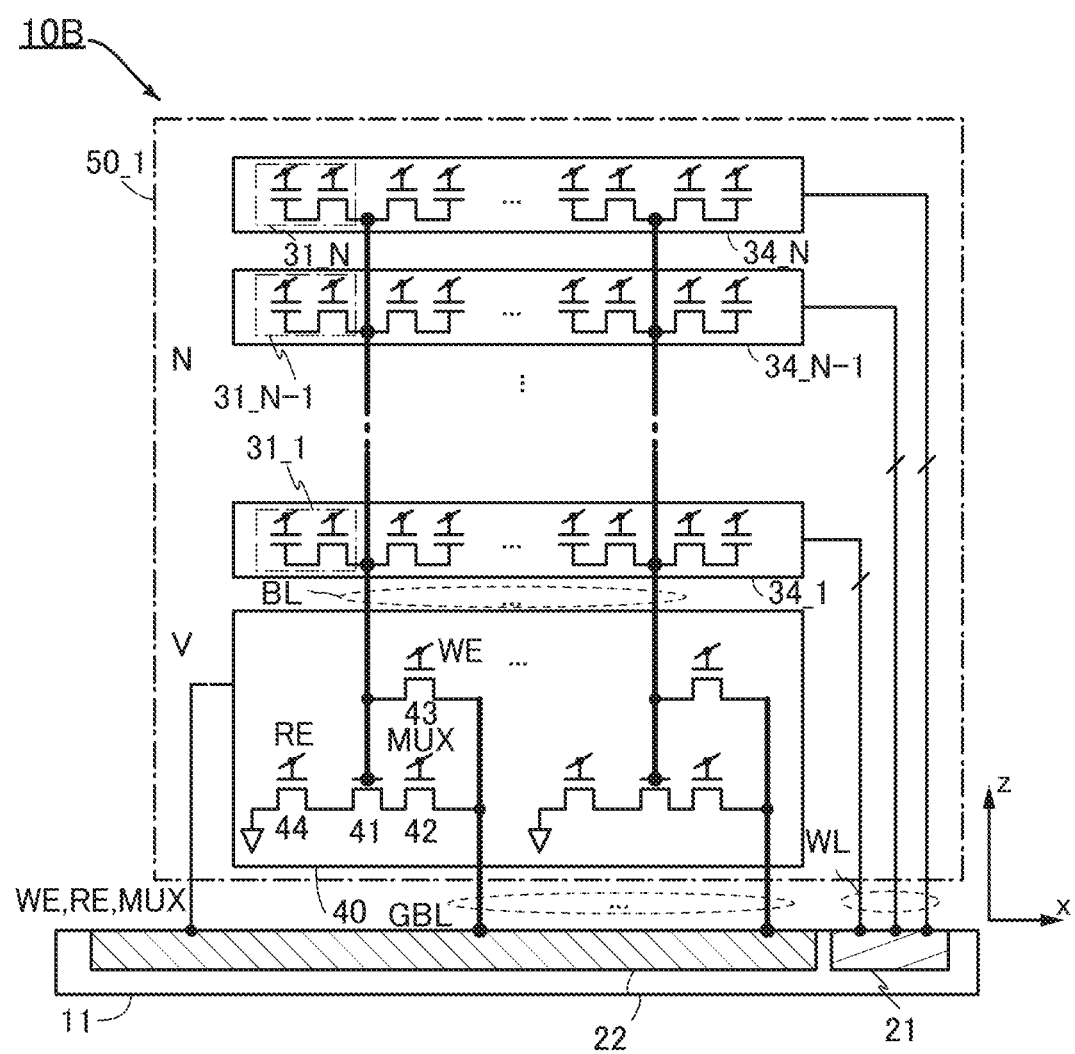
FIG. 17 is a schematic diagram illustrating a structure example of a semiconductor device.

FIG. 17 illustrates a schematic diagram of a cross section that is parallel to the perpendicular direction (z-axis direction) of the semiconductor device 10B described with reference to FIG. 11(A) and FIG. 11(B).

As illustrated in FIG. 17, the semiconductor device 10B can have a structure where the memory cells 31_1 to 31_N provided in the element layers, the element layer 40, and the column driver 22 provided over the silicon substrate 11 are connected to each other with the shortest distance therebetween through the bit line BL and the wiring GBL provided in the perpendicular direction. Although the number of element layers 40 including transistors forming the control circuit is increased, the number of wirings connected to the column driver 22 and provided in the perpendicular direction can be reduced. The reduction of the load on the bit lines BL can shorten writing time and facilitate reading of data.

As illustrated in FIG. 17, transistors 41 to 44 included in the element layer 40 are controlled in accordance with the control signals WE and RE and the selection signal MUX output from the column driver 22. Each of the transistors can output the potential of the bit line BL through the wiring GBL to the column driver 22 in accordance with the control signals and the selection signal. Note that the semiconductor device 10B illustrated in FIG. 17 can be expressed as the unit 50_1.

Next, specific structure examples of the circuit functioning as the sense amplifier formed using OS transistors included in the element layer 40 are described with reference to FIGS. 18(A) and 18(B) and FIGS. 19(A) and 19(B).

Figure 18A:
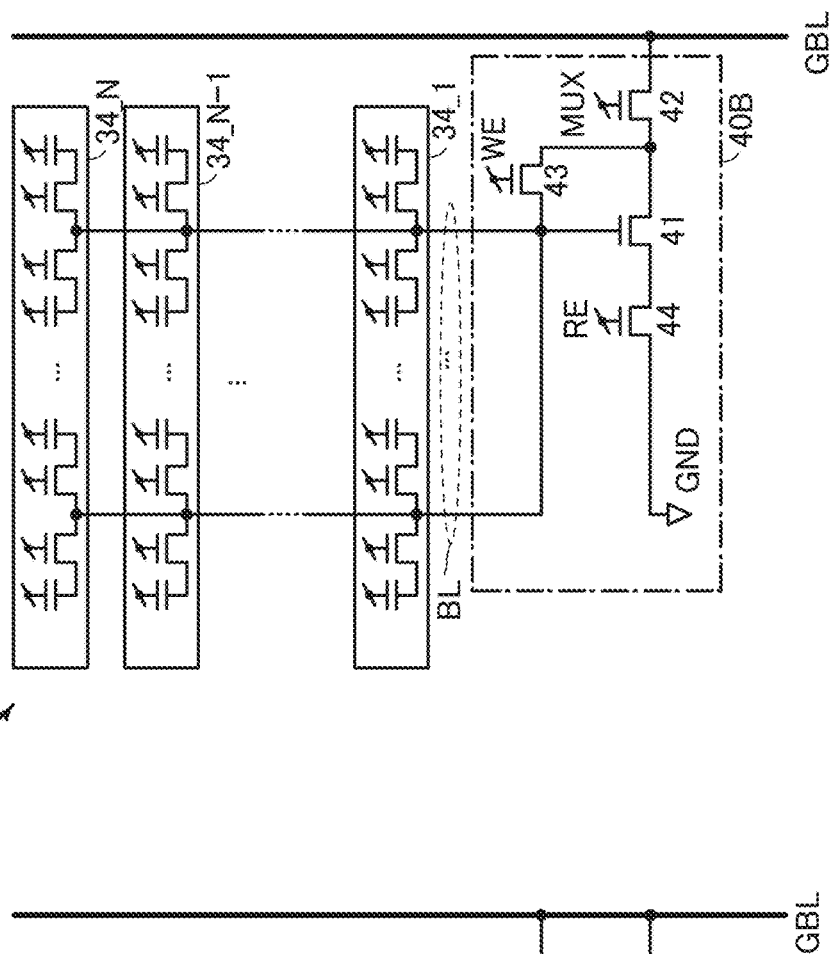
FIG. 18 are (A) a circuit diagram and (B) a circuit diagram illustrating structure examples of a semiconductor device.

FIG. 18(A) illustrates the unit 50 corresponding to the unit 50_1 illustrated in FIG. 17. In the unit 50 illustrated in FIG. 19(A), an element layer 40A includes the transistors 41 to 44. The transistors 41 to 44 can each be an OS transistor; n-channel transistors are illustrated.

The transistor 41 is a transistor forming a source follower for amplifying the potential of the wiring GBL to a potential corresponding to the potential of the bit line BL in a period when the data signals are read from the memory cells. The transistor 42 is a transistor functioning as a switch which controls on/off between the source and the drain in accordance with the selection signal MUX input to the gate. The transistor 43 is a transistor functioning as a switch which controls on/off between the source and the drain in accordance with the write control signal WE input to the gate. The transistor 44 is a transistor functioning as a switch which controls on/off between the source and the drain in accordance with the read control signal RE input to the gate. Note that a ground potential GND, which is a fixed potential, is supplied to the source side of the transistor 44.

Figure 18B:
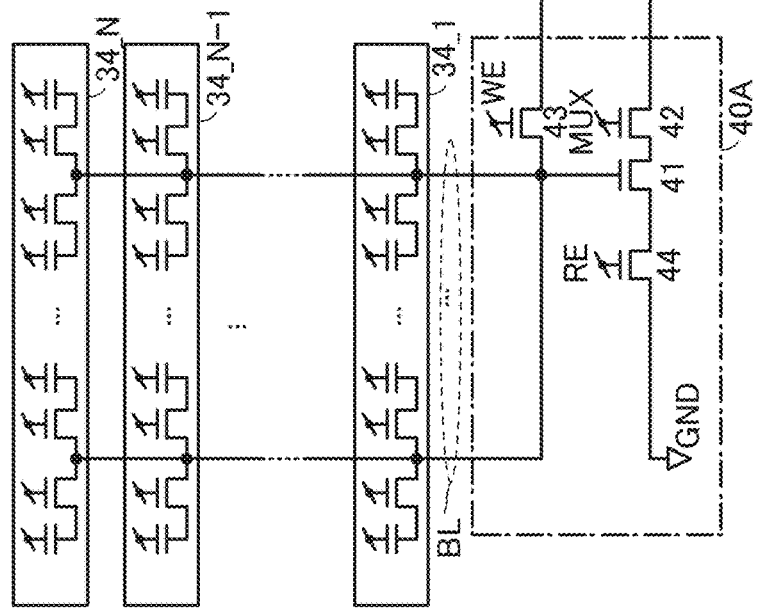
Figure 19B:
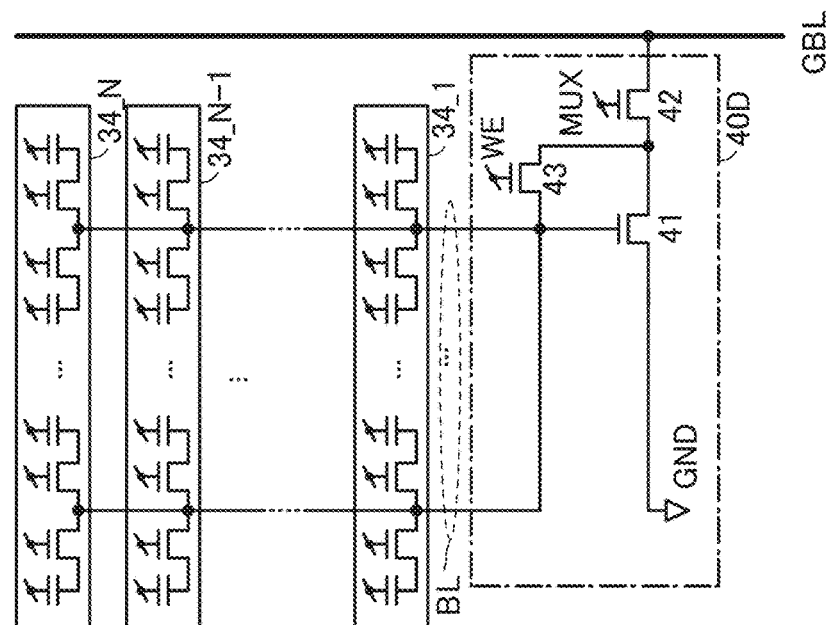
FIG. 19 are (A) a circuit diagram and (B) a circuit diagram illustrating structure examples of a semiconductor device.
Figure 19A:
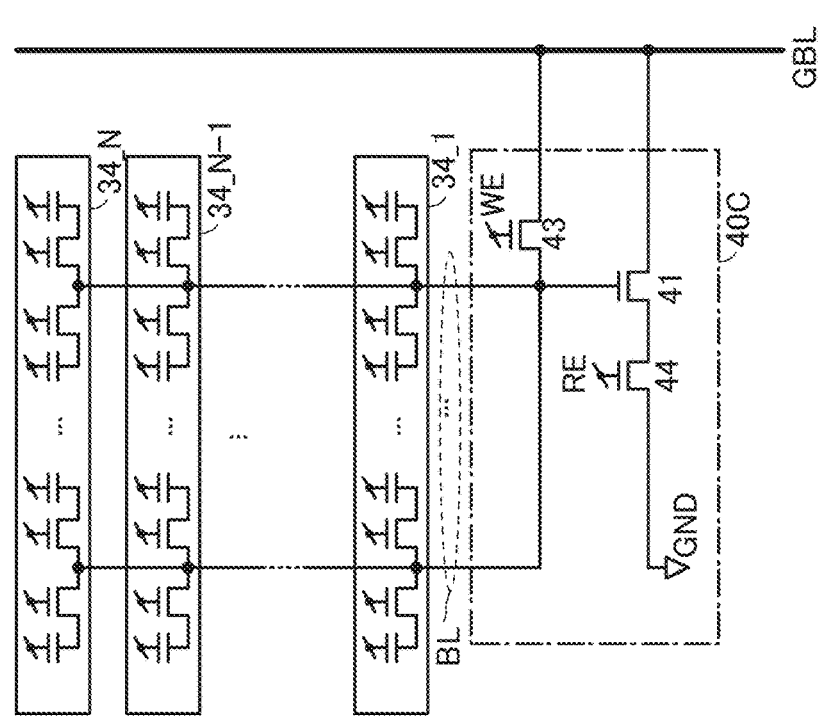

Note that modification examples illustrated in FIG. 18(B) and FIGS. 19(A) and 19(B) can be applied to the structure of the element layer 40A illustrated in FIG. 18(A). An element layer 40B in FIG. 18(B) has a structure where one of the source and the drain of the transistor 43 is connected to not the wiring GBL but one of the source and the drain of the transistor 41. An element layer 40C in FIG. 19(A) corresponds to a structure where the function of the transistor 42 is performed by the column driver 22 and thus the transistor 42 is omitted. An element layer 40D in FIG. 19(B) corresponds to a structure where the transistor 44 is omitted.

Figure 20:
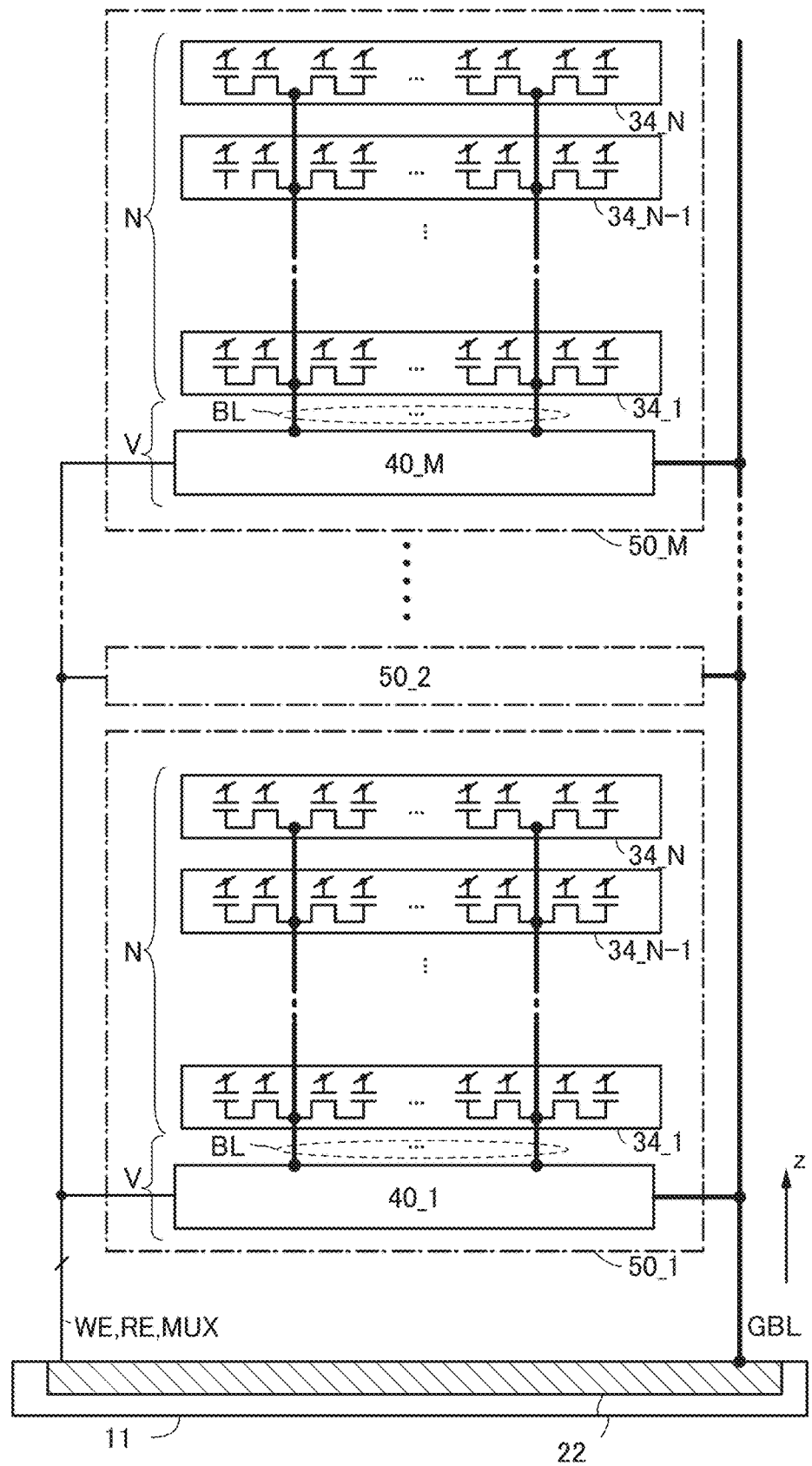
FIG. 20 is a circuit diagram illustrating a structure example of a semiconductor device.

FIG. 20 is a schematic diagram of a structure where the units 50_1 illustrated in FIG. 17 are stacked. As illustrated in FIG. 17, the semiconductor device 10B illustrated in FIG. 20 includes the memory cells 31_1 to 31_N provided in the element layers. The semiconductor device 10B illustrated in FIG. 20 has a structure where the memory cells 31_1 to 31_N and element layers 40_1 to 40_M are connected to each other with the shortest distance therebetween through the bit lines BL provided in the perpendicular direction, and the element layers 40 are connected to the column driver 22 through the wiring GBL.

Note that M tiers of units 50_1 to 50_M in the semiconductor device 10B illustrated in FIG. 18 can be provided to be stacked in the perpendicular direction. As illustrated in FIG. 18, the semiconductor device 10B includes, in the units 50_1 to 50_M, the element layers 40_1 to 40_M each provided with the circuit functioning as the sense amplifier formed using OS transistors. In other words, the structure of the semiconductor device 10B illustrated in FIG. 20 is a structure in which M×(N+V) layers in total of element layers illustrated in FIG. 17 are stacked.

Figure 21:
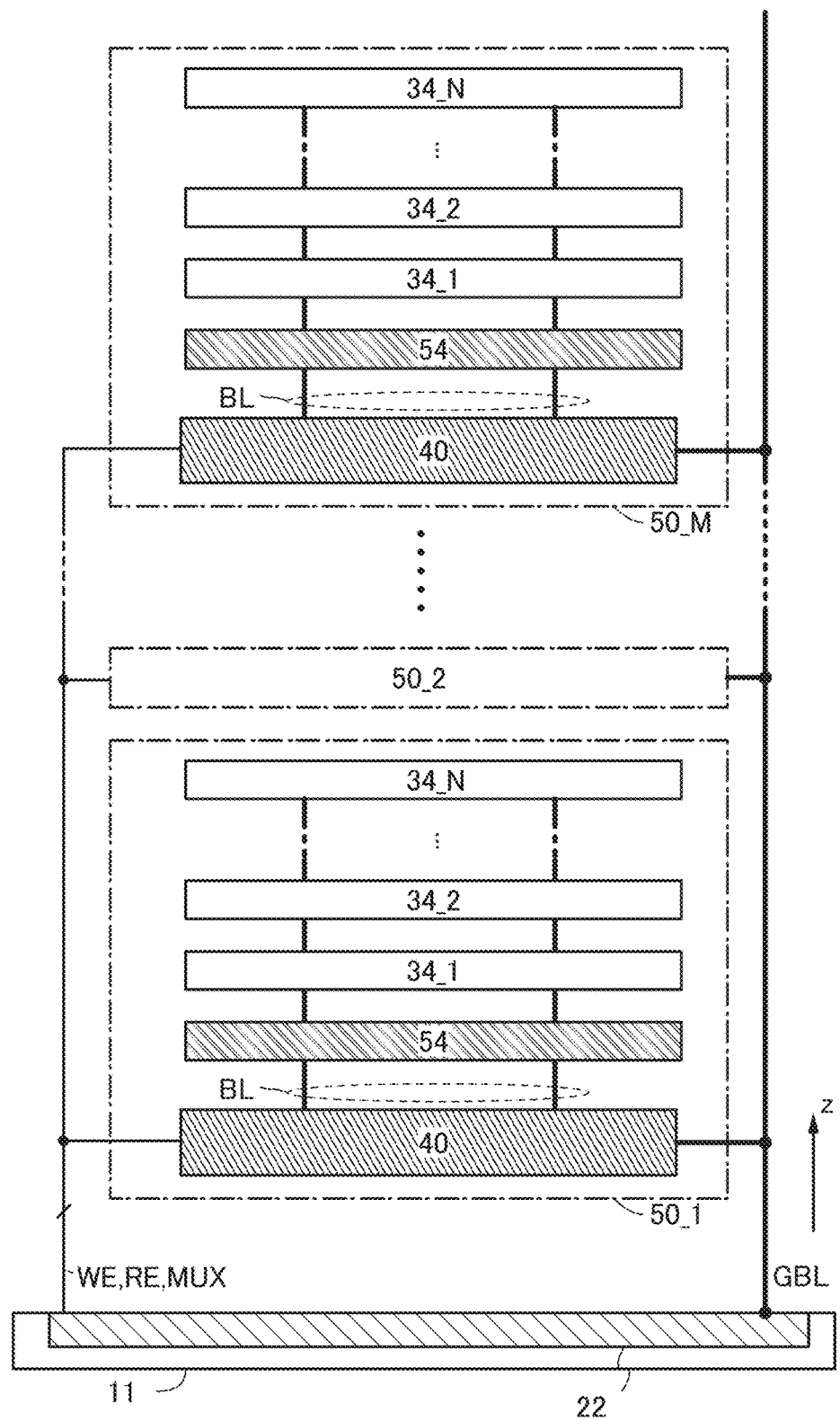
FIG. 21 is a circuit diagram illustrating a structure example of a semiconductor device.

FIG. 21 illustrates a schematic diagram of a structure in which the semiconductor device 10D illustrated in FIG. 14 is used as the units 50. In each of the unit 50_1 to the unit 50_M, the element layer 40, the element layer 54, and the element layer 34_1 to the element layer 34_N are provided to be stacked in the perpendicular direction. Note that the semiconductor device 10C and the semiconductor device TOE may also be used as the units 50.

In one embodiment of the present invention, an OS transistor with an extremely low off-state current is used as the transistor provided in each element layer. Accordingly, the frequency of refresh of data retained in the memory cells can be reduced, so that a semiconductor device with reduced power consumption can be obtained. OS transistors can be provided to be stacked and manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized. Moreover, because an OS transistor has a small variation in electrical characteristics even under a high-temperature environment compared with a Si transistor, the semiconductor device can function as a highly reliable memory device that has a small variation in electrical characteristics of transistors at the time of stacking and integration.

In addition, one embodiment of the present invention is provided with an element layer including the control circuit. In the control circuit, the bit line BL is connected to the gate of the transistor 41; therefore, the transistor 41 can function as an amplifier. With this structure, a slight difference in the potential of the bit line BL is amplified at the time of reading, and the sense amplifier formed using Si transistors can be driven. Since the circuit such as the sense amplifier formed using Si transistors can be downsized, the semiconductor device can be downsized. Moreover, even when the capacitance of the capacitors included in the memory cells are reduced, operation is possible.

Figure 22:
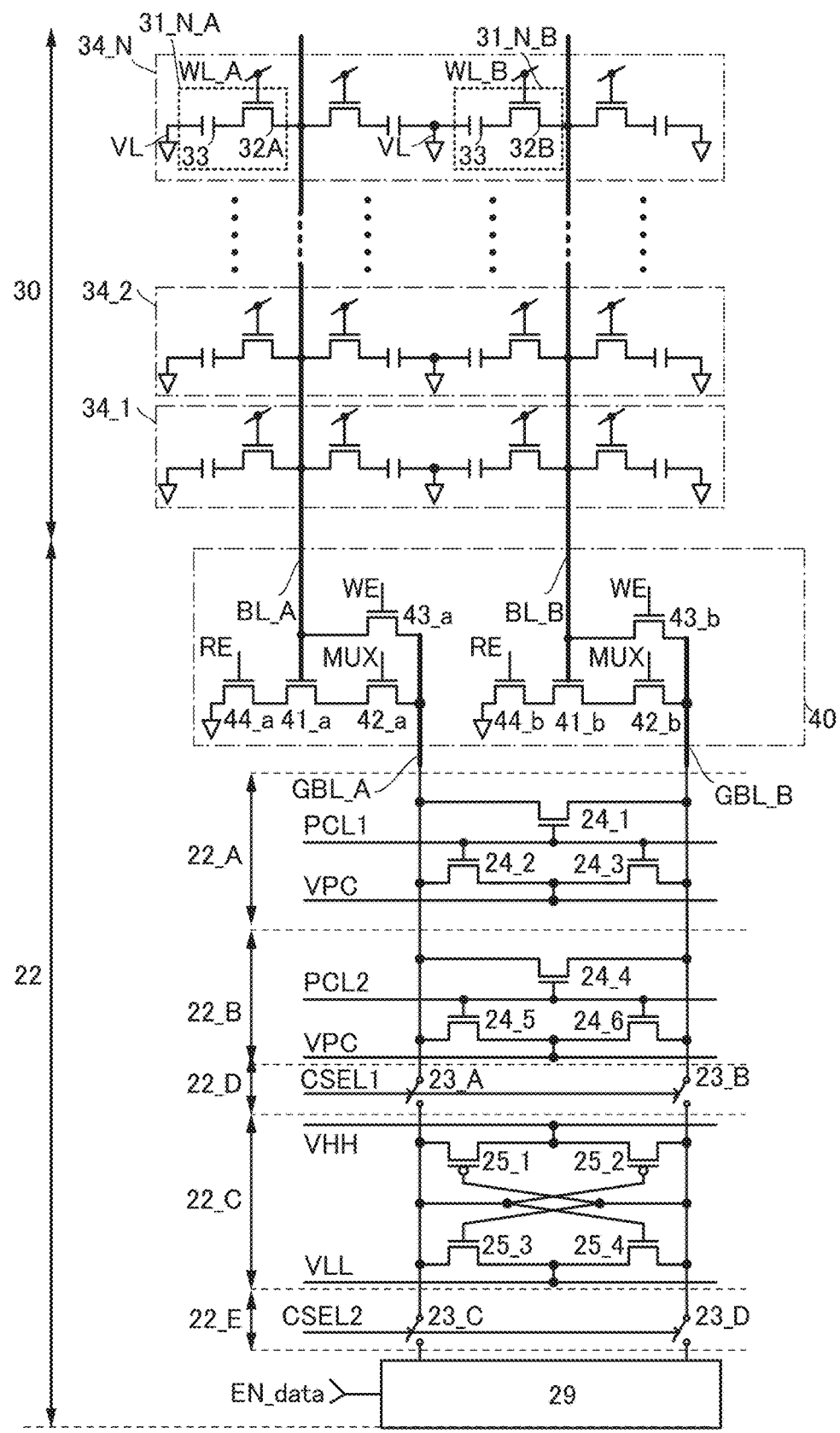
FIG. 22 is a circuit diagram illustrating a structure example of a semiconductor device.

FIG. 22 illustrates, in addition to the element layers 34_1 to 34_N illustrated in FIG. 17, which function as the memory cell array 30, the element layer 40 including transistors 41_a, 41_b, 42_a, 42_b, 43_a, 43_b, 44_a, and 44_b. Over the element layer 40 including the transistors 41_a, 41_b, 42_a, 42_b, 43_a, 43_b, 44_a, and 44_b illustrated in FIG. 22, the element layers 34_1 to 34_N are provided, and the bit lines BL_A and BL_B are provided in the perpendicular direction. That is, the element layer including the switching circuit, which forms part of a peripheral circuit, can be provided to be stacked in a manner similar to that of the element layers 34_1 to 34_N. The bit lines BL_A and BL_B are connected to gates of the transistors 41_a and 41_b.

Furthermore, in FIG. 22, the transistor 42_a, 42_b, 43_a, and 43_b included in the element layer 40 are connected to wirings GBL_A and GBL_B. The wirings GBL_A and GBL_B are provided in the perpendicular direction in a manner similar to that of the bit lines BL_A and BL_B and connected to the transistors included in the column driver 22. The control signals WE, RE, and MUX are supplied to gates of the transistors 42_a, 42_b, 43_a, 43_b, 44_a, and 44_b included in the element layer 40.

In FIG. 22, a precharge circuit 22_A, a precharge circuit 22_B, a sense amplifier 22_C, a switch circuit 22_D, a switch circuit 22_E, and the write read circuit 29 which are positioned on the silicon substrate side are illustrated as the circuits included in the column driver 22. As the transistors forming the precharge circuit 22_A, the precharge circuit 22_B, and the sense amplifier 22_C, Si transistors are used. Also as switches 23_A to 23_D forming the switch circuit 22_D and the switch circuit 22_E, Si transistors can be used. Either sources or drains of the transistors 42_a, 42_b, 43_a, and 43_b are connected to the transistors forming the precharge circuit 22_A, the precharge circuit 22_B, the sense amplifier 22_C, and the switch circuit 22_D.

The precharge circuit 22_A is formed using n-channel transistors 24_1 to 24_3. The precharge circuit 22_A is a circuit for precharging the bit line BL_A and the bit line BL_B with the intermediate potential VPC corresponding to the potential VDD/2, which is between VDD and VSS, depending on a precharge signal supplied to a precharge line PCL1.

The precharge circuit 22_B is formed using n-channel transistors 24_4 to 24_6. The precharge circuit 22_B is a circuit for precharging the wiring GBL_A and the wiring GBL_B with the intermediate potential VPC corresponding to a potential VDD/2, which is between VDD and VSS, depending on a precharge signal supplied to a precharge line PCL2.

The sense amplifier 22_C is formed using p-channel transistors 25_1 and 25_2 and n-channel transistors 25_3 and 25_4, which are connected to the wiring VHH or the wiring VLL. The wiring VHH or the wiring VLL is a wiring having a function of supplying VDD or VSS. The transistors 25_1 to 25_4 are transistors that form an inverter loop. The sense amplifier 22_C sets the potentials of the wiring GBL_A and the wiring GBL_B to a high power supply potential VDD or a low power supply potential VSS in accordance with the potentials of the bit line BL_A and the bit line BL_B, which are changed by selection of the memory cells 31_N_A and 31_N_B under conditions where the word lines WL_A and WL_B are at high levels. The potentials of the wiring GBL_A and the wiring GBL_B can be output to the outside through the switch circuit 22_D, the switch circuit 22_E, and a write/read circuit 25. The bit line BL_A and the bit line BL_B correspond to a bit line pair, and the wiring GBL_A and the wiring GBL_B correspond to a bit line pair. Data signal writing of the write/read circuit 25 is controlled in accordance with a signal EN_data.

The switch circuit 22_D is a circuit for controlling the conduction state between the sense amplifier 22_C and the wirings GBL_A and GBL_B. The switch circuit 22_D switches between on and off under the control of a switch signal CSEL1. In the case where the switches 23_A and 23_B are n-channel transistors, the switches 23_A and 23_B are on when the level of the switch signal CSEL1 is high and are off when the level of the switch signal CSEL1 is low. The switch circuit 22_E is a circuit for controlling the conduction state between the write read circuit 29 and the bit line pair connected to the sense amplifier 22_C. The switch circuit 22_D switches between on and off under the control of the switch signal CSEL1. The switches 23_C and 23_D may switch between on and off under the control of CSEL2 in a manner similar to that of the switches 23_A and 23_B.

Figure 23:
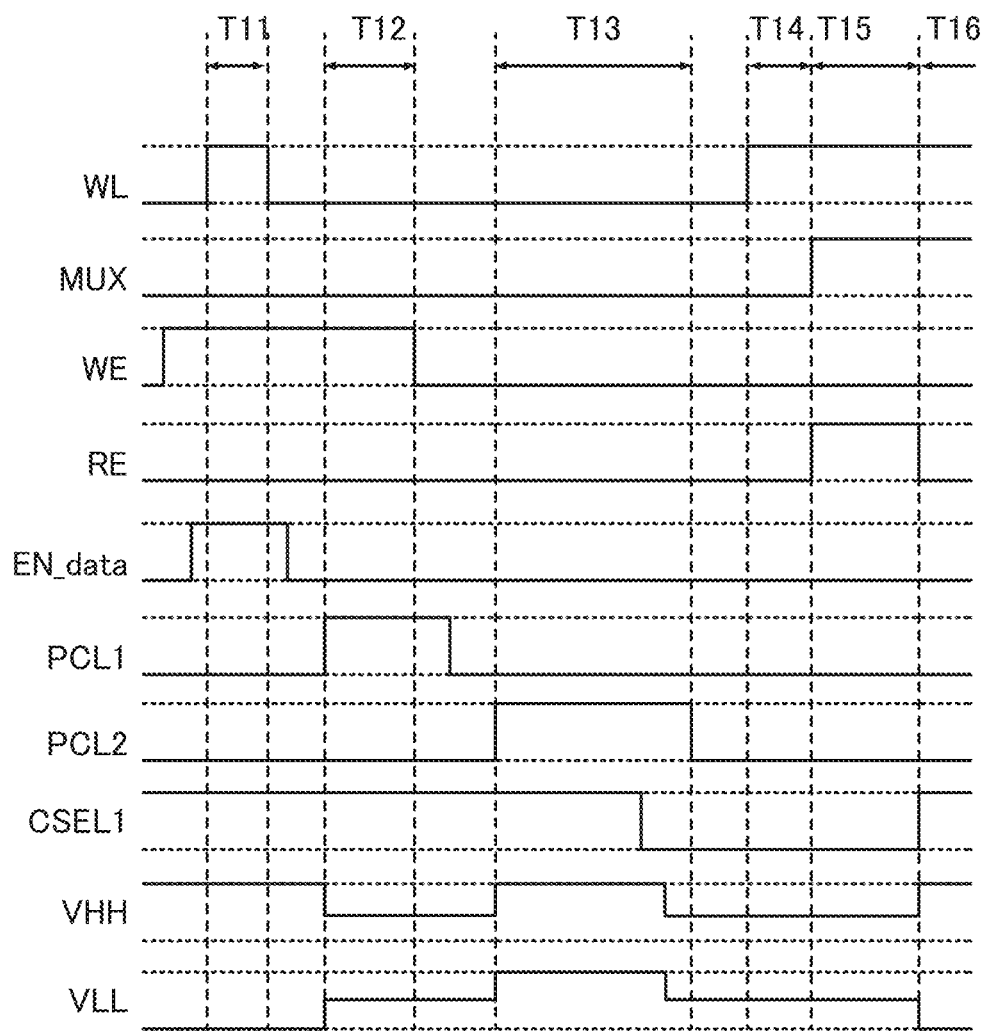
FIG. 23 is a timing chart illustrating a structure example of a semiconductor device.

Furthermore, FIG. 23 is a timing chart for describing an operation of the circuit diagram illustrated in FIG. 22. In the timing chart illustrated in FIG. 23, a period T11 corresponds to a period for describing a writing operation, a period T12 corresponds to a period for describing a precharge operation of the bit line BL, a period T13 corresponds to a period for describing a precharge operation of the wiring GBL, a period T14 corresponds to a period for describing a charge sharing operation, a period T15 corresponds to a period for describing a standby operation for reading, and a period T16 corresponds to a period for describing a reading operation.

In the period T11, a word line connected to the gate of the transistor included in the memory cell to which the data signal is to be written is set to the high level. At this time, the control signal WE and the signal EN_data are set to the high level to write the data signal to the memory cell through the wiring GBL and the bit line BL.

In the period T12, in order to precharge the bit line BL, the precharge line PCL1 is set to the high level in a state where the control signal WE is at the high level. The bit line BL is precharged with a precharge potential. In the period T12, the wiring VHH and the wiring VLL, through which power supply voltages are supplied to the sense amplifier 22_C, are both preferably set to VDD/2 in order to suppress power consumption due to a flow-through current.

In the period T13, in order to precharge the wiring GBL, the precharge line PCL2 is set to the high level. The wiring GBL is precharged with a precharge potential. In the period T13, the wiring VHH and the wiring VLL are both set to VDD, whereby the wiring GBL having a large load can be precharged in a short time.

In the period T14, in order to cause charge sharing for balancing electric charge with which the bit line BL and the wiring GBL are precharged, the control signal WL and the control signal MUX are set to the high level. The bit line BL and the wiring GBL come to have an equal potential. In the period T14, the wiring VHH and the wiring VLL, through which power supply voltages are supplied to the sense amplifier 22_C, are both preferably set to VDD/2 in order to suppress power consumption due to a flow-through current.

In the period T15, the control signal RE is set to the high level. The period T15 is a period when a current flows through the transistor 41 in accordance with the potential of the bit line BL and the potential of the wiring GBL varies in accordance with the current amount. The switch signal CSEL1 is at the low level so that the variation in the potential of the wiring GBL is not influenced by the sense amplifier 22_C. The wiring VHH and the wiring VLL are at the same levels as those in the period T14.

In the period T16, the switch signal CSEL1 is set to the high level and the variation in the potential of the wiring GBL is amplified by the bit line pair connected to the sense amplifier 22_C; thus, the data signal written to the memory cell is read.

Figure 24:
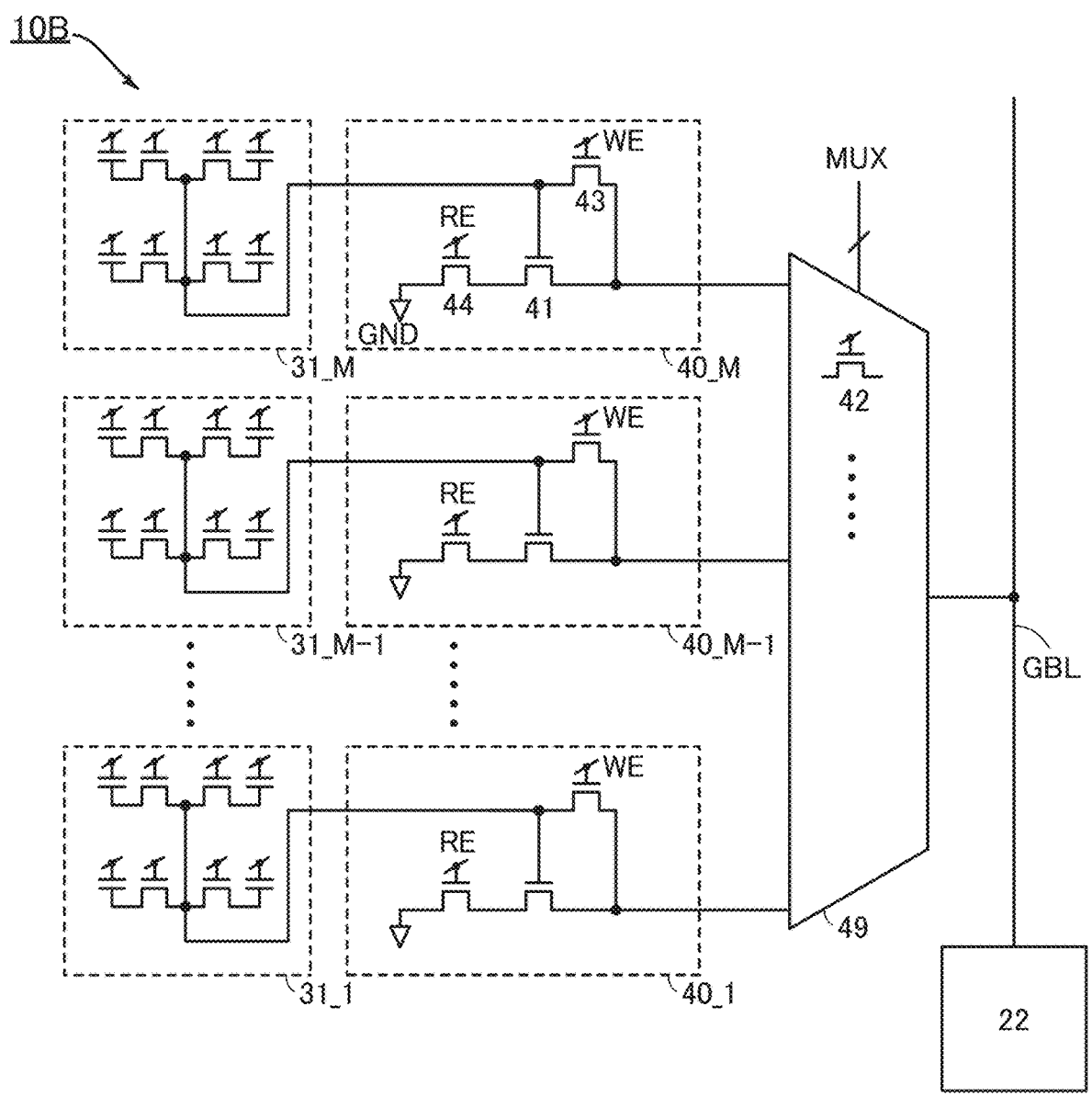
FIG. 24 is a circuit diagram illustrating a structure example of a semiconductor device.

Note that in the case where the structure of the semiconductor device 10B illustrated in FIG. 17 employs the circuit structure of the element layer 40B illustrated in FIG. 18(B), the structure of the semiconductor device 10B can also be illustrated by the circuit diagram of FIG. 24. In FIG. 24, the transistors 42 of the element layers 40_1 to 40_M included in the units are taken out and a switching circuit 49 formed of the transistors 42 is illustrated. In other words, any one of the memory cells 31_1 to 31_M is selected by any one of the element layers 40_1 to 40_M selected by the switching circuit 49, and the element layers 40_1 to 40_M can write or read a data signal.

In the semiconductor device of one embodiment of the present invention, an OS transistor with an extremely low off-state current is used as the transistor provided in each element layer. OS transistors can be provided to be stacked over a silicon substrate where Si transistors are provided. Therefore, OS transistors can be manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized.

In addition, one embodiment of the present invention is provided with an element layer including the control circuit. In the control circuit, the bit line BL is connected to the gate of the transistor 41; therefore, the transistor 41 can function as an amplifier. With this structure, a slight difference in the potential of the bit line BL is amplified at the time of reading, and the sense amplifier formed using Si transistors can be driven. Since the circuit such as the sense amplifier formed using Si transistors can be downsized, the semiconductor device can be downsized. Moreover, even when the capacitance of the capacitors included in the memory cells are reduced, operation is possible.

Embodiment 4

Structure examples of a semiconductor device of one embodiment of the present invention and an operation method of the semiconductor device are described with reference to FIG. 25 to FIG. 29. The description in Embodiment 1 is applied to the components denoted by the same reference numerals as the components in Embodiment 1, and the description of such components might be omitted.

Figure 25A:
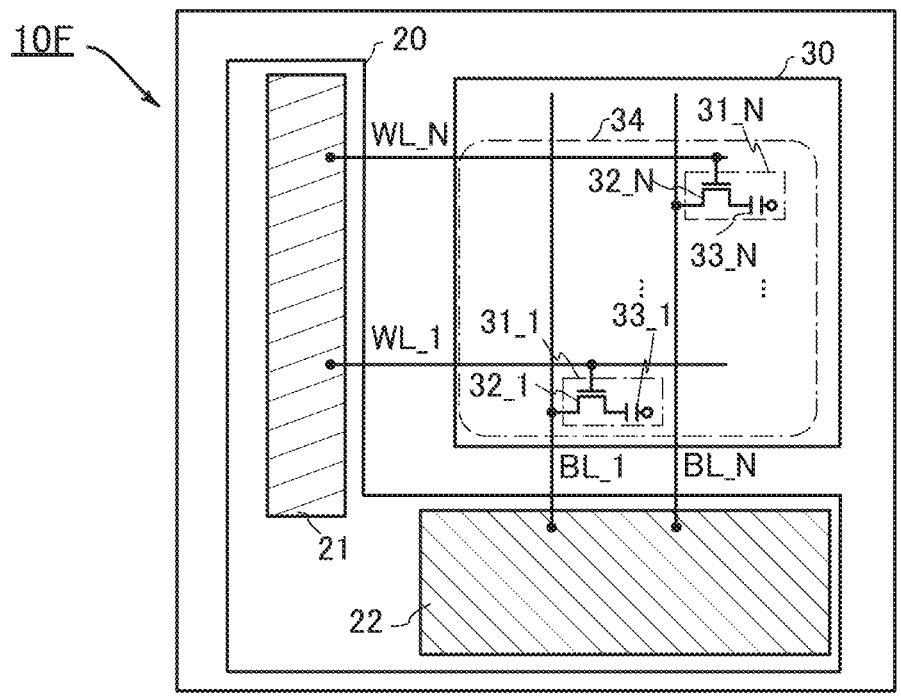
FIG. 25 are (A) a block diagram and (B) a schematic diagram illustrating a structure example of a semiconductor device.

FIG. 25(A) is a block diagram of the semiconductor device described in this embodiment. A semiconductor device 10F illustrated in FIG. 1(A) includes the peripheral circuit 20 and the memory cell array 30.

The memory cell array 30 includes a plurality of element layers 34 or a single element layer 34. The element layer 34 includes one or more memory cells 31_1 to 31_N (N is a natural number greater than or equal to 2). The memory cell 31_1 includes the transistor 32_1 and the capacitor 33_1. The memory cell 31_N includes the transistor 32_N and the capacitor 33_N. Note that a capacitor is sometimes referred to as a capacitive element. Note that an element layer is a layer provided with elements such as a capacitor and a transistor and is formed using members such as a conductor, a semiconductor, and an insulator.

Out of the components described with reference to FIG. 25(A), the element layer 34 in one embodiment of the present invention is described with reference to a schematic diagram illustrated in FIG. 25 (B). The schematic diagram illustrated in FIG. 25(B) corresponds to a perspective view providing the x-axis, the y-axis, and the z-axis for illustration of the layout of the components described with reference to FIG. 25(A).

Figure 25B:
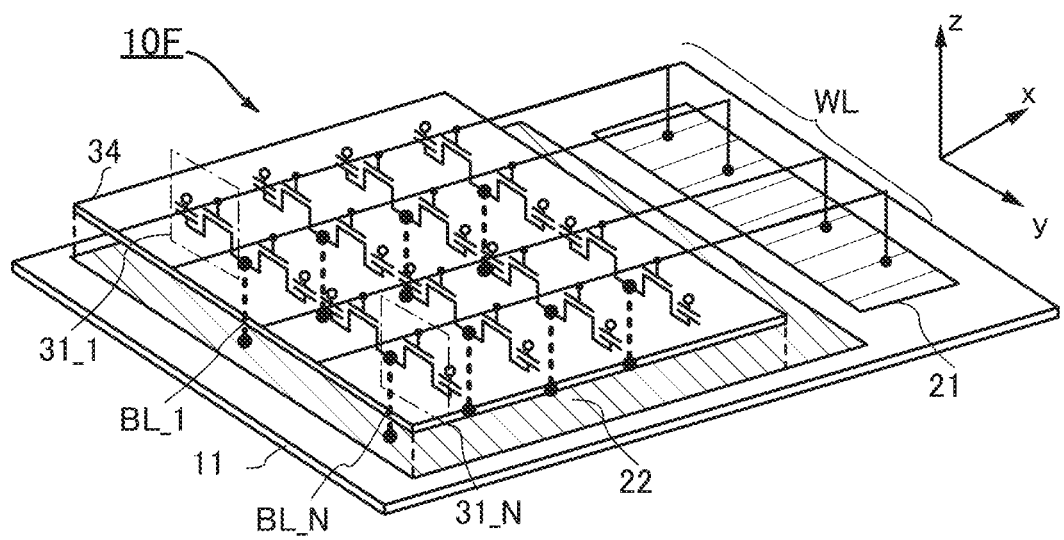

As illustrated in FIG. 25(B), the element layer 34 including the memory cells 31_1 to 31_N includes a region overlapping with the column driver 22 provided over the silicon substrate 11.

The transistor of the memory cell 31_1 included in the element layer 34 is connected to the column driver 22 through the bit line BL_1 provided in the perpendicular direction. The transistor of the memory cell 31_N included in the element layer 34 is connected to the column driver 22 through the bit line BL_N provided in the perpendicular direction. The bit lines BL_1 and BL_N and the other bit lines BL are connected to the column driver 22 provided over the silicon substrate 11.

In one embodiment of the present invention, an OS transistor with an extremely low off-state current is used as the transistor provided in each element layer. Accordingly, the frequency of refresh of data retained in the memory cells can be reduced, so that a semiconductor device with reduced power consumption can be obtained. OS transistors can be provided to be stacked and manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized. Moreover, because an OS transistor has a small variation in electrical characteristics even under a high-temperature environment compared with a Si transistor, the semiconductor device can function as a highly reliable memory device that has a small variation in electrical characteristics of transistors at the time of stacking and integration. Furthermore, in one embodiment of the present invention, the length of the bit lines between the memory cell array and the column driver can be reduced by provision of the bit lines extending from the memory cell array in the perpendicular direction. Thus, parasitic capacitance of the bit lines can be significantly reduced and a potential can be read even when the data signals retained in the memory cells are multi-level signals.

Figure 26:
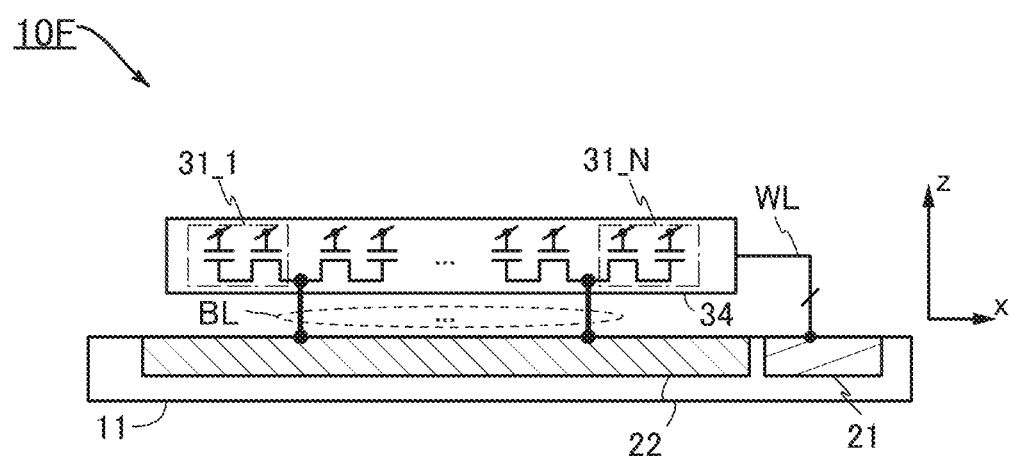
FIG. 26 is a schematic diagram illustrating a structure example of a semiconductor device.

FIG. 26 illustrates a schematic diagram of a cross section that is parallel to the perpendicular direction (z-axis direction) of the semiconductor device 10F described with reference to FIG. 25(A) and FIG. 25(B).

As illustrated in FIG. 26, the semiconductor device 10F can have a structure where the memory cells 31_1 to 31_N provided in the element layer 34 and the column driver 22 provided over the silicon substrate 11 are connected to each other with the shortest distance therebetween through the bit line BL provided in the perpendicular direction. The number of bit lines is increased as compared with a structure where the bit lines are provided in a plane direction. However, the number of memory cells connected to a bit line can be reduced and accordingly parasitic capacitance of the bit line can be reduced. Therefore, even when the capacitance of the capacitors included in the memory cells is reduced, the potential of the bit line that accompanies movement of electric charge can be varied.

Since the capacitance of the capacitors 33_1 to 33_N included in the memory cells 31_1 to 31_N can be reduced, the capacitors 33_1 to 33_N can be provided in the same layer as the transistors 32_1 to 32_N. With the structure where the capacitors 33_1 to 33_N are provided in the same layer as the transistors 32_1 to 32_N, thinning of each of the element layers 34_1 to 34_N is possible. Therefore, the semiconductor device 10F can be downsized.

Figure 27A:
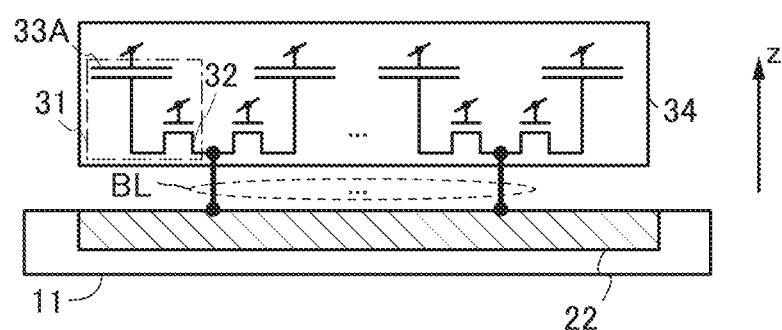
FIG. 27 are (A) a schematic diagram and (B) a schematic diagram illustrating structure examples of a semiconductor device.

Note that other than the structure where the capacitors 33_1 to 33_N included in the memory cells 31_1 to 31_N are provided in the same layer as the transistors 32_1 to 32_N, other structures may also be employed. For example, the schematic diagram illustrated in FIG. 27(A) represents a structure where the capacitors 33A of the memory cells 31 included in the element layers 341 to 34_N are provided above the transistors 32 in the perpendicular direction. With this structure, capacitance can be increased; accordingly, the reliability of the read data and the data retention time can be improved. In addition, the electrodes of the capacitors 33A whose one electrode is connected to a fixed potential can be provided above the transistors 32 in the structure of FIG. 27(A), which can suppress the influence of noise from the outside.

Figure 27B:
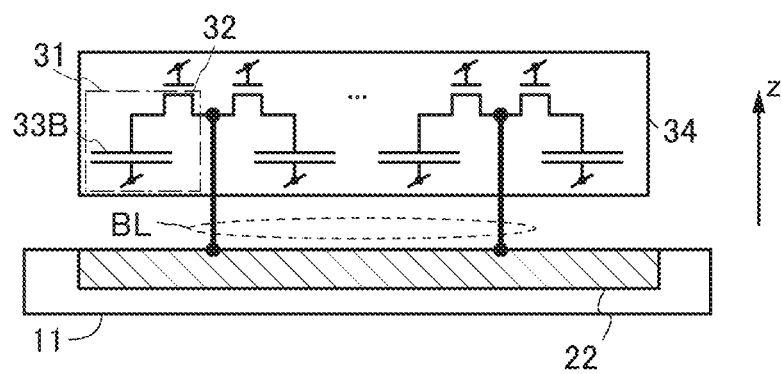

Furthermore, the schematic diagram illustrated in FIG. 27(B) represents a structure where capacitors 33B of the memory cells 31 included in the element layers 34_1 to 34_N are provided below the transistors 32 in the perpendicular direction. With this structure, capacitance can be increased; accordingly, the reliability of the read data and the data retention time can be improved. In addition, the electrodes of the capacitors 33B whose one electrode is connected to a fixed potential can be provided between the transistors 32 and the column driver 22 in the structure of FIG. 27(B), which can suppress the influence of noise of the column driver 22 on the memory cells 31.

Figure 28:
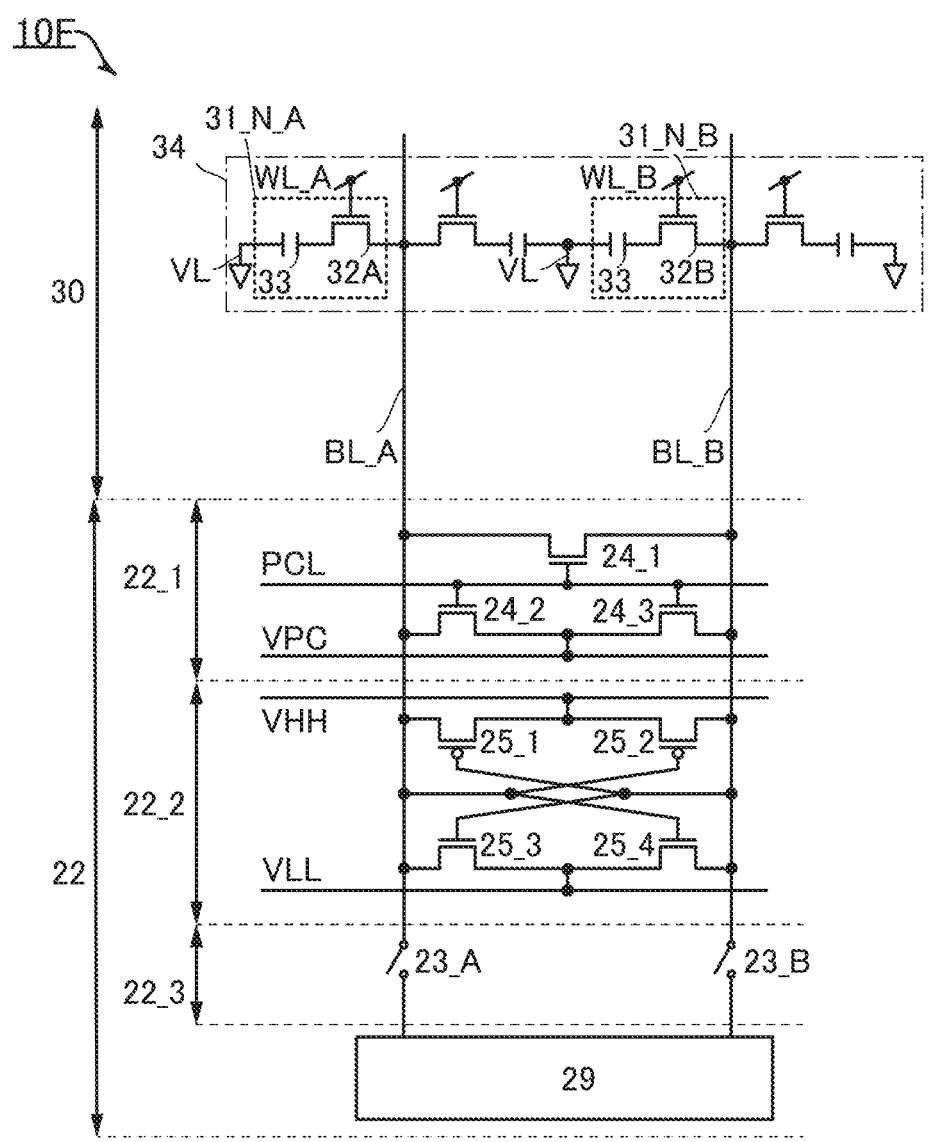
FIG. 28 is a circuit diagram illustrating a structure example of a semiconductor device.

FIG. 28 is a circuit diagram illustrating the circuit structure example of the memory cell array 30 including the element layer 34, which is described with reference to FIG. 25(A), and a specific circuit structure example of the column driver 22 connected to the memory cells, which is described with reference to FIG. 25(A).

FIG. 28 illustrates the element layer 34 as the memory cell array 30. In FIG. 28, the memory cell 31_N_A is included as the memory cell connected to the bit line BL_A. The memory cell 31_N_A which includes the transistor 32A whose gate is connected to the word line WL_A and the capacitor 33 is illustrated. In addition, in FIG. 28, the memory cell 31_N_B is included as the memory cell connected to the bit line BL_B. The memory cell 31_N_B which includes the transistor 32B whose gate is connected to the word line WL_B and the capacitor 33 is illustrated. The capacitors 33 in each element layer are connected to the wiring VL to which a fixed potential, e.g., a ground potential, is supplied.

In addition, FIG. 28 illustrates the precharge circuit 22_1, the sense amplifier 22_2, the switch circuit 22_3, and the write read circuit 29 on the silicon substrate side, as circuits included in the column driver 22. As transistors forming the precharge circuit 22_1 and the sense amplifier 222, Si transistors are used. Si transistors can also be used in the selection switch 22_3.

Figure 29:
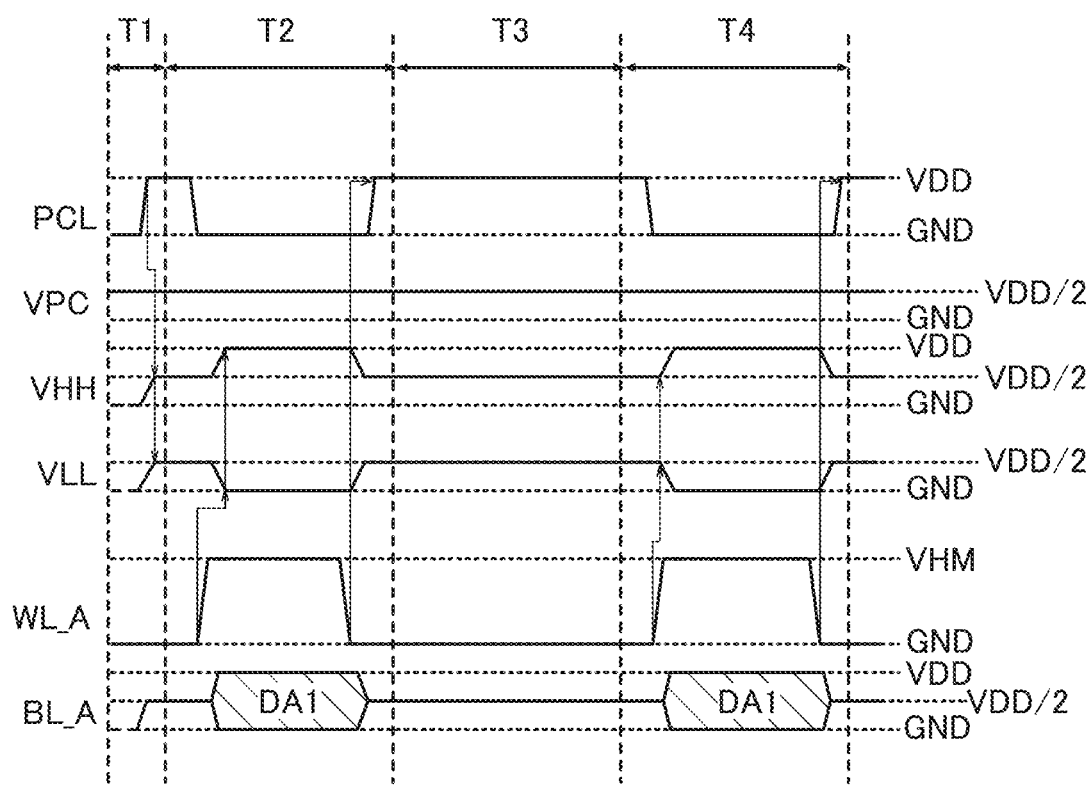
FIG. 29 is a timing chart illustrating a structure example of a semiconductor device.

Furthermore, FIG. 29 is a timing chart for describing an operation of the circuit diagram illustrated in FIG. 28. In the timing chart illustrated in FIG. 29, the period T1 corresponds to a period for describing an initialization operation, the period T2 corresponds to a period for describing a writing operation, the period T3 corresponds to a period for describing an operation in a non-access state, and the period T4 corresponds to a period for describing a reading operation.

In the semiconductor device of one embodiment of the present invention, an OS transistor with an extremely low off-state current is used as the transistor provided in each element layer. OS transistors can be provided to be stacked over a silicon substrate where Si transistors are provided. Therefore, OS transistors can be manufactured in the perpendicular direction by repeating the same manufacturing process; thus, manufacturing costs can be reduced. Furthermore, in one embodiment of the present invention, the transistors for the memory cells can be provided in not a plane direction but the perpendicular direction to improve the memory density; thus, the device can be downsized.

Embodiment 5

Figure 30:
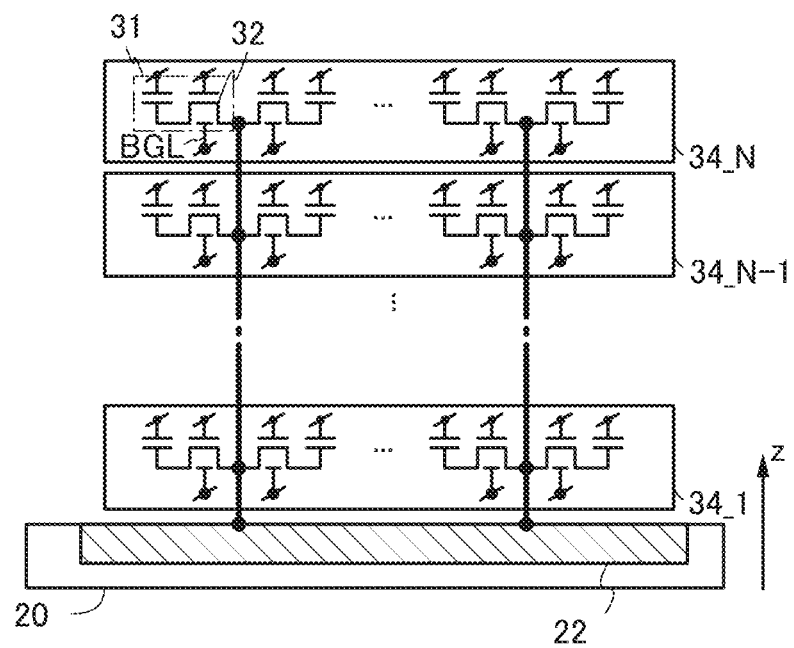
FIG. 30 is a schematic diagram illustrating a structure example of a semiconductor device.

In this embodiment, a modification example of a circuit that can be used in the semiconductor device 10 described above in Embodiment 1 is described with reference to FIG. 30.

In the memory cells included in the above-described element layers 34_1 to 34_N, the illustrated transistors have a top-gate structure or a bottom-gate structure without a back gate electrode; however, the structure of the transistors 32 is not limited thereto. For example, as illustrated in FIG. 30, the transistors included in the memory cells 31 may each be the transistor 32 which has a back gate electrode connected to a back gate electrode line BGL. With the structure of FIG. 30, electrical characteristics such as the threshold voltages of the transistors 32 can be easily controlled from the outside.

Embodiment 6

Figure 31:
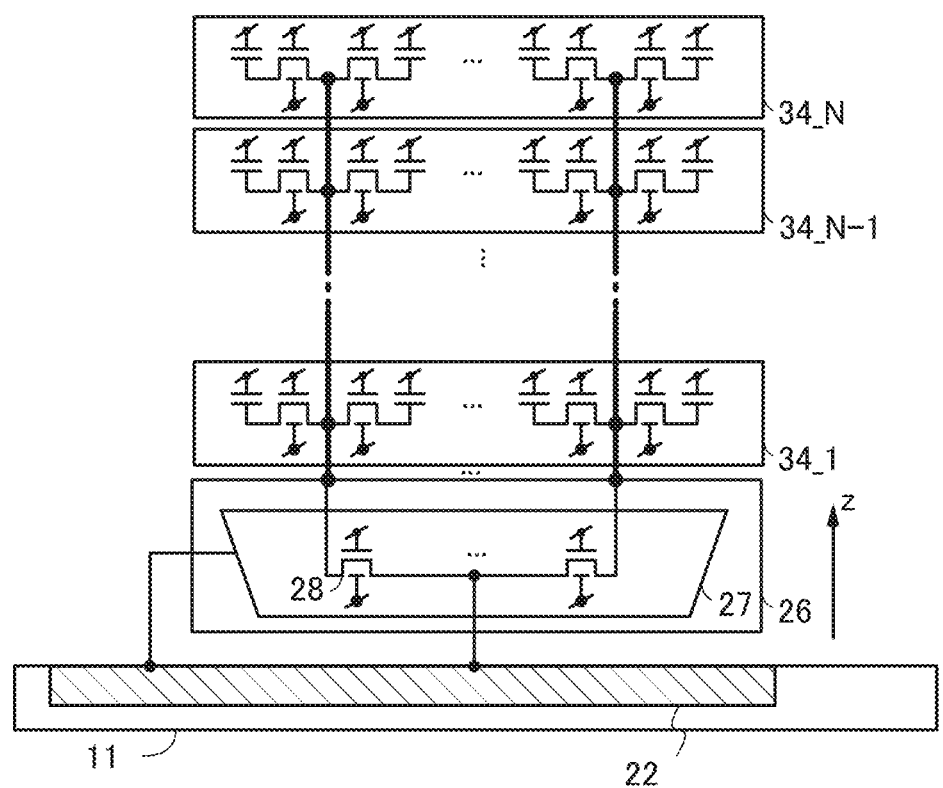
FIG. 31 is a schematic diagram illustrating a structure example of a semiconductor device.

In this embodiment, a modification example of a circuit that can be used in the semiconductor device 10A described above in Embodiment 2 is described with reference to FIG. 31.

The illustrated transistors forming the above-described switching circuit of the element layer 26 have a top-gate structure or a bottom-gate structure without a back gate electrode; however, the structure of the transistors is not limited thereto. For example, as illustrated in FIG. 31, the transistors forming the switching circuit 27 may each be the transistor 28 which has a back gate electrode connected to a back gate electrode line BGL. With the structure of FIG. 31, electrical characteristics such as the threshold voltages of the transistors 28 can be easily controlled from the outside.

Embodiment 7

Figure 32:
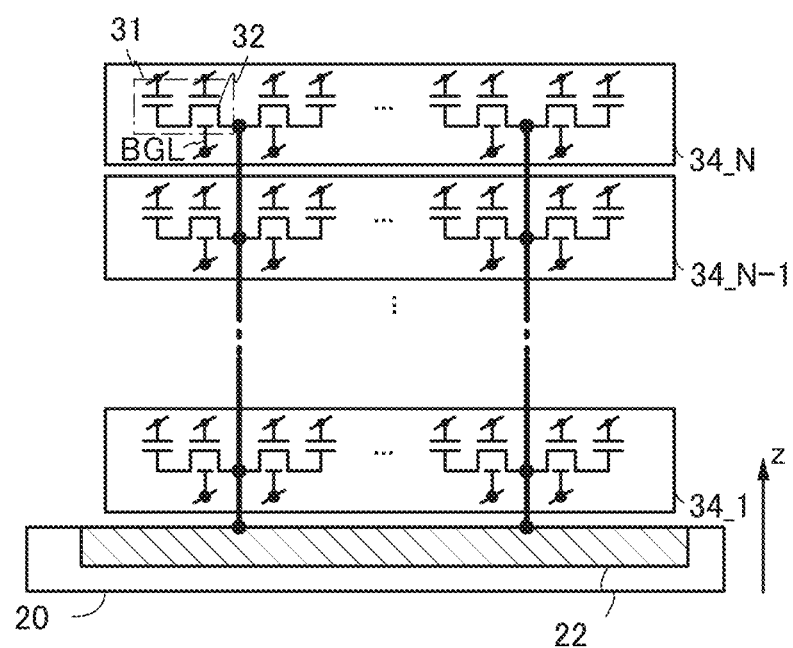
FIG. 32 is a schematic diagram illustrating a structure example of a semiconductor device.

In this embodiment, a modification example of a circuit that can be used in the semiconductor device 10B described above in Embodiment 3 is described with reference to FIG. 32.

In the memory cells included in the above-described element layers 34_1 to 34_N, the illustrated transistors have a top-gate structure or a bottom-gate structure without a back gate electrode; however, the structure of the transistors 32 is not limited thereto. For example, as illustrated in FIG. 32, the transistors included in the memory cells 31 may each be the transistor 32 which has a back gate electrode connected to a back gate electrode line BGL. With the structure of FIG. 32, electrical characteristics such as the threshold voltages of the transistors 32 can be easily controlled from the outside.

Embodiment 8

Figure 33:
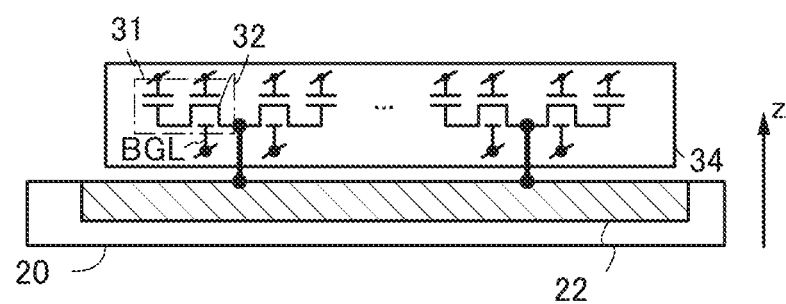
FIG. 33 is a schematic diagram illustrating a structure example of a semiconductor device.

In this embodiment, a modification example of a circuit that can be used in the semiconductor device described above in Embodiment 4 is described with reference to FIG. 33.

In the memory cells included in the above-described element layers 34, the illustrated transistors have a top-gate structure or a bottom-gate structure without a back gate electrode; however, the structure of the transistors 32 is not limited thereto. For example, as illustrated in FIG. 33, the transistors included in the memory cells 31 may each be the transistor 32 which has a back gate electrode connected to a back gate electrode line BGL. With the structure of FIG. 33, electrical characteristics such as the threshold voltages of the transistors 32 can be easily controlled from the outside.

Embodiment 9

Examples of a semiconductor device functioning as a memory device of one embodiment of the present invention are described below.

Figure 34:
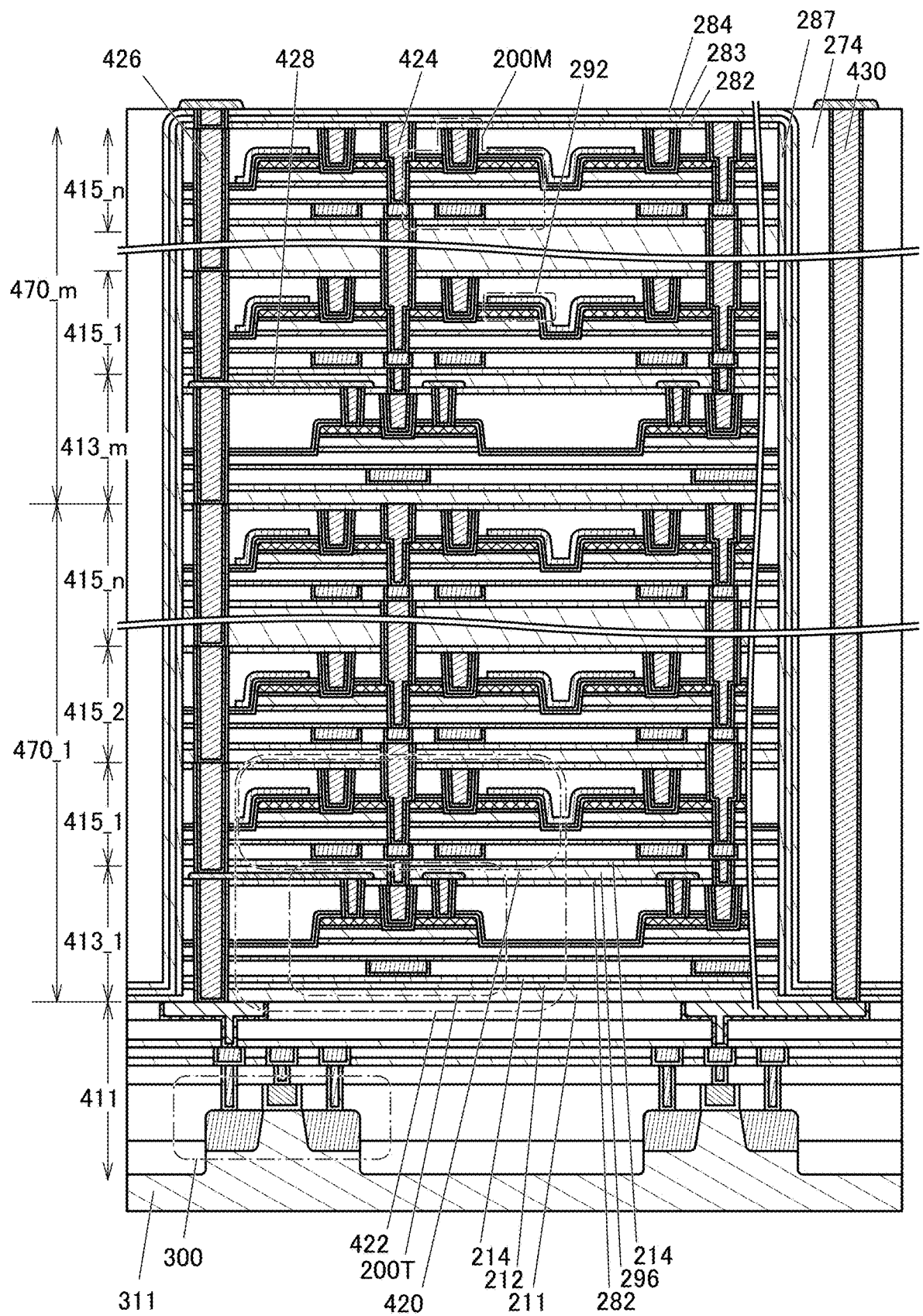
FIG. 34 is a cross-sectional schematic diagram illustrating a structure example of a semiconductor device.

FIG. 34 is a drawing illustrating an example of a semiconductor device where memory units 470 (a memory unit 470_1 to a memory unit 470_$m$: m is a natural number greater than or equal to 2) are provided to be stacked over an element layer 411 including a circuit provided on a semiconductor substrate 311. FIG. 34 illustrates an example where the element layer 411 and a plurality of memory units 470 over the element layer 411 are stacked; the plurality of memory units 470 are each provided with a transistor layer 413 (a transistor layer 413_1 to a transistor layer 413_$m$) and a plurality of memory device layers 415 (a memory device layer 415_1 to a memory device layer 415_$n$: n is a natural number greater than or equal to 2) over each transistor layer 413. Note that although the memory device layers 415 are provided over the transistor layer 413 in each memory unit 470 in the illustrated example, this embodiment is not limited thereto. The transistor layer 413 may be provided over the plurality of memory device layers 415, or the memory device layers 415 may be provided over and under the transistor layer 413.

The element layer 411 includes a transistor 300 provided on the semiconductor substrate 311 and can function as a circuit (referred to as a peripheral circuit in some cases) of the semiconductor device. Examples of the circuit are a column driver, a row driver, a column decoder, a row decoder, a sense amplifier, a precharge circuit, an amplifier circuit, a word line driver circuit, an output circuit, and a control logic circuit. For example, transistor 300 may be a fourth transistor of a driver circuit.

The transistor layer 413 includes a transistor 200T and can function as a circuit which controls each memory unit 470. The memory device layers 415 include a memory device 420. The memory device 420 described in this embodiment includes a transistor 200M and a capacitive element 292.

Although not particularly limited, m is greater than or equal to 2 and less than or equal to 100, preferably greater than or equal to 2 and less than or equal to 50, further preferably greater than or equal to 2 and less than or equal to 10. Although not particularly limited, n is greater than or equal to 2 and less than or equal to 100, preferably greater than or equal to 2 and less than or equal to 50, further preferably greater than or equal to 2 and less than or equal to 10. In addition, the product of m and n is greater than or equal to 4 and less than or equal to 256, preferably greater than or equal to 4 and less than or equal to 128, further preferably greater than or equal to 4 and less than or equal to 64.

FIG. 34 illustrates a cross-sectional view of the transistors 200T and the transistors 200M in the channel length direction, which are included in the memory units.

As illustrated in FIG. 34, the transistor 300 is provided on the semiconductor substrate 311, and the transistor layers 413 and the memory device layers 415 included in the memory units 470 are provided over the transistor 300. In one memory unit 470, the transistor 200T included in the transistor layer 413 and the memory devices 420 included in the memory device layers 415 are electrically connected to each other by a plurality of conductors 424, and the transistor 300 and the transistor 200T included in the transistor layer 413 in each memory unit 470 are electrically connected to each other by a conductor 426. In addition, the conductor 426 is preferably electrically connected to the transistor 200T through a conductor 428 which is electrically connected to any one of a source, a drain, and a gate of the transistor 200T. The conductors 424 are preferably provided in each layer in the memory device layers 415. Furthermore, the conductor 426 is preferably provided in each layer in the transistor layer 413 and the memory device layers 415.

Although the details are described later, an insulator that inhibits passage of impurities such as water or hydrogen or oxygen is preferably provided on side surfaces of the conductors 424 and aside surface of the conductor 426. For the insulators, for example, silicon nitride, aluminum oxide, or silicon nitride oxide may be used.

The memory device 420 includes the transistor 200M and the capacitive element 292. The transistor 200M can have a structure similar to that of the transistor 200T included in the transistor layer 413. The transistor 200T and the transistor 200M are collectively referred to as transistors 200 in some cases.

The transistor 200 preferably uses a metal oxide functioning as an oxide semiconductor (hereinafter also referred to as an oxide semiconductor) in a semiconductor including a region where a channel is formed (hereinafter also referred to as a channel formation region).

As an oxide semiconductor, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, indium oxide, an In—Ga oxide, or an In—Zn oxide may be used. Note that when an oxide semiconductor having a high proportion of indium is used, the on-state current, the field-effect mobility, or the like of the transistor can be increased.

The transistor 200 including an oxide semiconductor in the channel formation region has an extremely low leakage current in a non-conduction state; hence, a semiconductor device with low power consumption can be provided. An oxide semiconductor can be deposited by a sputtering method or the like, and thus can be used in the transistor 200 included in a highly integrated semiconductor device.

In contrast, a transistor using an oxide semiconductor is likely to have normally-on characteristics (characteristics such that a channel exists without voltage application to a gate electrode and a current flows through the transistor) owing to an impurity and an oxygen vacancy (also referred to as $V_O$) in the oxide semiconductor that change the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Therefore, the concentration of impurities in the oxide semiconductor is preferably reduced as much as possible. Examples of the impurities in the oxide semiconductor include hydrogen, nitrogen, an alkali metal, an alkaline earth metal, iron, nickel, and silicon.

In particular, hydrogen as an impurity contained in the oxide semiconductor might form an oxygen vacancy in the oxide semiconductor. In some cases, a defect that is an oxygen vacancy into which hydrogen enters (hereinafter referred to as $V_O H$ in some cases) generates an electron serving as a carrier. In other cases, reaction of part of hydrogen with oxygen bonded to a metal atom generates an electron serving as a carrier.

Thus, a transistor using an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of the transistor.

Therefore, it is preferable to use a highly purified intrinsic oxide semiconductor in which oxygen vacancies and impurities such as hydrogen are reduced as the oxide semiconductor used in the transistor 200.

<Sealing Structure>

In view of the above, the transistor 200 is preferably sealed using a material that inhibits diffusion of impurities (hereinafter also referred to as a barrier material against impurities) in order to inhibit entry of impurities from the outside.

A barrier property in this specification means a function of inhibiting diffusion of a particular substance (also referred to as low transmission capability). Alternatively, a barrier property in this specification means a function of capturing and fixing (also referred to as gettering) a particular substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of capturing and fixing hydrogen include metal oxides such as aluminum oxide, hafnium oxide, gallium oxide, and indium gallium zinc oxide.

As barrier layers between the transistor 300 and the transistor 200, an insulator 211, an insulator 212, and an insulator 214 are preferably provided. When a material that inhibits diffusion or passage of impurities such as hydrogen is used in at least one of the insulator 211, the insulator 212, and the insulator 214, diffusion of impurities such as hydrogen or water contained in the semiconductor substrate 311, the transistor 300, or the like into the transistor 200 can be inhibited. When a material that inhibits passage of oxygen is used in at least one of the insulator 211, the insulator 212, and the insulator 214, diffusion of oxygen contained in the channel of the transistor 200 or the transistor layer 413 into the element layer 411 can be inhibited. For example, it is preferable to use a material that inhibits passage of impurities such as hydrogen or water as the insulator 211 and the insulator 212 and use a material that inhibits passage of oxygen as the insulator 214. Furthermore, a material having a property of absorbing or occluding hydrogen is further preferably used as the insulator 214. As the insulator 211 and the insulator 212, a nitride such as silicon nitride or silicon nitride oxide can be used, for example. For example, as the insulator 214, a metal oxide such as aluminum oxide, hafnium oxide, gallium oxide, or indium gallium zinc oxide can be used. In particular, aluminum oxide is preferably used as the insulator 214.

Furthermore, an insulator 287 is preferably provided on side surfaces of the transistor layers 413 and side surfaces of the memory device layers 415, that is, side surfaces of the memory units 470, and an insulator 282 is preferably provided on a top surface of the memory unit 470. In this case, the insulator 282 is preferably in contact with the insulator 287, and the insulator 287 is preferably in contact with at least one of the insulator 211, the insulator 212, and the insulator 214. As the insulator 287 and the insulator 282, a material that can be used as the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. Although an example where the insulator 287 is in contact with a side surface of the insulator 214, a side surface of the insulator 212, and atop surface and a side surface of the insulator 211 and the insulator 283 is in contact with a top surface and a side surface of the insulator 287 and the top surface of the insulator 211 is illustrated in FIG. 34, this embodiment is not limited thereto. The insulator 287 may be in contact with the side surface of the insulator 214 and a top surface and the side surface of the insulator 212, and the insulator 283 may be in contact with a top surface and the side surface of the insulator 287 and the top surface of the insulator 212. As the insulator 282 and the insulator 287, a material that can be used as the insulator 211 and the insulator 212 is preferably used.

In the above-described structure, a material that inhibits passage of oxygen is preferably used as the insulator 287 and the insulator 282. A material having a property of capturing and fixing hydrogen is further preferably used as the insulator 287 and the insulator 282. When the material having a property of capturing and fixing hydrogen is used on the side close to the transistor 200, hydrogen in the transistor 200 or the memory units 470 is captured and fixed by the insulator 214, the insulator 287, and the insulator 282, so that the hydrogen concentration in the transistor 200 can be reduced. Furthermore, a material that inhibits passage of impurities such as hydrogen or water is preferably used as the insulator 283 and the insulator 284.

With the above-described structure, the memory units 470 are surrounded by the insulator 211, the insulator 212, the insulator 214, the insulator 287, the insulator 282, the insulator 283, and the insulator 284. Specifically, the memory units 470 are surrounded by the insulator 214, the insulator 287, and the insulator 282 (referred to as a first structure body in some cases); and the memory units 470 and the first structure body are surrounded by the insulator 211, the insulator 212, the insulator 283, and the insulator 284 (referred to as a second structure body in some cases). The structure such that the memory units 470 are surrounded by two or more layers of structure bodies in that manner is referred to as a nesting structure in some cases. Here, the memory units 470 being surrounded by the plurality of structure bodies is also described as the memory units 470 being sealed by the plurality of insulators.

The second structure body seals the transistor 200 with the first structure body therebetween. Thus, the second structure body inhibits hydrogen present outside the second structure body, from diffusing to a portion inside the second structure body (to the transistor 200 side). That is, the first structure body can efficiently capture and fix hydrogen present in an inside structure of the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the materials used for the structure bodies, the hydrogen concentrations in the film can be reduced.

In general, a film formed by a CVD method has more favorable coverage than a film formed by a sputtering method. On the other hand, many compound gases used for a CVD method contain hydrogen and a film formed by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film formed by a CVD method) is used as a film that inhibits impurity diffusion, it is preferable that a film having a function of capturing and fixing hydrogen and a reduced hydrogen concentration be provided between the transistor 200 and the film that has a relatively high hydrogen concentration as well as favorable coverage.

In other words, a film with a relatively low hydrogen concentration is preferably used as the film which is provided close to the transistor 200. In contrast, a film with a relatively high hydrogen concentration is preferably provided apart from the transistor 200.

Specifically when the transistor 200 is sealed with a silicon nitride film formed by a CVD method in the above-described structure, an aluminum oxide film formed by a sputtering method is preferably provided between the transistor 200 and the silicon nitride film formed by a CVD method. It is further preferable that a silicon nitride film formed by a sputtering method be provided between the silicon nitride film formed by a CVD method and the aluminum oxide film formed by a sputtering method.

Note that in the case where a CVD method is employed for film formation, a compound gas containing no hydrogen atom or having a low hydrogen atom content may be used for the film formation to reduce the concentration of hydrogen contained in the formed film.

It is also preferable to provide the insulator 282 and the insulator 214 between the transistor layer 413 and the memory device layers 415 or between the memory device layers 415. Furthermore, it is preferable to provide an insulator 296 between the insulator 282 and the insulator 214. The insulator 296 can be formed using a material similar to those of the insulator 283 and the insulator 284. Alternatively, silicon oxide or silicon oxynitride can be used. Alternatively, a known insulating material may be used. Here, the insulator 282, the insulator 296, and the insulator 214 may be elements that form the transistor 200. It is preferable that the insulator 282, the insulator 296, and the insulator 214 also serve as components of the transistor 200 in order to reduce the number of steps for manufacturing the semiconductor device.

Each side surface of the insulator 282, the insulator 296, and the insulator 214 provided between the transistor layer 413 and the memory device layers 415 or between the memory device layers 415 is preferably in contact with the insulator 287. With this structure, the transistor layer 413 and the memory device layers 415 are each surrounded by and sealed with the insulator 282, the insulator 296, the insulator 214, the insulator 287, the insulator 283, and the insulator 284.

An insulator 274 may be provided around the insulator 284. A conductor 430 may be provided so as to be embedded in the insulator 274, the insulator 284, the insulator 283, and the insulator 211. The conductor 430 is electrically connected to the transistor 300, that is, the circuit included in the element layer 411.

Furthermore, since the capacitive element 292 is formed in the same layer as the transistor 200M in the memory device layers 415, the height of the memory device 420 can be approximately equal to that of the transistor 200M; thus, the height of each memory device layer 415 can be prevented from being excessively increased. Accordingly, the number of memory device layers 415 can be increased relatively easily. For example, approximately 100 units each including the transistor layer 413 and the memory device layers 415 may be stacked.

<Transistor 200>

The transistor 200 that can be used as the transistor 200T included in the transistor layer 413 and the transistor 200M included in the memory device 420 is described with reference to FIG. 35(A).

Figure 35A:
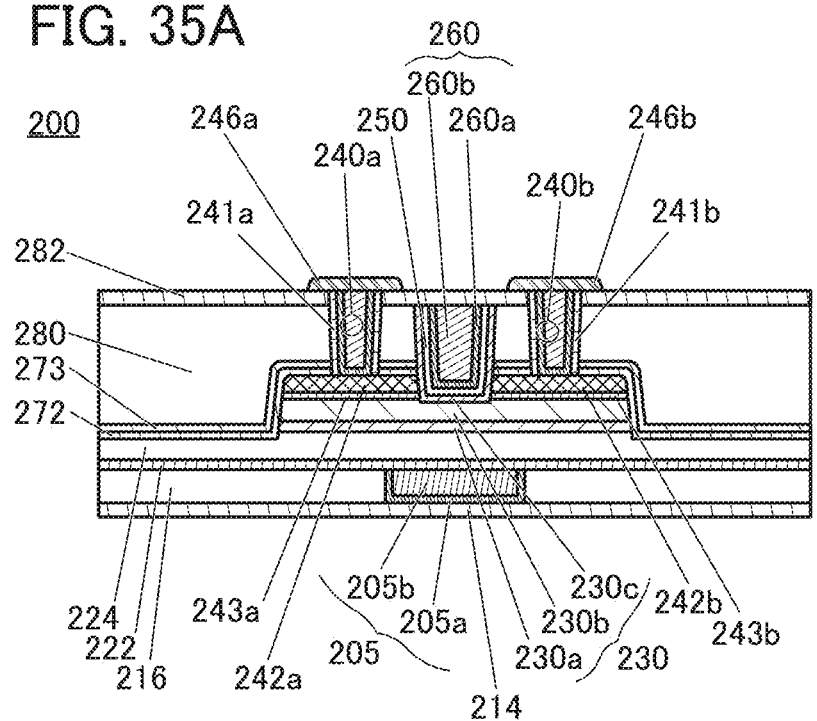
FIG. 35 are (A) a cross-sectional schematic diagram and (B) a cross-sectional schematic diagram illustrating structure examples of a semiconductor device.

As illustrated in FIG. 35(A), the transistor 200 includes an insulator 216, a conductor 205 (a conductor 205a and a conductor 205b), an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 260, and a conductor 260 (a conductor 260a and a conductor 260b).

Furthermore, the insulator 216 and the conductor 205 are provided over the insulator 214, and an insulator 280 and the insulator 282 are provided over the insulator 273. The insulator 214, the insulator 280, and the insulator 282 can be regarded as part of the transistor 200.

The semiconductor device of one embodiment of the present invention also includes a conductor 240 (a conductor 240a and a conductor 240b) that is electrically connected to the transistor 200 and functions as a plug. Note that an insulator 241 (an insulator 241a and an insulator 241b) may be provided in contact with a side surface of the conductor 240 functioning as a plug. A conductor 246 (a conductor 246a and a conductor 246b) that is electrically connected to the conductor 240 and functions as a wiring is provided over the insulator 282 and the conductor 240.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of oxygen and impurities such as water or hydrogen is preferably used. For example, tantalum, tantalum nitride, titanium, titanium nitride, ruthenium, ruthenium oxide, or the like is preferably used. A single layer or a stacked layer of the conductive material having a function of inhibiting passage of oxygen and impurities such as water or hydrogen may be used. With the use of the conductive material, entry of impurities diffused from the insulator 280 and the like, such as water or hydrogen, into the oxide 230 through the conductor 240a and the conductor 240b can be further reduced. In addition, oxygen added to the insulator 280 can be prevented from being absorbed by the conductor 240a and the conductor 240b.

For the insulator 241 provided in contact with the side surface of the conductor 240, for example, silicon nitride, aluminum oxide, silicon nitride oxide, or the like can be used. Since the insulator 241 is provided in contact with the insulator 272, the insulator 273, the insulator 280, and the insulator 282, impurities such as water or hydrogen can be inhibited from being mixed into the oxide 230 through the conductor 240a and the conductor 240b from the insulator 280 or the like. In particular, silicon nitride is suitable because of having a high blocking property against hydrogen. In addition, oxygen contained in the insulator 280 can be prevented from being absorbed by the conductor 240a and the conductor 240b.

As the conductor 246, a conductive material containing tungsten, copper, or aluminum as its main component is preferably used. Furthermore, the conductor may have a stacked-layer structure and may be a stack of titanium or titanium nitride and the above-described conductive material, for example. Note that the conductor may be formed to be embedded in an opening provided in an insulator.

In the transistor 200, the conductor 260 functions as a first gate of the transistor, and the conductor 205 functions as a second gate of the transistor. The conductor 242a and the conductor 242b function as a source electrode and a drain electrode.

The oxide 230 functions as a semiconductor including a channel formation region. For example, oxide 230 may be a third semiconductor layer of the third transistor 200T.

The insulator 250 functions as a first gate insulator, and the insulator 222 and the insulator 224 function as a second gate insulator.

Here, in the transistor 200 illustrated in FIG. 35(A), the conductor 260 is formed in a self-aligned manner in an opening portion provided in the insulator 280, the insulator 273, the insulator 272, the conductor 242, and the like, with the oxide 230c and the insulator 250 therebetween.

In other words, the conductor 260 is formed to fill the opening provided in the insulator 280 and the like with the oxide 230c and the insulator 250 therebetween; therefore, positional alignment of the conductor 260 in the region between the conductor 242a and the conductor 242b is not needed.

Here, the oxide 230c is preferably provided in the opening that is provided in the insulator 280 and the like. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Thus, the influence of interface scattering on carrier conduction is small, and the transistor 200 can have a high on-state current and excellent frequency characteristics.

In the transistor 200 illustrated in FIG. 35(A), a bottom surface and a side surface of the conductor 260 are in contact with the insulator 250. In addition, a bottom surface and a side surface of the insulator 250 are in contact with the oxide 230c.

As illustrated in FIG. 35(A), the transistor 200 has a structure in which the insulator 282 and the oxide 230c are in direct contact with each other. Owing to this structure, diffusion of oxygen contained in the insulator 280 to the conductor 260 can be inhibited.

Therefore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor 200 can be improved.

The detailed structure of the semiconductor device including the transistor 200 of one embodiment of the present invention is described below.

In the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used.

For example, a metal oxide having an energy gap of 2 eV or more, preferably 2.5 eV or more is preferably used as the metal oxide functioning as an oxide semiconductor. With the use of a metal oxide having such a wide energy gap, the leakage current in a non-conduction state (off-state current) of the transistor 200 can be extremely low. With the use of such a transistor, a semiconductor device with low power consumption can be provided.

Specifically, for the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide 230.

As illustrated in FIG. 35(A), the oxide 230 preferably includes the oxide 230a over the insulator 224, the oxide 230b over the oxide 230a, and the oxide 230c that is positioned over the oxide 230b and is at least partly in contact with a top surface of the oxide 230b. Here, a side surface of the oxide 230c is preferably provided in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. For example, a four-layer structure including the oxide 230c with a two-layer structure may be provided.

In addition, the oxide 230 preferably has a stacked-layer structure of oxides which differ in the atomic ratio of metal atoms. Specifically, the atomic ratio of the element M in the constituent elements in the metal oxide used as the oxide 230a is preferably greater than the atomic ratio of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Specifically, as the oxide 230a, a metal oxide having a composition of In:Ga:Zn=1:3:4 [atomic ratio] or the vicinity thereof or a composition of 1:1:0.5 [atomic ratio] or the vicinity thereof is preferably used.

As the oxide 230b, a metal oxide having a composition of In:Ga:Zn=4:2:3 [atomic ratio] or the vicinity thereof or a composition of 1:1:1 [atomic ratio] or the vicinity thereof is used. As the oxide 230b, a metal oxide having a composition of In:Ga:Zn=5:1:3 [atomic ratio] or the vicinity thereof or a composition of In:Ga:Zn=10:1:3 [atomic ratio] or the vicinity thereof may be used as well. As the oxide 230b, an In—Zn oxide (e.g., a composition of In:Zn=2:1 [atomic ratio] or the vicinity thereof, a composition of In:Zn=5:1 [atomic ratio] or the vicinity thereof, or a composition of In:Zn=10:1 [atomic ratio] or the vicinity thereof) may be used as well. An In oxide may be used as the oxide 230b.

Furthermore, as the oxide 230c, a metal oxide having In:Ga:Zn=1:3:4 [atomic ratio or the composition in vicinity thereof], a composition of Ga:Zn=2:1 [atomic ratio] or the vicinity thereof, or a composition of Ga:Zn=2:5 [atomic ratio] or the vicinity thereof is preferably used. As the oxide 230c, a single layer or a stacked layer may be provided using a material that can be used as the oxide 230b. For example, in the case where the oxide 230c has a stacked-layer structure, the oxide 230c can specifically have a stacked-layer structure of a composition of In:Ga:Zn=4:2:3 [atomic ratio] or the vicinity thereof and a composition of In:Ga:Zn=1:3:4 [atomic ratio] or the vicinity thereof, a stacked-layer structure of a composition of Ga:Zn=2:1 [atomic ratio] or the vicinity thereof and a composition of In:Ga:Zn=4:2:3 [atomic ratio] or the vicinity thereof, a stacked-layer structure of a composition of Ga:Zn=2:5 [atomic ratio] or the vicinity thereof and a composition of In:Ga:Zn=4:2:3 [atomic ratio] or the vicinity thereof, a stacked-layer structure of gallium oxide and a composition of In:Ga:Zn=4:2:3 [atomic ratio] or the vicinity thereof, or the like.

Note that an OS transistor included in the memory cell array 30 and an OS transistor included in the element layer 40 which are illustrated in Embodiment 1 may be different in structure from each other. For example, as the oxide 230c included in the OS transistor provided in the memory cell array 30, a metal oxide having a composition of In:Ga:Zn=4:2:3 [atomic ratio] or the vicinity thereof may be used, and as the oxide 230c included in the OS transistor provided in the element layer 40, a metal oxide having a composition of In:Ga:Zn=5:1:3 [atomic ratio] or the vicinity thereof, a composition of In:Ga:Zn=10:1:3 [atomic ratio] or the vicinity thereof, a composition of In:Zn=10:1 [atomic ratio] or the vicinity thereof, a composition of In:Zn=5:1 [atomic ratio] or the vicinity thereof, or a composition of In:Zn=2:1 [atomic ratio] or the vicinity thereof may be used.

In the oxide 230b and the oxide 230c, increasing the ratio of indium in the films is favorable to increase the on-state current, the field-effect mobility, or the like of the transistor.

Moreover, the above-described composition in the vicinity includes ±30% of the intended atomic ratio.

The oxide 230b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. In addition, the amount of oxygen extracted from the oxide 230b can be reduced even when heat treatment is performed; thus, the transistor 200 is stable at high temperatures (what is called thermal budget) in a manufacturing process.

The conductor 205 is provided to overlap with the oxide 230 and the conductor 260. Furthermore, the conductor 205 is preferably provided to be embedded in the insulator 216.

When the conductor 205 functions as a gate electrode, by changing a potential applied to the conductor 205 not in conjunction with but independently of a potential applied to the conductor 260, the threshold voltage (Vth) of the transistor 200 can be adjusted. In particular, by applying a negative potential to the conductor 205, Vth of the transistor 200 can be further increased, and the off-state current can be reduced. Thus, a drain current of the time when the potential applied to the conductor 260 is 0 V can be lower in the case where a negative potential is applied to the conductor 205 than in the case where the negative potential is not applied to the conductor 205.

As illustrated in FIG. 35(A), the conductor 205 is preferably provided to be larger than a region of the oxide 230 that does not overlap with the conductor 242a or the conductor 242b. Although not illustrated, the conductor 205 preferably extends to a region outside the oxide 230a and the oxide 230b in the channel width direction of the oxide 230. That is, the conductor 205 and the conductor 260 preferably overlap with each other with the insulators therebetween on the outside of a side surface of the oxide 230 in the channel width direction. Providing the conductor 205 with a large area can reduce local charging (charge up) in a treatment using plasma of a manufacturing step after forming the conductor 205 in some cases. Note that one embodiment of the present invention is not limited thereto. The conductor 205 overlaps with at least the oxide 230 positioned between the conductor 242a and the conductor 242b.

When a bottom surface of the insulator 224 is used as a reference, the level of a bottom surface of the conductor 260 in a region where the oxide 230a and the oxide 230b do not overlap with the conductor 260 is preferably placed lower than the level of a bottom surface of the oxide 230b.

Although not illustrated, when the conductor 260 functioning as a gate covers, in the channel width direction, a side surface and the top surface of the oxide 230b serving as the channel formation region with the oxide 230c and the insulator 250 therebetween, electric fields generated from the conductor 260 are likely to affect the entire channel formation region in the oxide 230b. Thus, the on-state current of the transistor 200 can be increased and the frequency characteristics can be improved. In this specification, a transistor structure in which a channel formation region is electrically surrounded by electric fields of the conductor 260 and the conductor 205 is referred to as a surrounded channel (S-channel) structure.

The conductor 205a is preferably a conductor that inhibits passage of oxygen and impurities such as water or hydrogen. For example, titanium, titanium nitride, tantalum, or tantalum nitride can be used. Moreover, as the conductor 205b, a conductive material containing tungsten, copper, or aluminum as its main component is preferably used. Although the conductor 205 is illustrated as having two layers, a multilayer structure having three or more layers may be employed.

Here, it is preferable that an oxide semiconductor, an insulator or a conductor positioned in a layer below the oxide semiconductor, and an insulator or a conductor positioned in a layer above the oxide semiconductor be successively formed of different kinds of films without being exposed to the air, in which case a substantially highly purified intrinsic oxide semiconductor film where the concentration of impurities (in particular, hydrogen, water) is reduced can be deposited.

At least one of the insulator 222, the insulator 272, and the insulator 273 preferably functions as a barrier insulating film that inhibits impurities such as water or hydrogen from entering the transistor 200 from the substrate side or from above. Thus, at least one of the insulator 222, the insulator 272, and the insulator 273 is preferably formed using an insulating material which has a function of inhibiting diffusion of impurities (through which the impurities do not easily pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material which has a function of inhibiting diffusion of oxygen (e.g., at least one of an oxygen atom, an oxygen molecule, and the like) (through which the above oxygen does not easily pass).

For example, it is preferable that the insulator 273 be formed using silicon nitride, silicon nitride oxide, or the like, and the insulator 222 and the insulator 272 be formed using aluminum oxide, hafnium oxide, or the like.

Accordingly, impurities such as water or hydrogen can be inhibited from being diffused to the transistor 200 side through the insulator 222. Alternatively, oxygen contained in the insulator 224 or the like can be inhibited from being diffused to the substrate side through the insulator 222.

Impurities such as water or hydrogen can be inhibited from being diffused into the transistor 200 side from the insulator 280 and the like, which are provided above the insulator 272 and the insulator 273. In this manner, the transistor 200 is preferably surrounded by the insulator 272 and the insulator 273 having a function of inhibiting diffusion of oxygen and impurities such as water or hydrogen.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate as the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the number of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{21}$ molecules/cm$^3$ in thermal desorption spectroscopy analysis (TDS analysis). Note that the temperature of the film surface in the TDS analysis is preferably within the range of higher than or equal to 100°

C. and lower than or equal to 700° C., or higher than or equal to 100° C. and lower than or equal to 400° C.

The insulator 222 preferably functions as a barrier insulating film that inhibits impurities such as water or hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 283 can inhibit entry of impurities such as water or hydrogen into the transistor 200 from the outside.

Furthermore, it is preferable that the insulator 222 have a function of inhibiting diffusion of oxygen (e.g., at least one of an oxygen atom, an oxygen molecule, and the like) (through which the above oxygen does not easily pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. In the case where the insulator 222 has stacked layers, three layers of zirconium oxide, aluminum oxide, and zirconium oxide stacked in this order, or four layers of zirconium oxide, aluminum oxide, zirconium oxide, and aluminum oxide stacked in this order can be employed, for example. As the insulator 222, a compound containing hafnium and zirconium or the like may be employed. When the semiconductor device is miniaturized and highly integrated, a dielectric used for a gate insulator and a capacitive element become thin, which might cause a problem of a leakage current from a transistor and the capacitive element. When a high-k material is used as an insulator functioning as a dielectric used for a gate insulator and a capacitive element, a gate potential during operation of the transistor can be lowered and the capacitance of the capacitive element can be assured while the physical thickness is maintained.

Note that the insulator 222 and the insulator 224 may have a stacked-layer structure of two or more layers. In such cases, without limitation to a stacked-layer structure formed of the same material, a stacked-layer structure formed of different materials may be employed.

The oxide 243 (the oxide 243a and the oxide 243b) may be provided between the oxide 230b and the conductor 242 (the conductor 242a and the conductor 242b) which functions as the source electrode or the drain electrode. This structure in which the conductor 242 and the oxide 230b are not in contact with each other can prevent the conductor 242 from absorbing oxygen in the oxide 230b. That is, preventing oxidation of the conductor 242 can inhibit the decrease in conductivity of the conductor 242. Thus, the oxide 243 preferably has a function of inhibiting oxidation of the conductor 242.

It is preferable to provide the oxide 243 having a function of inhibiting passage of oxygen between the oxide 230b and the conductor 242, which functions as the source electrode and the drain electrode, in which case the electrical resistance between the conductor 242 and the oxide 230b is reduced. Such a structure improves the electrical characteristics of the transistor 200 and the reliability of the transistor 200.

As the oxide 243, a metal oxide including an element M, which is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like, is preferably used. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly possible that oxidation of the conductor 242 lowers the conductivity of the conductor 242. Note that diffusion of oxygen in the oxide 230 into the conductor 242 can be rephrased as absorption of oxygen in the oxide 230 by the conductor 242.

When oxygen in the oxide 230 diffuses to the conductor 242 (the conductor 242a and the conductor 242b), another layer is sometimes formed between the conductor 242a and the oxide 230b, and between the conductor 242b and the oxide 230b. The layer contains more oxygen than the conductor 242 does and thus the layer presumably has an insulating property. In this case, a three-layer structure of the conductor 242, the layer, and the oxide 230b can be regarded as a three-layer structure of metal-insulator-semiconductor and is sometimes referred to as an MIS (Metal-Insulator-Semiconductor) structure or a diode junction structure having an MIS structure as its main part.

The above-described layer is not necessarily formed between the conductor 242 and the oxide 230b, and the layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above-described metal element; an alloy containing a combination of the above-described metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 272 is provided in contact with a top surface of the conductor 242 and preferably functions as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has a function of further inhibiting diffusion of oxygen as compared to the insulator 280. An insulator containing an oxide of one or both of aluminum and hafnium is preferably deposited as the insulator 272, for example. An insulator containing aluminum nitride may be used as the insulator 272, for example.

As illustrated in FIG. 35(A), the insulator 272 is in contact with part of a top surface of the conductor 242b and a side surface of the conductor 242b. Although not illustrated, the insulator 272 is in contact with part of a top surface of the conductor 242a and a side surface of the conductor 242a. The insulator 273 is provided over the insulator 272. Thus, oxygen added to the insulator 280 can be inhibited from being absorbed by the conductor 242.

The insulator 250 functions as a gate insulator. The insulator 250 is preferably positioned in contact with a top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be effectively supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above-described metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be captured in some cases. Alternatively, hydrogen entering from an external insulator or the like can be captured in some cases.

Although the conductor 260 has a two-layer structure in FIG. 35(A), the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used as the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of the above-described conductive material and titanium or titanium nitride.

<<Metal Oxide>>

As the oxide 230, a metal oxide functioning as an oxide semiconductor is preferably used. A metal oxide that can be used for the oxide 230 of the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, a case where the metal oxide is an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is considered. In particular, aluminum, gallium, yttrium, or tin is preferably used as the element M.

Note that in this specification and the like, a metal oxide containing nitrogen is also referred to as a metal oxide in some cases. A metal oxide containing nitrogen may be referred to as a metal oxynitride.

<Transistor 300>

The transistor 300 is described with reference to FIG. 35(B). The transistor 300 is provided over the semiconductor substrate 311 and includes a conductor 316 functioning as a gate, an insulator 315 functioning as a gate insulator, a semiconductor region 313 formed of a part of the semiconductor substrate 311, and a low-resistance region 314a and a low-resistance region 314b functioning as the source region and the drain region. The transistor 300 may be a p-channel transistor or an n-channel transistor.

Figure 35B:
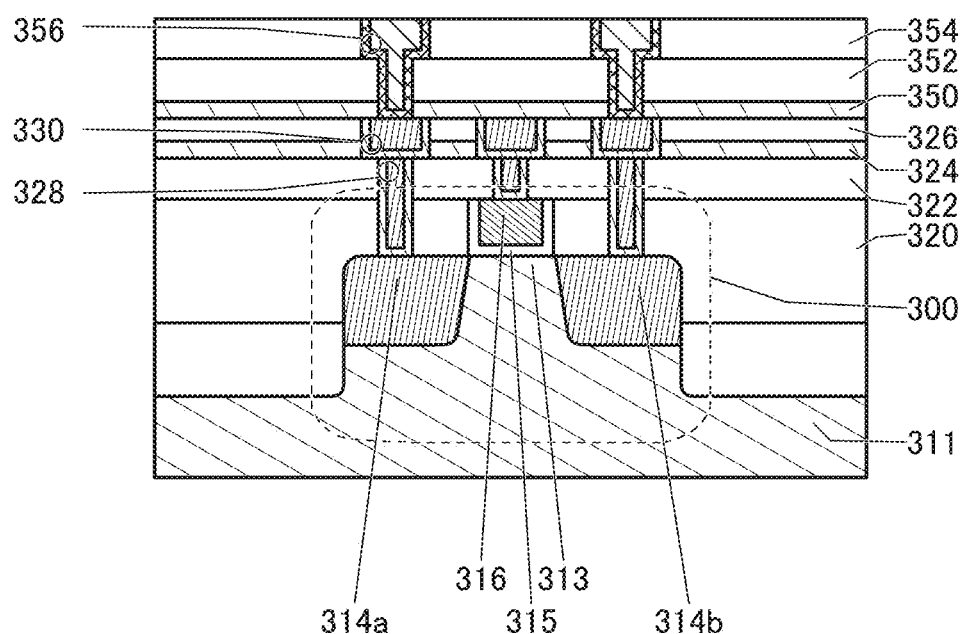

Here, in the transistor 300 illustrated in FIG. 35(B), the semiconductor region 313 (part of the semiconductor substrate 311) where the channel is formed has a convex shape. Furthermore, the conductor 316 is provided so as to cover a side surface and a top surface of the semiconductor region 313 with the insulator 315 therebetween. Note that a material adjusting the work function may be used as the conductor 316. Such a transistor 300 is also referred to as a FIN-type transistor because it utilizes a convex portion of the semiconductor substrate 311. Note that an insulator functioning as a mask for forming the convex portion may be included in contact with an upper portion of the convex portion. Furthermore, although the case where the convex portion is formed by processing part of the semiconductor substrate 311 is described here, a semiconductor film having a convex shape may be formed by processing an SOI substrate.

Note that the transistor 300 illustrated in FIG. 35(B) is an example and the structure is not limited thereto; an appropriate transistor is used in accordance with a circuit structure or a driving method.

<Memory Device 420>

Figure 36A:
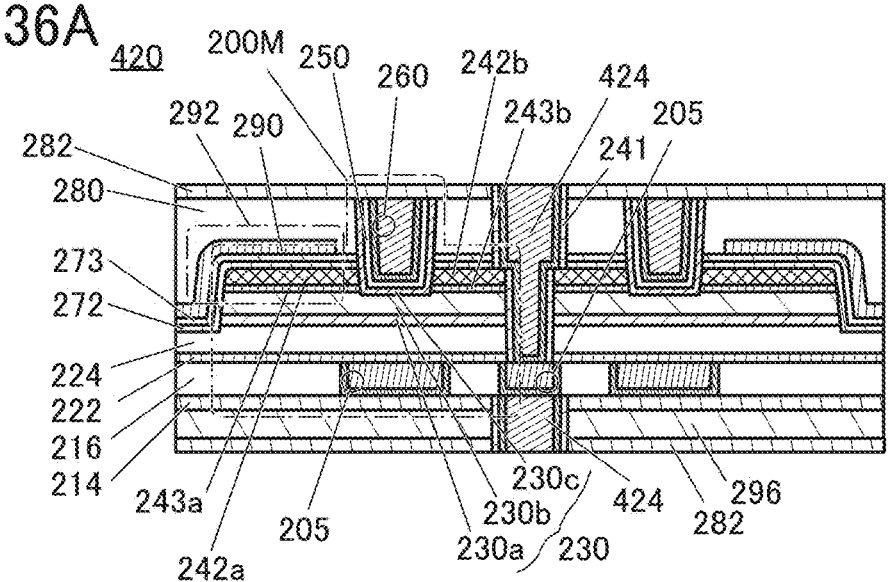
FIG. 36 are (A) a cross-sectional schematic diagram, (B) a cross-sectional schematic diagram, and (C) a cross-sectional schematic diagram illustrating structure examples of a semiconductor device.

Next, the memory device 420 illustrated in FIG. 34 is described with reference to FIG. 36(A). As for the transistor 200M included in the memory device 420, the description overlapping with that of the transistor 200 is omitted.

In the memory device 420, the conductor 242a of the transistor 200M functions as one electrode of the capacitive element 292, and the insulator 272 and the insulator 273 function as a dielectric. A conductor 290 is provided to overlap with the conductor 242a with the insulator 272 and the insulator 273 sandwiched therebetween and functions as the other electrode of the capacitive element 292. The conductor 290 may be used as the other electrode of the capacitive element 292 included in an adjacent memory device 420. Alternatively, the conductor 290 may be electrically connected to the conductor 290 included in an adjacent memory device 420.

The conductor 290 is also provided on the top surface of the conductor 242a and the side surface of the conductor 242a with the insulator 272 and the insulator 273 sandwiched therebetween. This is preferable because the capacitive element 292 can have a larger capacitance than the capacitance obtained by the area where the conductor 242a and the conductor 290 overlap each other.

The conductor 424 is electrically connected to the conductor 242b and is electrically connected to the conductor 424 positioned in a lower layer through the conductor 205.

As a dielectric of the capacitive element 292, silicon nitride, silicon nitride oxide, aluminum oxide, hafnium oxide, or the like can be used. Furthermore, these materials can be stacked. In the case where the dielectric of the capacitive element 292 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the dielectric of the capacitive element 292, zirconium oxide having a higher permittivity than the above-described materials may be used. As the dielectric of the capacitive element 292, a single layer of zirconium oxide may be used, or zirconium oxide may be used in part of stacked layers. For example, stacked layers of zirconium oxide and aluminum oxide can be used. Furthermore, the dielectric of the capacitive element 292 may be three stacked layers; zirconium oxide may be used as the first layer and the third layer and aluminum oxide may be used as the second layer between the first layer and the third layer.

When zirconium oxide having a high permittivity is used as the dielectric of the capacitive element 292, the area occupied by the capacitive element 292 in the memory device 420 can be reduced. Thus, the area necessary for the memory device 420 can be reduced, and the bit cost can be improved, which is preferable.

As the conductor 290, any of the materials that can be used as the conductor 205, the conductor 242, the conductor 260, the conductors 424, and the like can be used.

This embodiment shows an example where the transistors 200M and the capacitive elements 292 are symmetrically provided with the conductors 424 sandwiched therebetween. When a pair of transistors 200M and a pair of capacitive elements 292 are provided in this manner, the number of conductors 424 electrically connected to the transistor 200M can be reduced. Thus, the area necessary for the memory device 420 can be reduced, and the bit cost can be improved, which is preferable.

In the case where the insulator 241 is provided on the side surface of the conductor 424, the conductor 424 is connected to at least part of the top surface of the conductor 242b.

Using the conductors 424 and the conductor 205, the transistor 200T and the memory device 420 in the memory unit 470 can be electrically connected to each other.

Modification Example 1 of Memory Device 420

Figure 36B:
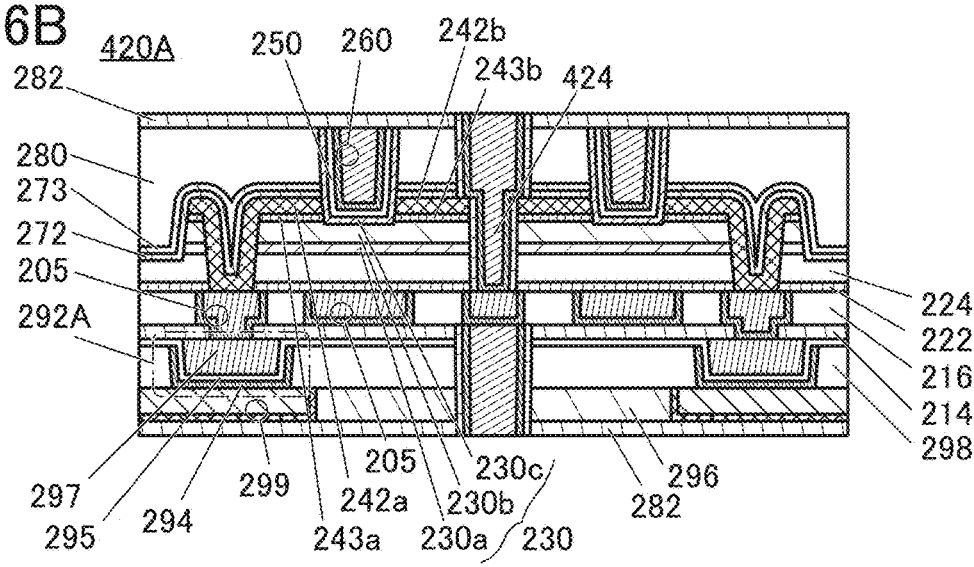

Next, with reference to FIG. 36(B), a memory device 420A is described as a modification example of the memory device 420. The memory device 420A includes the transistor 200M and a capacitive element 292A electrically connected to the transistor 200M. The capacitive element 292A is provided below the transistor 200M.

In the memory device 420A, the conductor 242a is provided in an opening that is provided in the oxide 243a, the oxide 230b, the oxide 230a, the insulator 224, and the insulator 222 and is electrically connected to the conductor 205 at a bottom portion of the opening. The conductor 205 is electrically connected to the capacitive element 292A.

The capacitive element 292A includes a conductor 294 functioning as one of electrodes, an insulator 295 functioning as a dielectric, and a conductor 297 functioning as the other of the electrodes. The conductor 297 overlaps with the conductor 294 with the insulator 295 sandwiched therebetween. Furthermore, the conductor 297 is electrically connected to the conductor 205.

The conductor 294 is provided in a bottom portion and on a side surface of an opening formed in an insulator 298 provided over the insulator 296, and the insulator 295 is provided so as to cover the insulator 298 and the conductor 294. Furthermore, the conductor 297 is provided so as to be embedded in a concave portion that the insulator 295 has.

Furthermore, a conductor 299 is provided so as to be embedded in the insulator 296, and the conductor 299 is electrically connected to the conductor 294. The conductor 299 may be electrically connected to the conductor 294 of an adjacent memory device 420A.

The conductor 297 is also provided on a top surface of the conductor 294 and a side surface of the conductor 294 with the insulator 295 sandwiched therebetween. This is preferable because the capacitive element 292A can have a larger capacitance than the capacitance obtained by the area where the conductor 294 and the conductor 297 overlap each other.

As the insulator 295 functioning as a dielectric of the capacitive element 292A, silicon nitride, silicon nitride oxide, aluminum oxide, hafnium oxide, or the like can be used. Furthermore, these materials can be stacked. In the case where the insulator 295 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 295, zirconium oxide having a higher permittivity than the above-described materials may be used. As the insulator 295, a single layer of zirconium oxide may be used, or zirconium oxide may be used in part of stacked layers. For example, stacked layers of zirconium oxide and aluminum oxide can be used. Furthermore, the insulator 295 may be three stacked layers; zirconium oxide may be used as the first layer and the third layer and aluminum oxide may be used as the second layer between the first layer and the third layer.

When zirconium oxide having a high permittivity is used as the insulator 295, the area occupied by the capacitive element 292A in the memory device 420A can be reduced. Thus, the area necessary for the memory device 420A can be reduced, and the bit cost can be improved, which is preferable.

As the conductor 297, the conductor 294, and the conductor 299, any of the materials that can be used as the conductor 205, the conductor 242, the conductor 260, the conductors 424, and the like can be used.

Furthermore, as the insulator 298, any of the materials that can be used as the insulator 214, the insulator 216, the insulator 224, the insulator 280, and the like can be used.

Modification Example 2 of Memory Device 420

Figure 36C:
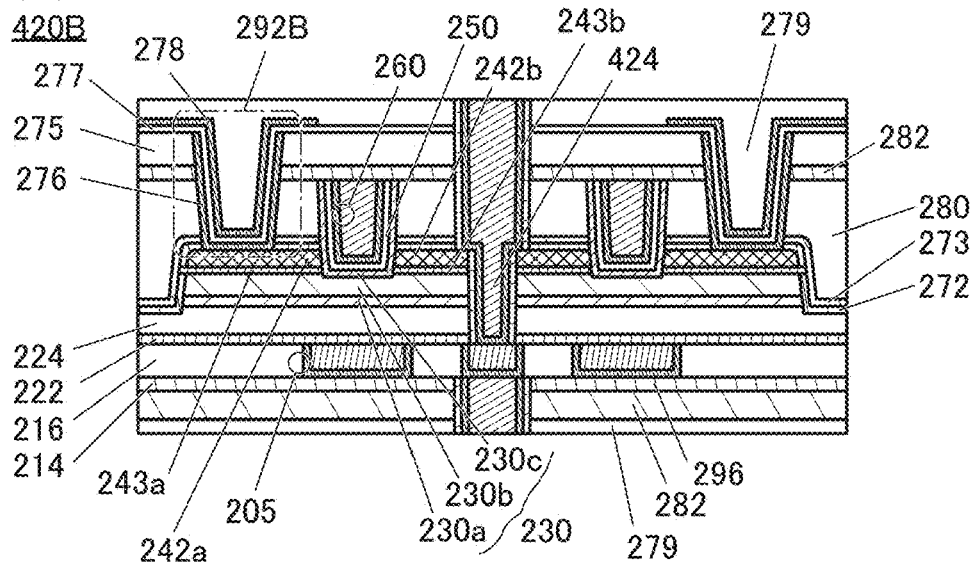

Next, with reference to FIG. 36(C), a memory device 420B is described as a modification example of the memory device 420. The memory device 420B includes the transistor 200M and a capacitive element 292B electrically connected to the transistor 200M. The capacitive element 292B is provided above the transistor 200M.

The capacitive element 292B includes a conductor 276 functioning as one of electrodes, an insulator 277 functioning as a dielectric, and a conductor 278 functioning as the other of the electrodes. The conductor 278 overlaps with the conductor 276 with the insulator 277 sandwiched therebetween.

An insulator 275 is provided over the insulator 282, and the conductor 276 is provided in a bottom portion and on a side surface of an opening formed in the insulator 275, the insulator 282, the insulator 280, the insulator 273, and the insulator 272. The insulator 277 is provided so as to cover the insulator 282 and the conductor 276. Furthermore, the conductor 278 is provided so as to overlap with the conductor 276 in a concave portion that the insulator 277 has, and at least part of the conductor 278 is provided over the insulator 275 with the insulator 277 therebetween. The conductor 278 may be used as the other of the electrodes of the capacitive element 292B included in an adjacent memory device 420B. Alternatively, the conductor 278 may be electrically connected to the conductor 278 included in an adjacent memory device 420B.

The conductor 278 is also provided on a top surface of the conductor 276 and a side surface of the conductor 276 with the insulator 277 sandwiched therebetween. This is preferable because the capacitive element 292B can have a larger capacitance than the capacitance obtained by the area where the conductor 276 and the conductor 278 overlap each other.

An insulator 279 may be provided so as to fill the concave portion that the conductor 278 has.

As the insulator 277 functioning as a dielectric of the capacitive element 292B, silicon nitride, silicon nitride oxide, aluminum oxide, hafnium oxide, or the like can be used. Furthermore, these materials can be stacked. In the case where the insulator 277 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 277, zirconium oxide having a higher permittivity than the above-described materials may be used. As the insulator 277, a single layer of zirconium oxide may be used, or zirconium oxide may be used in part of stacked layers. For example, stacked layers of zirconium oxide and aluminum oxide can be used. Furthermore, the insulator 277 may be three stacked layers; zirconium oxide may be used as the first layer and the third layer and aluminum oxide may be used as the second layer between the first layer and the third layer.

When zirconium oxide having a high permittivity is used as the insulator 277, the area occupied by the capacitive element 292B in the memory device 420B can be reduced. Thus, the area necessary for the memory device 420B can be reduced, and the bit cost can be improved, which is preferable.

As the conductor 276 and the conductor 278, any of the materials that can be used as the conductor 205, the conductor 242, the conductor 260, the conductors 424, and the like can be used.

Furthermore, as the insulator 275 and the insulator 279, any of the materials that can be used as the insulator 214, the insulator 216, the insulator 224, the insulator 280, and the like can be used.

<Connection Between Memory Device 420 and Transistor 200T>

In a region 422 surrounded by a dashed-dotted line in FIG. 34, the memory device 420 is electrically connected to the gate of the transistor 200T through the conductor 424 and the conductor 205; however, this embodiment is not limited thereto.

Figure 37:
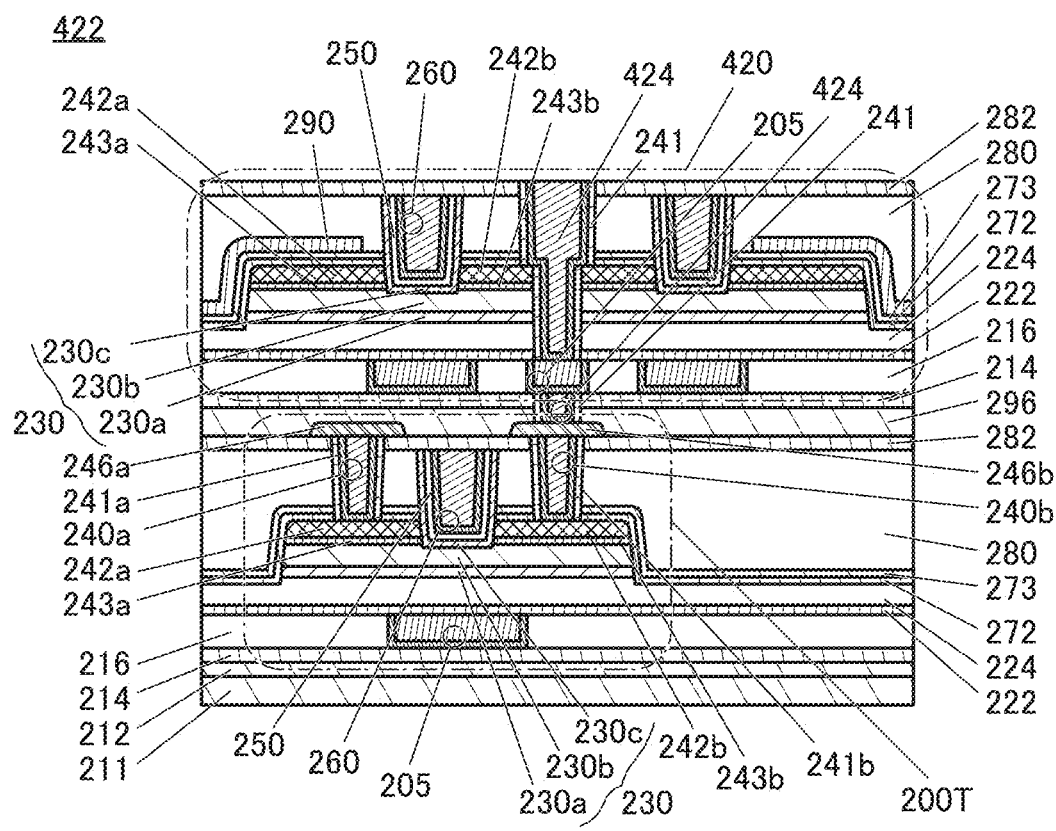
FIG. 37 is a cross-sectional schematic diagram illustrating a structure example of a semiconductor device.

FIG. 37 illustrates an example where the memory device 420 is electrically connected to the conductor 242b functioning as one of the source and the drain of the transistor 200T through the conductor 424, the conductor 205, the conductor 246b, and the conductor 240b.

Thus, the method for connection between the memory device 420 and the transistor 200T can be determined in accordance with the function of the circuit included in the transistor layer 413.

Figure 38:
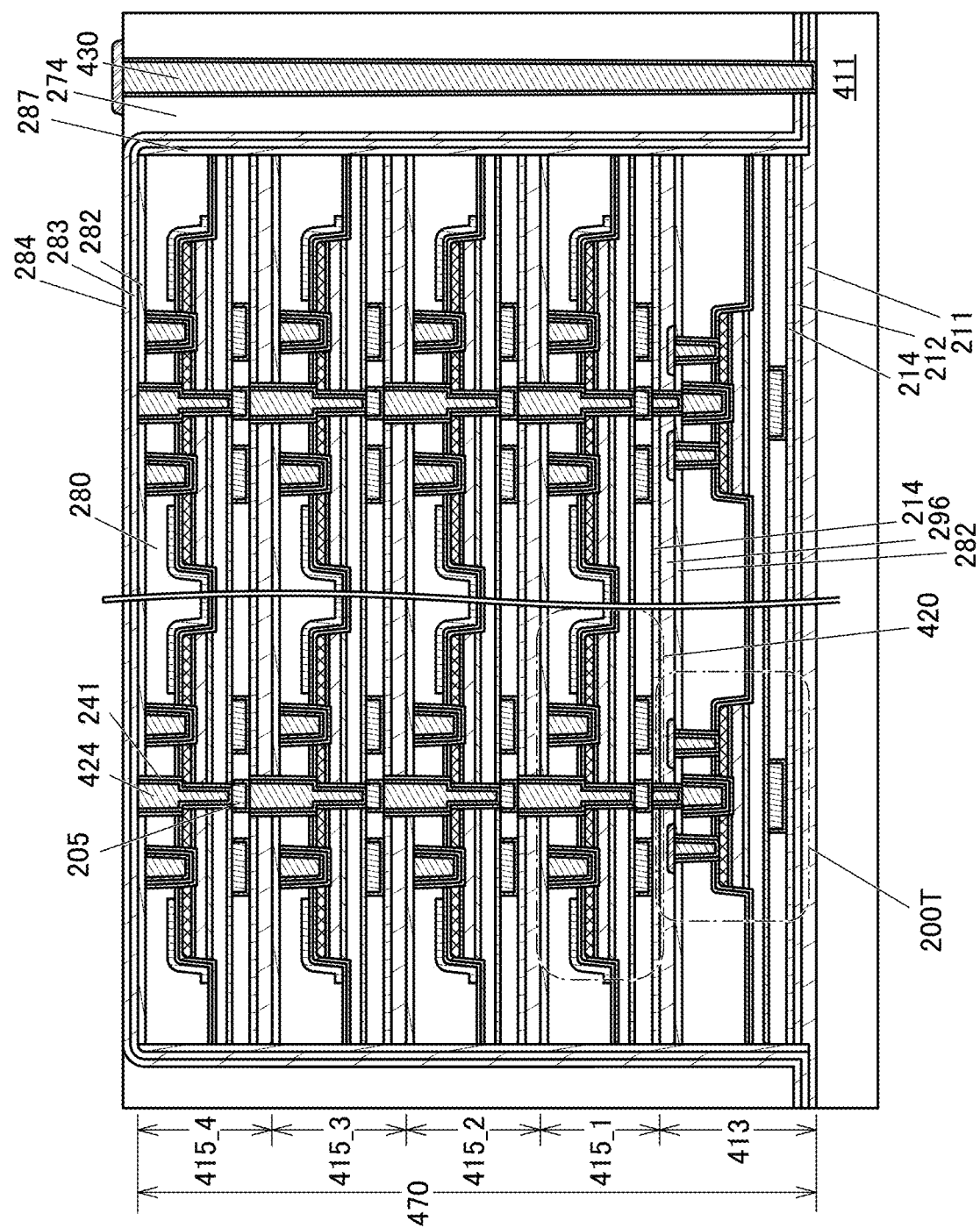
FIG. 38 is a cross-sectional schematic diagram illustrating a structure example of a semiconductor device.

FIG. 38 illustrates an example where the memory unit 470 includes the transistor layer 413 including the transistor 200T and four memory device layers 415 (the memory device layer 415_1 to the memory device layer 415_4).

The memory device layer 415_1 to the memory device layer 415_4 each include a plurality of memory devices 420.

The memory device 420 is electrically connected to the memory devices 420 included in different memory device layers 415 and the transistor 200T included in the transistor layer 413 through the conductors 424 and the conductors 205.

The memory unit 470 is sealed by the insulator 211, the insulator 212, the insulator 214, the insulator 287, the insulator 282, the insulator 283, and the insulator 284. The insulator 274 is provided in the periphery of the insulator 284. Furthermore, the conductor 430 is provided in the insulator 274, the insulator 284, the insulator 283, and the insulator 211 and is electrically connected to the element layer 411.

The insulator 280 is provided inside the sealing structure. The insulator 280 has a function of releasing oxygen by heating. Alternatively, the insulator 280 includes an excess oxygen region.

The insulator 211, the insulator 283, and the insulator 284 are suitably a material having a high blocking property against hydrogen. The insulator 214, the insulator 282, and the insulator 287 are suitably a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

A barrier property in this specification means a function of inhibiting diffusion of a particular substance (also referred to as low transmission capability). Alternatively, a barrier property in this specification means a function of capturing and fixing (also referred to as gettering) a particular substance.

Note that materials for the insulator 211, the insulator 212, the insulator 214, the insulator 287, the insulator 282, the insulator 283, and the insulator 284 may have an amorphous or crystalline structure, although the crystal structure of the materials is not particularly limited. For example, an amorphous aluminum oxide film is suitably used as the material having a function of capturing or fixing hydrogen. Amorphous aluminum oxide may capture or fix hydrogen more than aluminum oxide having high crystallinity.

Here, the following model can be considered for excess oxygen in the insulator 280 and diffusion of hydrogen from an oxide semiconductor in contact with the insulator 280.

Hydrogen existing in the oxide semiconductor diffuses, through the insulator 280 in contact with the oxide semiconductor, into another structure body. Excess oxygen in the insulator 280 reacts with oxygen in the oxide semiconductor to form an OH bond, and the hydrogen diffuses in the insulator 280. The hydrogen atom having the OH bond reacts with the oxygen atom bonded to an atom (e.g., a metal atom or the like) in the insulator 282 when reaching a material having a function of capturing or fixing hydrogen (typically the insulator 282), and is captured or fixed in the insulator 282. The oxygen atom which had the OH bond of the excess oxygen is assumed to remain as excess oxygen in the insulator 280. In short, the excess oxygen in the insulator 280 probably serves a bridge linking role in diffusing the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment time is one hour or more, preferably four hours or more, further preferably eight hours or more.

The heat treatment enables diffusion of hydrogen from the oxide semiconductor to the outside through the insulator 280, the insulator 282, and the insulator 287. This can reduce the absolute amount of hydrogen in and in the vicinity of the oxide semiconductor.

The insulator 283 and the insulator 284 are formed after the heat treatment. The insulator 283 and the insulator 284 are materials having a high blocking property against hydrogen. Thus, the insulator 283 and the insulator 284 can inhibit hydrogen diffused to the outside or external hydrogen from entering the inside, specifically, the oxide semiconductor or the insulator 280 side.

Although the structure in which the heat treatment is performed after the insulator 282 is formed is described as an example, there is no limitation to the structure. For example, the above-described heat treatment may be performed after formation of the transistor layer 413 or after formation of the memory device layer 415_1 to the memory device layer 415_3. When hydrogen is diffused to the outside by the above-described heat treatment, hydrogen is diffused to above the transistor layer 413 or in the lateral direction. Similarly, in the case where the heat treatment is performed after the formation of the memory device layer 415_1 to the memory device layer 4153, hydrogen is diffused to above or in the lateral direction.

The above-described manufacturing process yields the above-described sealing structure by bonding the insulator 211 and the insulator 283.

The above-described structure and manufacturing process enable a semiconductor device using an oxide semiconductor with reduced hydrogen concentration. Accordingly, a highly reliable semiconductor device can be provided. With one embodiment of the present invention, a semiconductor device having favorable electrical characteristics can be provided.

FIG. 39(A) to FIG. 39(C) are diagrams illustrating an example that is different from FIG. 38 in the arrangement of the conductors 424. FIG. 39(A) illustrates a layout view of the memory device 420 when seen from above, FIG. 39(B) is a cross-sectional view of a portion indicated by a dashed-dotted line A1-A2 in FIG. 39(A), and FIG. 39(C) is a cross-sectional view of a portion indicated by a dashed-dotted line B1-B2 in FIG. 39(A). In FIG. 39(A), the conductor 205 is not illustrated to facilitate understanding of the drawing. In the case where the conductor 205 is provided, the conductor 205 includes a region overlapping with the conductor 260 and the conductor 424.

As illustrated in FIG. 39(A), an opening where the conductor 424 is provided, that is, the conductor 424 is provided in not only a region overlapping with the oxide 230a and the oxide 230b but also the outside of the oxide 230a and the oxide 230b. FIG. 39(A) illustrates an example where the conductor 424 is provided to extend beyond the oxide 230a and the oxide 230b to the B2 side; however, this embodiment is not limited thereto. The conductor 424 may be provided to extend beyond the oxide 230a and the oxide 230b to the B1 side, or to both the B1 side and the B2 side.

FIG. 39(B) and FIG. 39(C) illustrate an example where the memory device layer 415_p is stacked over the memory device layer 415_p–1 (p is a natural number greater than or equal to 2 and less than or equal to n). The memory device 420 included in the memory device layer 415_p–1 is electrically connected to the memory device 420 included in the memory device layer 415_p through the conductor 424 and the conductor 205.

FIG. 39(B) illustrates an example where in the memory device layer 415_p–1, the conductor 424 is connected to the conductor 242 of the memory device layer 415_p–1 and the conductor 205 of the memory device layer 415_p. Here, the conductor 424 is also connected to the conductor 205 of the memory device layer 415_p–1 at the outside on the B2 side of the conductor 242, the oxide 243, the oxide 230b, and the oxide 230a.

As shown in FIG. 39(C), the conductor 424 is formed along the side surfaces on the B2 side of the conductor 242, the oxide 243, the oxide 230b, and the oxide 230a, and is electrically connected to the conductor 205 through an opening formed in the insulator 280, the insulator 273, the insulator 272, the insulator 224, and the insulator 222. Here, an example where the conductor 424 is provided along the side surfaces on the B2 side of the conductor 242, the oxide 243, the oxide 230b, and the oxide 230a is indicated by a dotted line in FIG. 39(B). Furthermore, the insulator 241 is formed between the conductor 424 and the side surfaces on the B2 side of the conductor 242, the oxide 243, the oxide 230b, the oxide 230a, the insulator 224, and the insulator 222, in some cases.

Provision of the conductor 424 in a region not overlapping with the conductor 242 or the like allows the memory device 420 to be electrically connected to the memory device 420 provided in another memory device layer 415. In addition, the memory device 420 can also be electrically connected to the transistor 200T provided in the transistor layer 413.

Furthermore, when the conductor 424 serves as a bit line, provision of the conductor 424 in a region not overlapping with the conductor 242 or the like can increase the distance between bit lines of the memory devices 420 that are adjacent to each other in the B1-B2 direction. As illustrated in FIG. 39(A), the distance between the conductors 424 over the conductors 242 is d1; the distance between the conductors 424 positioned below the oxide 230a, that is, in an opening formed in the insulator 224 and the insulator 222 is d2; and d2 is larger than d1. The parasitic capacitance of the conductors 424 can be reduced when the distance is partly d2 compared with the case where the distance between the conductors 424 that are adjacent to each other in the B1-B2 direction is d1. The reduction of the parasitic capacitance of the conductors 424 is preferable to reduce the capacitance necessary for the capacitive element 292.

In the memory device 420, the conductor 424 functioning as a common bit line for two memory cells is provided. The cell size of each memory cell can be reduced by appropriately adjusting the permittivity of the dielectric used in the capacitor or the parasitic capacitance between bit lines. Here, the estimation of the cell size, the bit density, and the bit cost of the memory cell when the channel length is 30 nm (also referred to as 30 nm node) is described. In FIG. 40(A) to FIG. 40(D) described below, the conductor 205 is not illustrated to facilitate understanding of the drawings. In the case where the conductor 205 is provided, the conductor 205 includes a region overlapping with the conductor 260 and the conductor 424.

FIG. 40(A) illustrates an example where hafnium oxide with a thickness of 10 nm and 1 nm silicon oxide thereover are stacked in this order as the dielectric of the capacitive element; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 432 obtained in this manner is referred to as a cell A.

The cell size of the cell A is $45.25F^2$.

FIG. 40(B) illustrates an example where a first zirconium oxide, an aluminum oxide thereover, and a second zirconium oxide thereover are stacked in this order as the dielectric of the capacitive element; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 433 obtained in this manner is referred to as a cell B.

The dielectric used for the capacitor of the cell B has a higher permittivity than that for the cell A; thus, the area of the capacitive element can be reduced in the cell B. Therefore, the cell size of the cell B can be reduced compared with that of the cell A. The cell size of the cell B is 25.53F$^2$.

The cell A and the cell B correspond to the memory cells included in the memory device 420, the memory device 420A, or the memory device 420B illustrated in FIG. 34, FIG. 36(A) to FIG. 36(C), and FIG. 37.

FIG. 40(C) illustrates an example where a first zirconium oxide, an aluminum oxide thereover, and a second zirconium oxide thereover are stacked as the dielectric of the capacitive element; the conductor 242, the oxide 243, the oxide 230a, and the oxide 230b included in the memory device 420 are shared by the memory cells; and the conductor 424 functioning as the bit line is provided so as to overlap with a portion overlapping with the conductor 242 and a portion outside the conductor 242. A memory cell 434 obtained in this manner is referred to as a cell C.

The distance between the conductors 424 in the cell C is longer below the oxide 230a than above the conductor 242. Therefore, the parasitic capacitance of the conductors 424 can be reduced and the area of the capacitive elements can be reduced. Furthermore, the conductor 242, the oxide 243, the oxide 230a, and the oxide 230b are not provided with a slit. Thus, the cell size can be reduced in the cell C compared with the cell A and the cell B. The cell size of the cell C is 17.20F$^2$.

FIG. 40(D) illustrates an example where the conductor 205 and the insulator 216 are not provided in the cell C. Such a memory cell 435 is referred to as a cell D.

Since the conductor 205 and the insulator 216 are not provided in the cell D, the memory device 420 can be thinned. Therefore, the memory device layer 415 including the memory device 420 can be thinned, so that the height of the memory unit 470 in which the memory device layers 415 are stacked can be reduced. When the conductors 424 and the conductors 205 are regarded as a bit line, the bit line can be shortened in the memory unit 470. The shortened bit line can reduce the parasitic load in the bit line and further reduce the parasitic capacitance of the conductors 424; accordingly, the area of the capacitive element can be reduced. In addition, the conductor 242, the oxide 243, the oxide 230a, and the oxide 230b are not provided with a slit. As described above, the cell size of the cell D can be reduced compared with the cell A, the cell B, and the cell C. The cell size of the cell D is 15.12F$^2$.

The cell C and the cell D correspond to the memory cell included in the memory device 420 illustrated in FIG. 39(A) to FIG. 39(C).

Here, the bit density and the bit cost Cb of the cell A to the cell D and a cell E, which is the cell D capable of multi-level storage, were estimated. Moreover, the estimated bit density and bit cost were compared with expected values of bit density and bit cost of currently commercially available DRAMs.

The bit cost Cb in the semiconductor device of one embodiment of the present invention was estimated using Formula 1.

[Formula 1]

$$C_b = \frac{(P_c + n \times P_s)}{n} \times \frac{D_d}{D_{3d}} \times \frac{D}{P_d} \quad (1)$$

Here, n is the number of stacked memory device layers, $P_c$ is the number of patterning times mainly for the element layer 411 as a common portion, $P_s$ is the number of patterning times per memory device layer 415 and transistor layer 413, Da is the bit density of a DRAM, $D_{3d}$ is the bit density of one memory device layer 415, and Pa is the number of patterning times for a DRAM. Note that Pa includes the number of times increased by scaling.

Table 1 shows expected values of bit density of commercially available DRAMs and estimated bit density of semiconductor devices of one embodiment of the present invention. Note that two types of commercially available DRAMs with process nodes of 18 nm and 1× nm were used. As for the semiconductor devices of one embodiment of the present invention, the process node was 30 nm and the number of stacked memory device layers in the cell A to the cell E was five layers, ten layers, and twenty layers; thus, the bit density was estimated.

TABLE 1

| | DRAM | | Memory device of one embodiment of the present invention | | | |
|---|---|---|---|---|---|---|
| Manufacturer | Company A | Company B | — | | | |
| Process node | 18 nm | 1X nm | 30 nm | | | |
| Number of layers stacked | — | — | | 5 | 10 | 20 |
| Bit density [Gb/mm2] | 0.19 (*) | 0.14 (*) | Cell A | 0.05 | 0.10 | 0.20 |
| (*) represents an | | | Cell B | 0.09 | 0.17 | 0.35 |
| expected value | | | Cell C | 0.13 | 0.26 | 0.52 |
| | | | Cell D | 0.15 | 0.29 | 0.59 |
| | | | Cell E | 0.30 | 0.59 | 1.18 |

Table 2 shows the results of estimation of the relative bit cost of the semiconductor devices of one embodiment of the present invention from the bit cost of the commercially available DRAM. For reference of the bit cost, the DRAM with a process node of X nm was used. As for the semiconductor devices of one embodiment of the present invention, the process node was 30 nm and the number of stacked memory device layers in the cell A to the cell D was five layers, ten layers, and twenty layers; thus, estimation was performed.

TABLE 2

| | DRAM | | Memory device of one embodiment of the present invention | | | |
|---|---|---|---|---|---|---|
| Manufacturer | Company A | Company B | — | | | |
| Process node | 18 nm | 1X nm | 30 nm | | | |
| Number of layers stacked | — | — | | 5 | 10 | 20 |
| Relative bit cost when | — | 1 | Cell A | 1.7 | 1.3 | 1.2 |
| the bit cost of Company | | | Cell B | 0.9 | 0.7 | 0.7 |
| B is assumed to be 1 | | | Cell C | 0.6 | 0.5 | 0.4 |
| | | | Cell D | 0.5 | 0.4 | 0.3 |

The structures described in this embodiment can be used in an appropriate combination with the structures described in the other embodiments and the like.

Embodiment 10

Described in this embodiment is a metal oxide (hereinafter also referred to as an oxide semiconductor) that can be used in an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more kinds of elements selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 41(A). FIG. 41(A) is a diagram showing the classification of crystal structures of an oxide semiconductor, typically IGZO (a metal oxide containing In, Ga, and Zn).

As shown in FIG. 41(A), an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 41(A) are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 41(B) shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 41(B) and obtained by GIXD measurement is hereinafter simply referred to as an XRD spectrum. The CAAC-IGZO film in FIG. 41(B) has a composition in the vicinity of In:Ga:Zn=4:2:3 [atomic ratio]. The CAAC-IGZO film in FIG. 41(B) has a thickness of 500 nm.

As shown in FIG. 41(B), a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 41(B), the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 41(C) shows a diffraction pattern of the CAAC-IGZO film. FIG. 41(C) shows a diffraction pattern obtained by the NBED method in which an electron beam is incident in the direction parallel to the substrate. The composition of the CAAC-IGZO film in FIG. 41(C) is In:Ga:Zn=4:2:3 [atomic ratio] or the vicinity thereof. In the nanobeam electron diffraction method, electron diffraction is performed with a probe diameter of 1 nm.

As shown in FIG. 41(C), a plurality of spots indicating c-axis alignment are observed in the diffraction pattern of the CAAC-IGZO film.

<<Structure of Oxide Semiconductor>>

Oxide semiconductors might be classified in a manner different from that in FIG. 41(A) when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the Inlayer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges captured by the trap states in an oxide semiconductor take a long time to be released and may behave like fixed electric charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

An oxide semiconductor containing nitrogen easily becomes n-type by generation of electrons serving as carriers and an increase in carrier concentration. Thus, a transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with the other embodiments in this specification as appropriate.

Embodiment 11

In this embodiment, the peripheral circuit 20 in the semiconductor devices 10, 10A, 10B, and 10F described in Embodiments 1 to 4 is described in detail.

Figure 42:
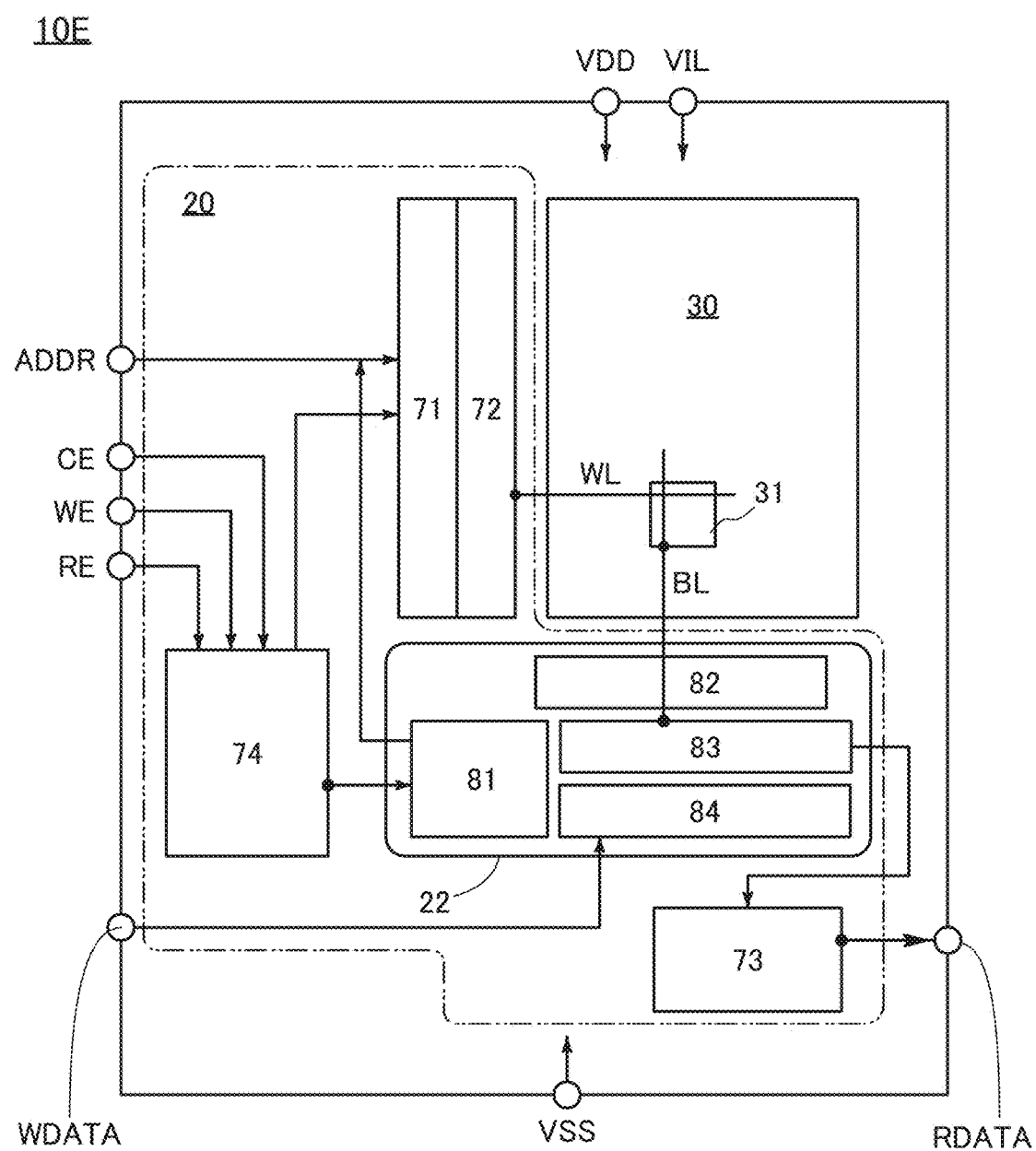
FIG. 42 is a block diagram illustrating a structure example of a semiconductor device.

FIG. 42 is a block diagram illustrating a structure example of a semiconductor device functioning as a memory device. The semiconductor device 10E includes the peripheral circuit 20 and the memory cell array 30. The peripheral circuit 20 includes a row decoder 71, a word line driver circuit 72, the column driver 22, an output circuit 73, and a control logic circuit 74. Note that the row decoder 71 and the word line driver circuit 72 can be used as the row driver described in Embodiment 1 or the like.

The column driver 22 includes a column decoder 81, a precharge circuit 82, an amplifier circuit 83, and a write circuit 84. The precharge circuit 82 has a function of precharging the wiring BL and the like. The amplifier circuit 83 has a function of amplifying a data signal read from the wiring BL. The amplified data signal is output to the outside of the semiconductor device TOE as a digital data signal RDATA through the output circuit 73.

As power supply voltages from the outside, a low power supply voltage (VSS), a high power supply voltage (VDD) for the peripheral circuit 20, and a high power supply voltage (VIL) for the memory cell array 30 are supplied to the semiconductor device TOE.

Control signals (CE, WE, RE), an address signal ADDR, and a data signal WDATA are input to the semiconductor device 10E from the outside. The address signal ADDR is input to the row decoder 71 and the column decoder 81, and WDATA is input to the write circuit 84.

The control logic circuit 74 processes the signals (CE, WE, RE) input from the outside, and generates control signals for the row decoder 71 and the column decoder 81. CE is a chip enable signal, WE is a write enable signal, and RE is a read enable signal. The signals processed by the control logic circuit 74 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 43:
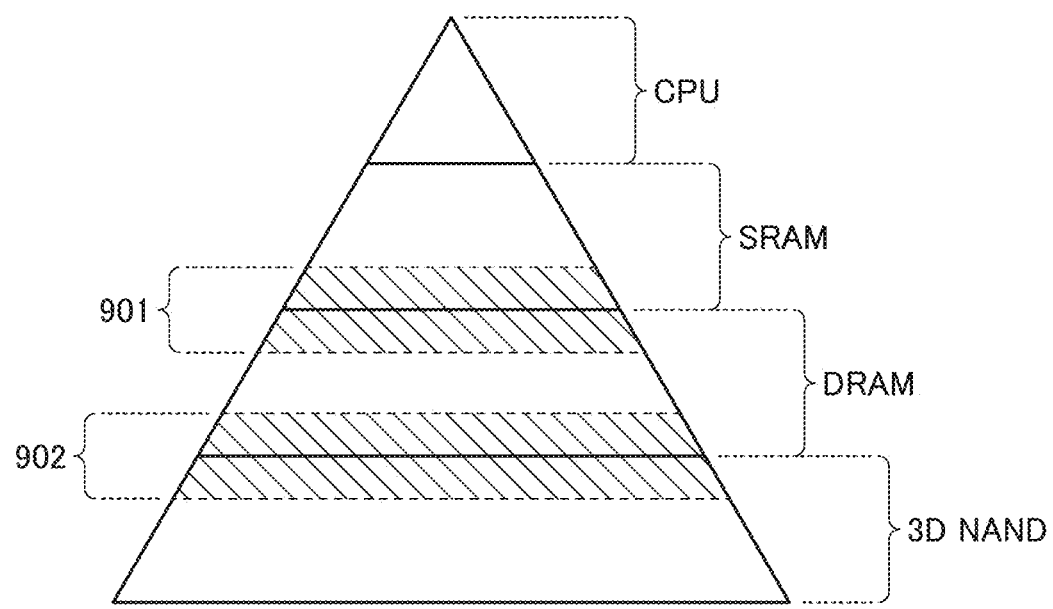
FIG. 43 is a conceptual diagram illustrating a structure example of a semiconductor device.

In general, a variety of memory devices (memories) are used in semiconductor devices such as computers in accordance with the intended use. FIG. 43 shows a hierarchy of memory devices. The memory devices at upper levels require higher access speed and those at lower levels require larger memory capacity and higher recording density. In FIG. 43, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. In addition, the register also has a function of retaining information on settings of the arithmetic processing device, for example.

An SRAM is used for a cache, for example. A cache has a function of duplicating and retaining part of information retained in a main memory. When the frequently used data is duplicated and retained in the cache, the access speed to the data can be increased.

A DRAM is used for a main memory, for example. A main memory has a function of retaining a program or data read from a storage. A DRAM has a recording density of approximately 0.1 to 0.3 Gbit/mm$^2$.

A 3D NAND memory is used for a storage, for example. A storage has a function of retaining data that needs to be retained for a long time or a variety of programs used in an arithmetic processing device, for example. Therefore, a storage needs to have high memory capacity and a high recording density rather than operation speed. A memory device used for a storage has a recording density of approximately 0.6 to 6.0 Gbit/mm$^2$.

The semiconductor device functioning as the memory device of one embodiment of the present invention has a high operation speed and can retain data for a long time. The semiconductor device of one embodiment of the present invention can be suitably used as a semiconductor device in a boundary region 901 that includes both the level to which a cache belongs and the level to which a main memory belongs. The semiconductor device of one embodiment of the present invention can be suitably used as a semiconductor device in a boundary region 902 that includes both the level to which the main memory belongs and the level to which a storage belongs.

Embodiment 12

In this embodiment, power consumption of electronic components and electronic devices in which the semiconductor device or the like described in the above embodiment is incorporated is described.

Figure 44A:
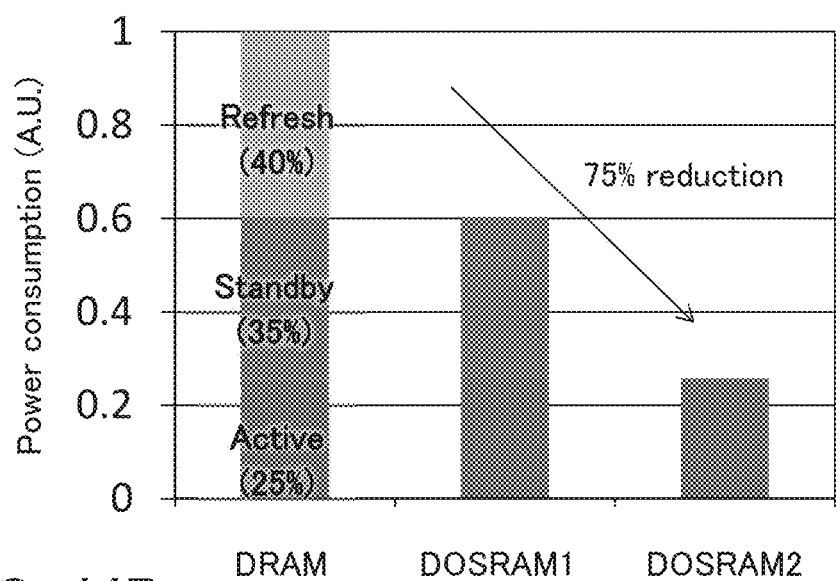
FIG. 44 are (A) a graph and (B) a graph illustrating structure examples of semiconductor devices.
Figure 44B:
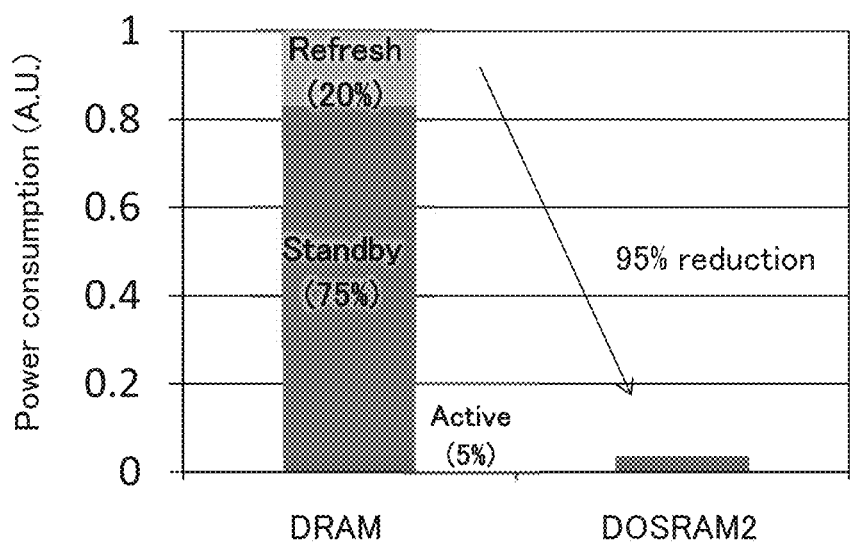

FIGS. 44(A) and 44(B) are graphs illustrating power consumption of a DRAM and DOSRAMs. Power consumption of a DRAM, a DOSRAM1, and a DOSRAM2 is illustrated in FIG. 44(A), and power consumption of the DRAM and the DOSRAM2 is illustrated in FIG. 44(B).

The results in FIGS. 44(A) and 44(B) are obtained by estimation assuming various usage methods. FIG. 44(A) illustrates the results obtained by estimation assuming a general DRAM and electronic devices of one embodiment of the present invention (the DOSRAM1, the DOSRAM2) with the active mode at 10% (assuming that the active mode accounts for 10% a day in the usage of the electronic devices and the like) and the standby mode at 90%. FIG. 44(B) illustrates the results obtained by estimation assuming the general DRAM and the electronic device of one embodiment of the present invention (the DOSRAM2) with the active mode at 1% (assuming that the active mode accounts for 1% a day in the usage of the electronic device and the like) and the standby mode at 99%.

Note that the vertical axis represents power consumption in arbitrary unit (a. u.) in FIGS. 44(A) and 44(B). In FIG. 44(A), the horizontal axis represents the DRAM, the DOSRAM1, and the DOSRAM2. In FIG. 44(B), the horizontal axis represents the DRAM and the DOSRAM2.

In FIGS. 44(A) and 44(B), the bottom tier of the graph represents power consumption in the active mode, the middle tier represents power consumption in the standby mode, and the top tier represents power consumption in the refresh mode.

Note that the DOSRAM1 subjected to power gating in the standby mode is assumed as the DOSRAM2.

As illustrated in FIG. 44(A), the electronic devices of one embodiment of the present invention (the DOSRAM1, the DOSRAM2) have smaller power consumption compared with that of the general DRAM. In particular, the DOSRAM2 is estimated to experience effects of 75% power reduction compared with the general DRAM.

As illustrated in FIG. 44(B), in the case where the active mode is 1%, the electronic device of one embodiment of the present invention (the DOSRAM2) is estimated to experience effects of 95% power reduction compared with the general DRAM.

As described above, with one embodiment of the present invention, a semiconductor device or an electronic device with reduced power consumption can be provided.

This embodiment can be implemented in combination with the structures described in the other embodiments and the like, as appropriate.

Embodiment 13

In this embodiment, examples of electronic components and electronic devices in which the semiconductor device or the like described in the above embodiment is incorporated are described.

<Electronic Component>

First, examples of electronic components in which the semiconductor device 10 or the like is incorporated are described with reference to FIG. 45(A) and FIG. 45(B).

Figure 45A:
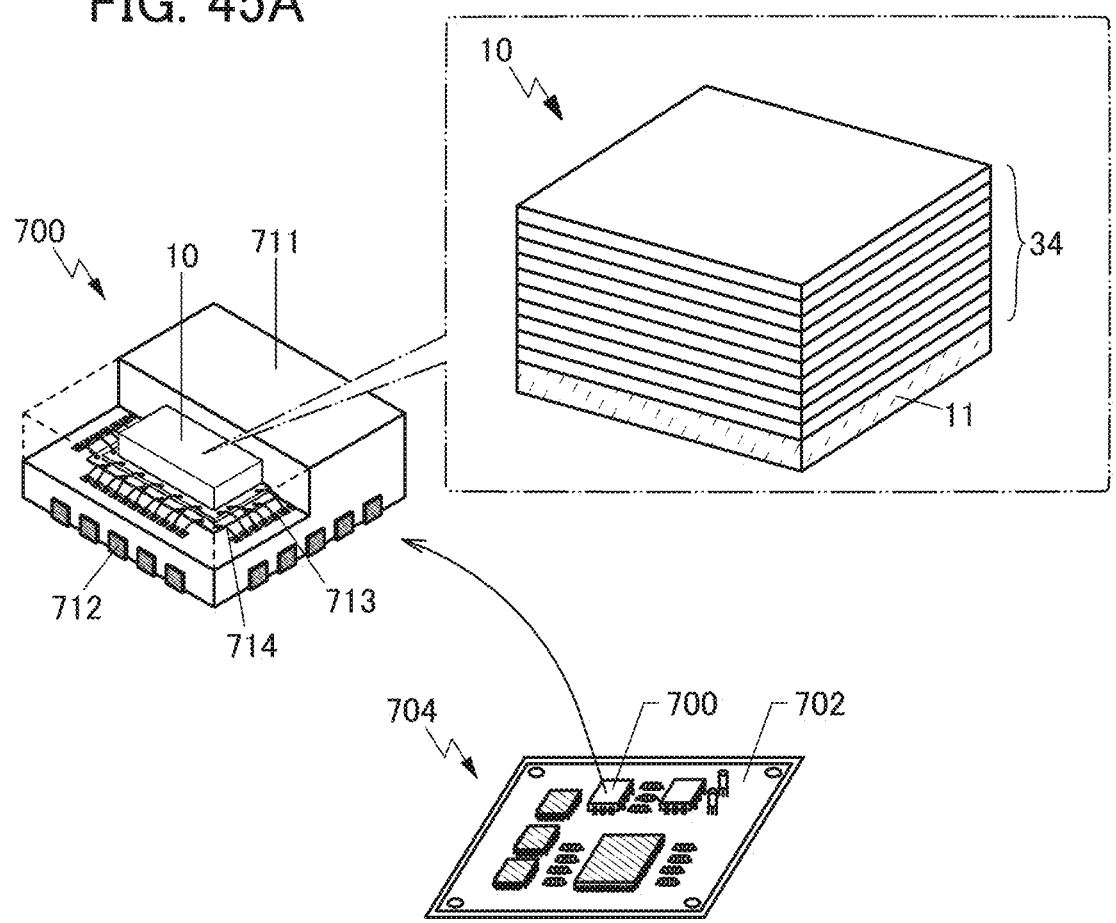
FIG. 45 are (A) a schematic diagram and (B) a schematic diagram illustrating examples of electronic components.

FIG. 45(A) is a perspective view of an electronic component 700 and a substrate (a mounting board 704) on which the electronic component 700 is mounted. The electronic component 700 illustrated in FIG. 45(A) includes, in a mold 711, the semiconductor device 10 in which the element layer 34 is stacked over the silicon substrate 11. FIG. 45(A) omits part of the electronic component to show the inside of the electronic component 700. The electronic component 700 includes a land 712 outside the mold 711. The land 712 is electrically connected to an electrode pad 713, and the electrode pad 713 is electrically connected to the semiconductor device 10 via a wire 714. The electronic component 700 is mounted on a printed circuit board 702, for example. A plurality of such electronic components are combined and electrically connected to each other on the printed circuit board 702, whereby the mounting board 704 is completed.

Figure 45B:
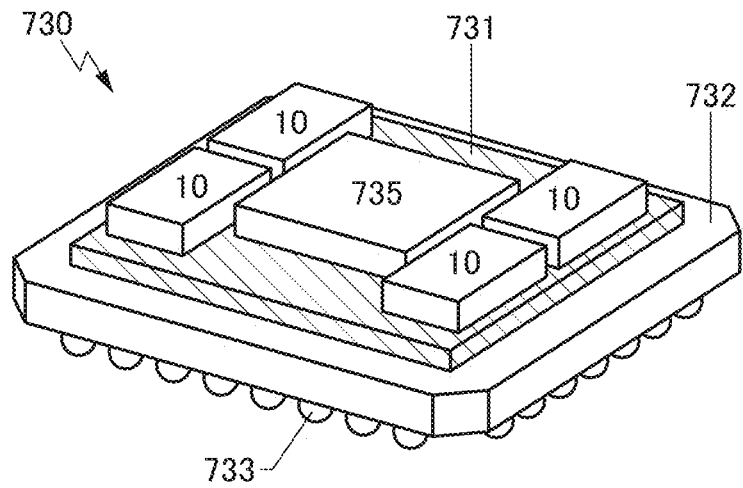

FIG. 45(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 100 are provided on the interposer 731.

The electronic component 730 using the semiconductor device 10 as High Bandwidth Memory (HBM) is illustrated as an example. An integrated circuit (semiconductor device) such as a CPU, a GPU, or an FPGA can be used for the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is unlikely to occur. Furthermore, the surface of a silicon interposer has high planarity, so that a poor connection between the silicon interposer and an integrated circuit provided on the silicon interposer is unlikely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the semiconductor device 10 and the semiconductor device 735 are preferably equal to each other.

To mount the electronic component 730 on another substrate, an electrode 733 may be provided on the bottom portion of the package substrate 732. FIG. 45(B) illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 46:
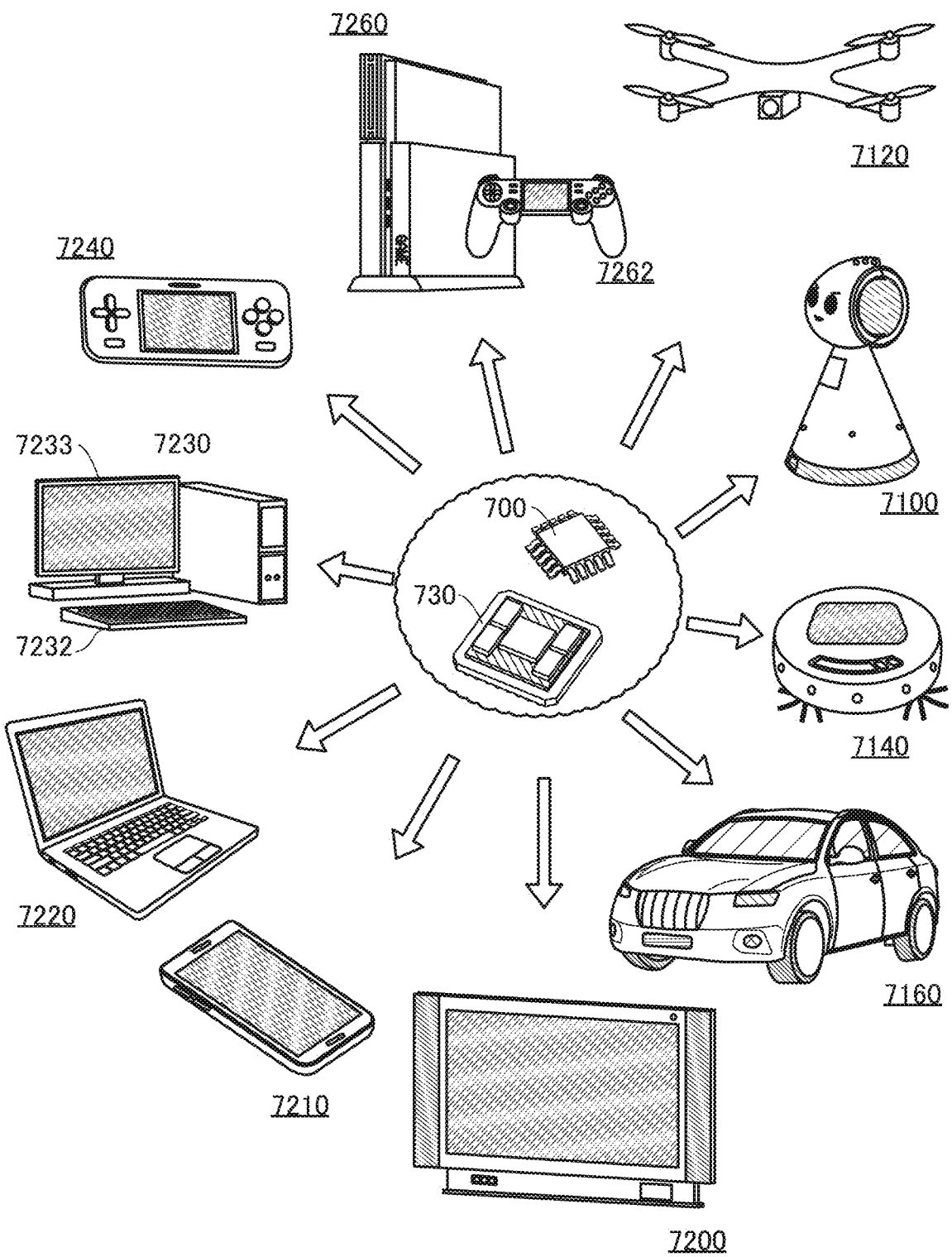
FIG. 46 is a diagram illustrating examples of electronic devices.

Next, examples of electronic devices including the above-described electronic component are described with reference to FIG. 46.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7300 is provided with a tire, an inlet, and the like. The cleaning robot 7300 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

This embodiment can be implemented in combination with any of the structures described in the other embodiments and the like, as appropriate.

(Supplementary Notes on Description of this Specification and the Like)

The following are supplementary notes on the description of the above embodiments and structures in the embodiments.

One embodiment of the present invention can be constituted by combining, as appropriate, the structure described in an embodiment with any of the structures described in the other embodiments and Examples. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and there is no limitation to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when represented by an equivalent circuit.

In this specification and the like, a switch has a function of controlling whether a current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where a current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

BL_1: bit line, DA1: data, PCL1: precharge line, PCL2: precharge line, T1: period, T2: period, T3: period, T4: period, T1*l*: period, T12: period, T13: period, T14: period, T15: period, T16: period, WL_N: word line, WL_1: word line, WL2: word line, 10: semiconductor device, 10A: semiconductor device, 10B: semiconductor device, 10C: semiconductor device, 10D: semiconductor device, 10E: semiconductor device, 10F: semiconductor device, 11: silicon substrate, 20: peripheral circuit, 21: row driver, 22: column driver, 22_A: precharge circuit, 22_B: precharge circuit, 22_C: sense amplifier, 22_D: switch circuit, 22_E: switch circuit, 22_1: precharge circuit, 22_2: sense amplifier, 22_3: switch circuit, 23_A: switch, 23_B: switch, 23_C: switch, 23_D: switch, 24_1: transistor, 243: transistor, 24_4: transistor, 24_6: transistor, 25: circuit, 25_1: transistor, 25_2: transistor, 25_3: transistor, 25_4: transistor, 26: element layer, 27: circuit, 27_M: circuit, 27_1: circuit, 28: transistor, 28_*a*: transistor, 28_*b*: transistor, 28_*n*: transistor, 28_1: transistor, 29: circuit, 30: memory cell array, 30_M: unit, 30_1: unit, 31: memory cell, 31_M: memory cell, 31_N: memory cell, 31_N_A: memory cell, 31_N_B: memory cell, 31_1: memory cell, 31_1_A: memory cell, 31_1_B: memory cell, 32: transistor, 32_N: transistor, 32_1: transistor, 32A: transistor, 32B: transistor, 33: capacitor, 33_N: capacitor, 33_1: capacitor, 33A: capacitor, 33B: capacitor, 34: element layer, 34_P: element layer, 34_N: element layer, 34_1: element layer, 40: element layer, 40_M: element layer, 40_1: element layer, 40A: element layer, 40B: element layer, 40C: element layer, 40D: element layer, 41: transistor, 41_*a*: transistor, 41_*b*: transistor, 42: transistor, 42_*a*: transistor, 42_*b*: transistor, 43: transistor, 43_*a*: transistor, 43_*b*: transistor, 44: transistor, 44_*a*: transistor, 44_*b*: transistor, 49: circuit, 50: unit, 50_M: unit, 50_1: unit, 51: memory cell, 54: element layer, 55: transistor, 56: transistor, 57: capacitive element, 70A: sealing layer, 70B: sealing layer, 71: row decoder, 72: word line driver circuit, 73: output circuit, 74: control logic circuit, 81: column decoder, 82: precharge circuit, 83: amplifier circuit, 84: circuit, 98: switch circuit, 100: memory device, 200: transistor, 200M: transistor, 200T: transistor, 205: conductor, 205*a*: conductor, 205*b*: conductor, 211: insulator, 212: insulator, 214: insulator, 216: insulator, 222: insulator, 224: insulator, 230: oxide, 230*a*: oxide, 230*b*: oxide, 230*c*: oxide, 240: conductor, 240*a*: conductor, 240*b*: conductor, 241: insulator, 241*a*: insulator, 241*b*: insulator, 242: conductor, 242*a*: conductor, 242*b*: conductor, 243: oxide, 243*a*: oxide, 243*b*: oxide, 246: conductor, 246*a*: conductor, 246*b*: conductor, 250: insulator, 260: conductor, 260*a*: conductor, 260*b*: conductor, 272:

insulator, 273: insulator, 274: insulator, 275: insulator, 276: conductor, 277: insulator, 278: conductor, 279: insulator, 280: insulator, 282: insulator, 283: insulator, 284: insulator, 287: insulator, 290: conductor, 292: capacitor, 292A: capacitor, 292B: capacitor, 294: conductor, 295: insulator, 296: insulator, 297: conductor, 298: insulator, 299: conductor, 300: transistor, 311: semiconductor substrate, 313: semiconductor region, 314a: low-resistance region, 314b: low-resistance region, 315: insulator, 316: conductor, 411: element layer, 413: transistor layer, 413_m: transistor layer, 413_1: transistor layer, 415: memory device layer, 415_n: memory device layer, 415_p: memory device layer, 415_p–1: memory device layer, 415_1: memory device layer, 415_3: memory device layer, 415_4: memory device layer, 420: memory device, 420A: memory device, 420B: memory device, 422: region, 424: conductor, 426: conductor, 428: conductor, 430: conductor, 432: memory cell, 433: memory cell, 434: memory cell, 435: memory cell, 470: memory unit, 470_m: memory unit, 470_1: memory unit, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 901: boundary region, 902: boundary region, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller, 7300: cleaning robot

The invention claimed is:

1. A semiconductor device comprising:
   a first element layer comprising a first memory cell;
   a second element layer over the first element layer, comprising a second memory cell;
   a third element layer comprising a sense amplifier; and
   a silicon substrate comprising a driver circuit,
   wherein the first memory cell comprises a first transistor and a first capacitor,
   wherein the second memory cell comprises a second transistor and a second capacitor,
   wherein the sense amplifier comprises a third transistor,
   wherein the driver circuit comprises a fourth transistor,
   wherein the first transistor in the first element layer is between the silicon substrate and the second transistor in the second element layer,
   wherein the third transistor in the third element layer is between the silicon substrate and the first transistor in the first element layer,
   wherein one of a source and a drain of the first transistor and one of a source and a drain of the second transistor are each electrically connected to a wiring for electrical connection to a gate of the third transistor,
   wherein the wiring is in contact with a first semiconductor layer included in the first transistor and a second semiconductor layer included in the second transistor,
   wherein the wiring extends in a direction perpendicular or substantially perpendicular to a surface of the silicon substrate, and
   wherein a third semiconductor layer included in the third transistor is positioned over a gate electrode of the fourth transistor.

2. The semiconductor device according to claim 1,
   wherein the first semiconductor layer and the second semiconductor layer each comprise a metal oxide in a channel formation region.

3. The semiconductor device according to claim 1,
   wherein the first capacitor is comprised in a layer below the first semiconductor layer, and
   wherein the second capacitor is comprised in a layer below the second semiconductor layer.

4. The semiconductor device according to claim 1,
   wherein the first capacitor is comprised in a layer above the first semiconductor layer, and
   wherein the second capacitor is comprised in a layer above the second semiconductor layer.

5. The semiconductor device according to claim 1,
   wherein one electrode of the first capacitor is comprised in the same layer as the first semiconductor layer, and
   wherein one electrode of the second capacitor is comprised in the same layer as the second semiconductor layer.

6. A semiconductor device comprising:
   a first element layer comprising a first memory cell;
   a second element layer over the first element layer, comprising a second memory cell;
   a third element layer comprising a first control circuit; and
   a silicon substrate comprising a driver circuit,
   wherein the first memory cell comprises a first transistor and a first capacitor,
   wherein the second memory cell comprises a second transistor and a second capacitor,
   wherein the first control circuit comprises a third transistor for amplifying a signal read from the first memory cell,
   wherein the driver circuit comprises a fourth transistor,
   wherein the first transistor in the first element layer is between the silicon substrate and the second transistor in the second element layer,
   wherein the third transistor in the third element layer is between the silicon substrate and the first transistor in the first element layer,
   wherein one of a source and a drain of the first transistor and one of a source and a drain of the second transistor are each electrically connected to a first wiring for electrical connection to a gate of the third transistor,
   wherein one of a source and a drain of the third transistor is electrically connected to a second wiring for electrical connection to the driver circuit,
   wherein the first wiring is in contact with a first semiconductor layer included in the first transistor and a second semiconductor layer included in the second transistor,
   wherein the first wiring extends in a direction perpendicular or substantially perpendicular to a surface of the silicon substrate,
   wherein the second wiring extends in a direction parallel or substantially parallel to the first wiring, and
   wherein a third semiconductor layer included in the third transistor is positioned over a gate electrode of the fourth transistor.

7. The semiconductor device according to claim 6,
   wherein the first control circuit comprises a fourth transistor,
   wherein one of a source and a drain of the fourth transistor is electrically connected to the one of the source and the drain of the third transistor, and
   wherein the other of the source and the drain of the fourth transistor is electrically connected to the second wiring.

8. The semiconductor device according to claim 6,
   wherein the first control circuit comprises a fifth transistor and a sixth transistor,
   wherein one of a source and a drain of the fifth transistor is electrically connected to the gate of the third transistor,
   wherein the other of the source and the drain of the fifth transistor is electrically connected to the second wiring, wherein one of a source and a drain of the sixth transistor is electrically connected to the other of the source and the drain of the third transistor, and wherein the other of the source and the drain of the sixth transistor is electrically connected to a ground line.

9. The semiconductor device according to claim 6, wherein the first semiconductor layer and the second semiconductor layer each comprise a metal oxide in a channel formation region.

10. The semiconductor device according to claim 9, wherein the metal oxide comprises In, Ga, and Zn.

11. The semiconductor device according to claim 6, wherein the first capacitor is comprised in a layer below the first semiconductor layer, and wherein the second capacitor is comprised in a layer below the second semiconductor layer.

12. The semiconductor device according to claim 6, wherein the first capacitor is comprised in a layer above the first semiconductor layer, and wherein the second capacitor is comprised in a layer above the second semiconductor layer.

13. The semiconductor device according to claim 6, wherein one electrode of the first capacitor is comprised in the same layer as the first semiconductor layer, and wherein one electrode of the second capacitor is comprised in the same layer as the second semiconductor layer.

* * * * *